US012750929B2

(12) United States Patent
Uchida et al.

(10) Patent No.: US 12,750,929 B2
(45) Date of Patent: Sep. 29, 2026

(54) DISPLAY DEVICE AND ELECTRONIC APPARATUS

(71) Applicant: Sony Semiconductor Solutions Corporation, Kanagawa (JP)

(72) Inventors: Masashi Uchida, Kanagawa (JP); Takashi Yamazaki, Kanagawa (JP); Tadayuki Kimura, Kanagawa (JP); Toshiaki Shiraiwa, Kanagawa (JP); Naoya Kasahara, Kanagawa (JP); Daisuke Hamashita, Kanagawa (JP); Masaya Ogura, Kanagawa (JP); Masanaga Fukasawa, Tokyo (JP); Yoshifumi Zaizen, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 434 days.

(21) Appl. No.: 18/553,091

(22) PCT Filed: Mar. 31, 2022

(86) PCT No.: PCT/JP2022/016810
§ 371 (c)(1),
(2) Date: Sep. 28, 2023

(87) PCT Pub. No.: WO2022/239576
PCT Pub. Date: Nov. 17, 2022

(65) Prior Publication Data

US 2024/0196714 A1 Jun. 13, 2024

(30) Foreign Application Priority Data

May 11, 2021 (JP) ................................ 2021-080633

(51) Int. Cl.
*H10K 59/82* (2023.01)
*H05B 33/06* (2006.01)
(Continued)

(52) U.S. Cl.
CPC .......... *H05B 33/06* (2013.01); *H10K 59/131* (2023.02); *H10K 59/80521* (2023.02);
(Continued)

(58) Field of Classification Search
CPC ..................................................... H10K 59/82
(Continued)

(56) References Cited

U.S. PATENT DOCUMENTS

2016/0248039 A1 8/2016 Choung
2017/0288093 A1 10/2017 Cha
(Continued)

FOREIGN PATENT DOCUMENTS

CN 109509765 A 3/2019
JP H10208883 A 8/1998
(Continued)

OTHER PUBLICATIONS

International Search Report (PCT/ISA/210), International Application No. PCT/JP2022/016810, dated Jun. 7, 2022.

*Primary Examiner* — Christopher M Raabe
(74) *Attorney, Agent, or Firm* — Michael Best & Friedrich LLP

(57) ABSTRACT

Provided are a display device and an electronic apparatus capable of improving the reliability of a light emission state of a pixel.

A display device includes: a plurality of sub-pixels; a plurality of light emitting elements including an anode electrode, an organic layer, and a first cathode electrode, the anode electrode, the organic layer, and the first cathode electrode being separated into each of the plurality of sub-pixels;

an element protective layer covering the first cathode electrode; a second cathode electrode provided on the element protective layer; and a connection portion that (Continued)

electrically connects the second cathode electrode and the first cathode electrode, in which the connection portion is formed along a side wall of the element protective layer.

18 Claims, 45 Drawing Sheets

(51) Int. Cl.
*H10K 59/131* (2023.01)
*H10K 59/80* (2023.01)

(52) U.S. Cl.
CPC . *H10K 59/80523* (2023.02); *H10K 59/80524* (2023.02); *H10K 59/82* (2023.02); *H10K 59/873* (2023.02); *H10K 59/876* (2023.02); *H10K 59/8791* (2023.02); *H10K 59/80518* (2023.02)

(58) Field of Classification Search
USPC .................................................. 313/498–512
See application file for complete search history.

(56) References Cited

U.S. PATENT DOCUMENTS

| | | | | |
|---|---|---|---|---|
| 2017/0365812 | A1* | 12/2017 | Choung | H10K 50/11 |
| 2019/0181202 | A1 | 6/2019 | Lim | |

FOREIGN PATENT DOCUMENTS

| | | | |
|---|---|---|---|
| JP | 2016021380 | A | 2/2016 |
| JP | 2017224584 | A | 12/2017 |
| KR | 20160103594 | A | 9/2016 |
| KR | 20170142231 | A | 12/2017 |
| TW | 200421925 | A | 10/2004 |
| TW | 201631756 | A | 9/2016 |
| TW | 201801302 | A | 1/2018 |
| WO | 2018034040 | A1 | 2/2018 |

* cited by examiner

A

B

C

D

A

B

C

A

B

A

B

A

B

A

B

A

B

A

B

A

B

A

B

A

B

A

B

A

B

A

B

C

D

A

B

DISPLAY DEVICE AND ELECTRONIC APPARATUS

TECHNICAL FIELD

The present disclosure relates to a display device and an electronic apparatus using the display device.

BACKGROUND ART

As a display device using an organic electroluminescence (EL) element, a display device having a structure in which an organic layer including at least an organic light emitting layer and a first cathode electrode are laminated on an anode electrode formed separately for each pixel has been proposed. At this time, one pixel may include a plurality of sub-pixels such as RGB.

Patent Document 1 proposes an organic light emitting device in which an upper electrode includes a first upper electrode and a second upper electrode directly provided on the first upper electrode.

CITATION LIST

Patent Document

PATENT DOCUMENT 1: Japanese Patent Application Laid-Open No. 2016-021380

SUMMARY OF THE INVENTION

Problems to be Solved by the Invention

The technique disclosed in Patent Document 1 has room for improvement in terms of suppressing damage to an organic light emitting layer due to a gas or the like at the time of processing and improving the reliability of a light emitting state of a pixel.

The present disclosure has been made in view of the above-described points, and an object of the present disclosure is to provide a display device and an electronic apparatus capable of improving the reliability of a light emission state of a pixel.

Solutions to Problems

The present disclosure is, for example, (1) a display device including:

- a plurality of light emitting elements including an anode electrode, an organic light emitting layer, and a first cathode electrode, the anode electrode, the organic light emitting layer, and the first cathode electrode being separated for each sub-pixel;
- a plurality of protective layers respectively covering the plurality of light emitting elements;
- a second cathode electrode provided on the plurality of protective layers; and
- a connection portion that electrically connects the second cathode electrode and the first cathode electrode,
- in which the connection portion is in contact with a side wall of the protective film.

Furthermore, the present disclosure may be, for example, (2) an electronic apparatus including a display device according to (1) described above.

MODE FOR CARRYING OUT THE INVENTION

Hereinafter, an implementation example and the like according to the present disclosure will be described with reference to the drawings. Note that, the description will be made in the following order. In the present specification and the drawings, configurations having substantially the same functional configuration are denoted by the same reference signs, and redundant descriptions are omitted.

Note that, the description will be given in the following order.

Figure 1:
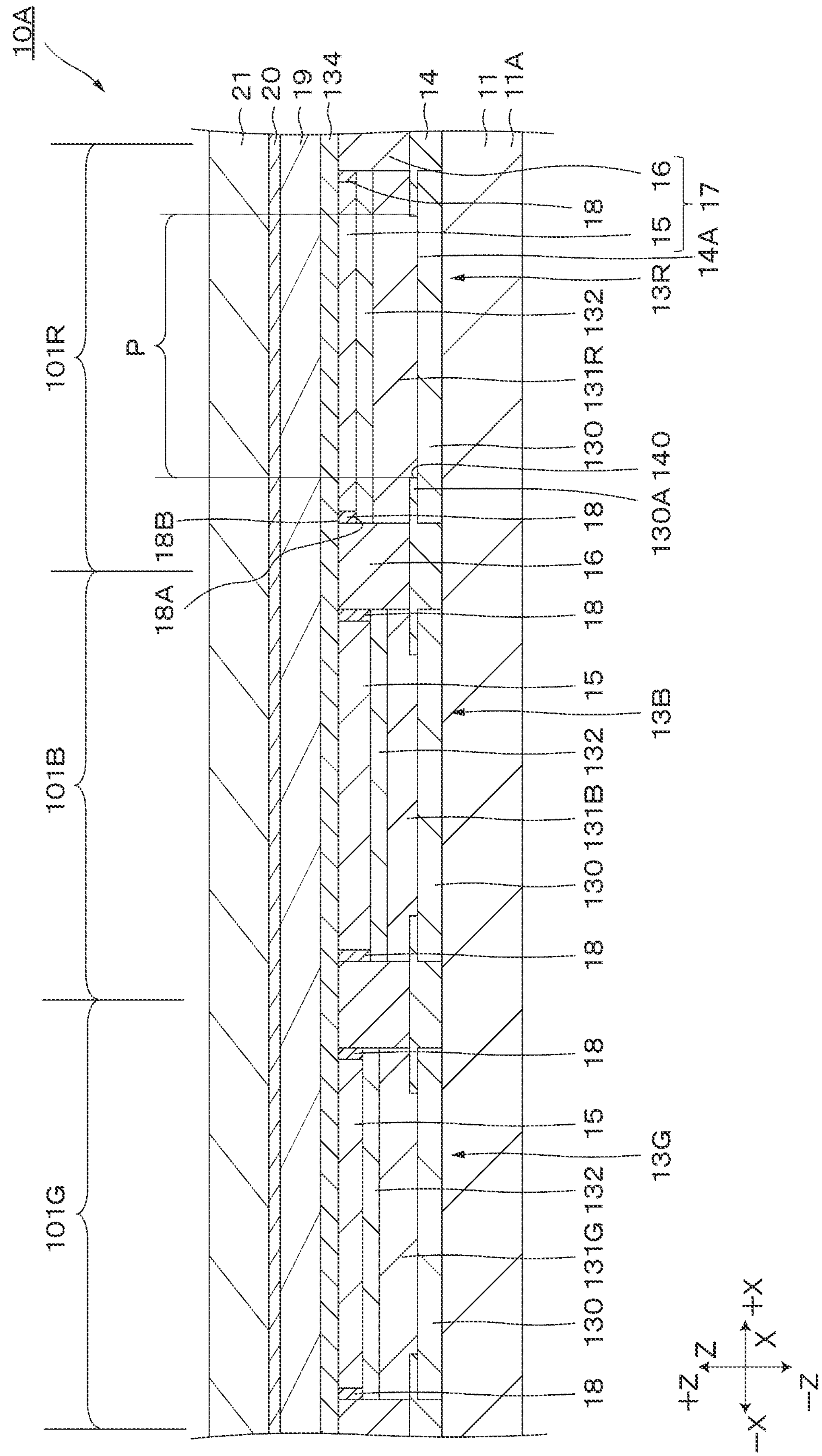
FIG. 1 is a cross-sectional view for explaining an example of a display device according to a first embodiment.
Figure 2:
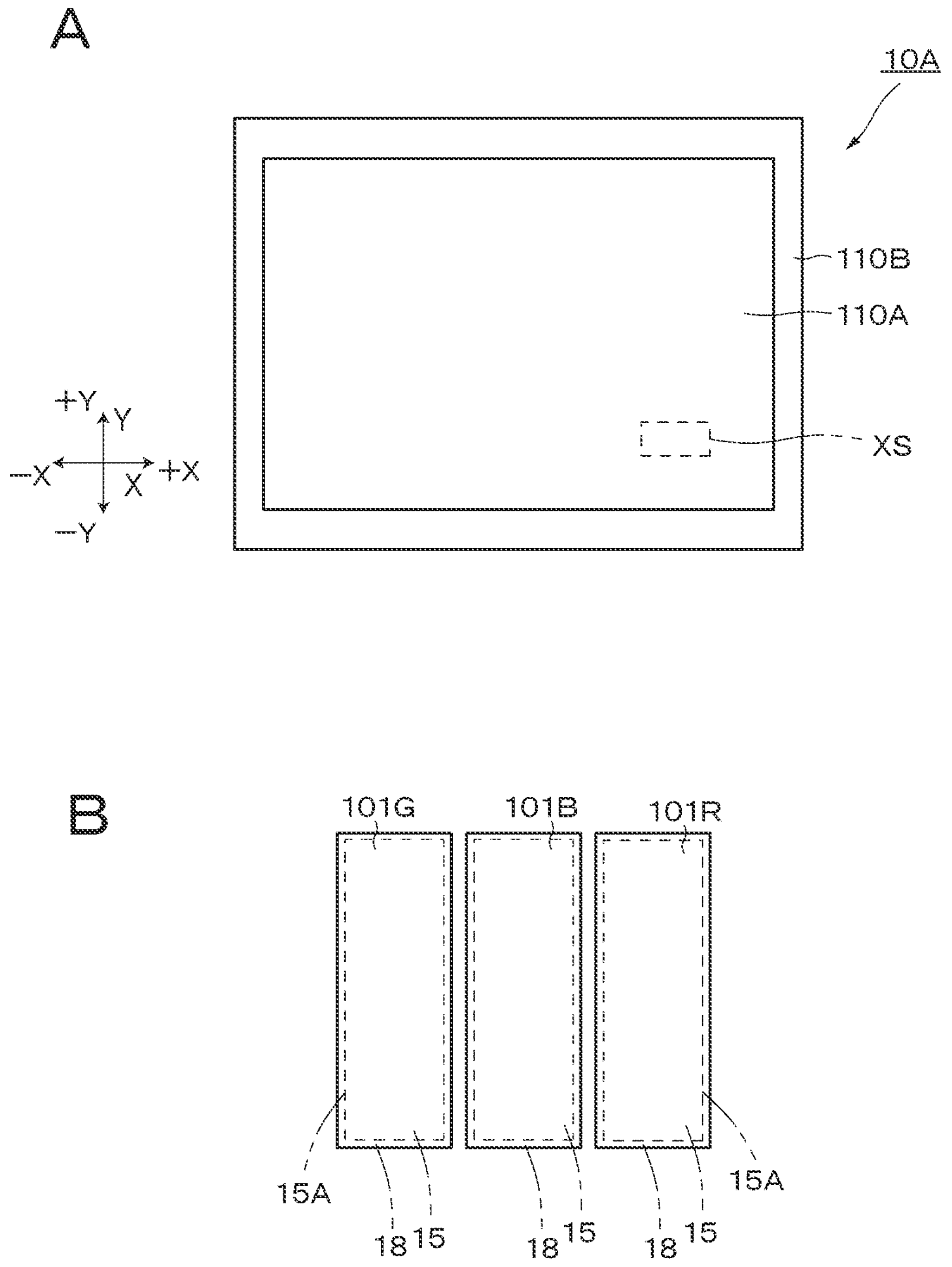
FIG. 2A is a plan view for explaining one of examples of a display device.
FIG. 2B is a partially enlarged plan view in which a part of an area XS surrounded by a broken line in FIG. 2A is enlarged.

1. First Embodiment
2. Second Embodiment
3. Third Embodiment
4. Fourth Embodiment
5. Fifth Embodiment
6. Sixth Embodiment
7. Seventh Embodiment
8. Electronic apparatus The following description is preferred specific examples of the present disclosure, and the content of the present disclosure is not limited to these embodiments and the like. Furthermore, in the following description, directions of front and back, left and right, up and down, and the like are indicated in consideration of convenience of description, but the content of the present disclosure is not limited to these directions. In the examples of FIGS. 1 and 2, a Z-axis direction is defined as a vertical direction (upper side is in +Z direction, lower side is in −Z direction), an X-axis direction is defined as a front-rear direction (front side is in +X direction, and rear side is in −X direction.), and a Y-axis direction is defined as a left-right direction (right side is in +Y direction, and left side is in −Y direction.), and the description will be given on the basis of these. This similarly applies to FIGS. 3 to 13. A relative magnitude ratio of the size and thickness of each layer illustrated in each drawing of FIG. 1 and the like is described for convenience, and do not limit actual magnitude ratios. This similarly applies to each drawing of FIGS. 2 to 16 regarding the definition and the magnitude ratio regarding these directions.

1 First Embodiment

1-1 Configuration of Display Device

FIG. 1 is a cross-sectional view illustrating a configuration example of an organic electroluminescence (EL) display device 10A (Hereinafter, simply referred to as a "display device 10A".) according to an embodiment of the present disclosure. The display device 10A includes a plurality of sub-pixels 101, and includes a drive substrate 11 and a plurality of light emitting elements 13.

The display device 10A is a top emission display device. In the display device 10A, the drive substrate 11 is located on a back surface side of the display device 10A, and a direction from the drive substrate 11 toward the light emitting elements 13 (+Z direction) is a front surface side (display surface 110A side, upper surface side) direction of the display device 10A. In the following description, in each layer constituting the display device 10A, a surface on the display surface 110A side of the display device 10A is referred to as a first surface (upper surface), and a surface on the back surface side of the display device 10A is referred to as a second surface (lower surface). Note that, in the example of the drawing, a peripheral portion 110B is provided on the drive substrate 11 at the peripheral edge of the region of the display surface 110A. FIG. 2A is a plan view for explaining an example of the display surface 110A of the display device 10A. This similarly applies to the second to sixth embodiments.

The display device 10A is, for example, a microdisplay in which self-emitting elements such as an organic light emitting diode (OLED), a micro-OLED, or a micro-LED are formed in an array. The display device 10A can be suitably mounted on a display device for virtual reality (VR), mixed reality (MR), or augmented reality (AR), an electronic view finder (EVF), a small projector, or the like. This similarly applies to the second to sixth embodiments.

(Configuration of Sub-Pixel)

In the example of the display device 10A illustrated in FIG. 1, one pixel is formed by a combination of a plurality of sub-pixels 101 corresponding to a plurality of color types. In this example, three colors of red, green, and blue are determined as the plurality of color types, and three types of a sub-pixel 101R, a sub-pixel 101G, and a sub-pixel 101B are provided as the sub-pixel 101. The sub-pixel 101R, the sub-pixel 101G, and the sub-pixel 101B are a red sub-pixel, a green sub-pixel, and a blue sub-pixel, respectively, and display red, green, and blue, respectively. However, the example of FIG. 1 is an example, and the display device 10A is not limited to the case of including the plurality of sub-pixels 101 corresponding to the plurality of color types. The color type may be one type, or one sub-pixel may form one pixel. Furthermore, wavelengths of light corresponding to respective color types of red, green, and blue can be determined as, for example, wavelengths in a range of 610 nm to 650 nm, a range of 510 nm to 590 nm, and a range of 440 nm to 480 nm, respectively.

Furthermore, the sub-pixels 101R, 101G, and 101B are arranged in the region of the display surface 110A. In the example of FIG. 1, the layout of the sub-pixels 101R, 101G, and 101B is a stripe-shaped layout arranged side by side in one pixel. The pixels are arranged in a matrix in a plane direction of the display surface 110A. FIG. 2 is a diagram for explaining the display surface 110A of the display device 10A.

In the following description, in a case where the sub-pixels 101R, 101G, and 101B are not particularly distinguished, the sub-pixels 101R, 101G, and 101B are collectively referred to as the sub-pixel 101.

(Drive Substrate)

The drive substrate 11 is provided with various circuits for driving the plurality of light emitting elements 13 on a substrate 11A. Examples of the various circuits include a drive circuit that controls driving of the light emitting elements 13 and a power supply circuit (none of which are illustrated) that supplies power to the plurality of light emitting elements 13.

The substrate 11A may include, for example, glass or resin having low moisture and oxygen permeability, or may include a semiconductor in which a transistor or the like is easily formed. Specifically, the substrate 11A may be a glass substrate, a semiconductor substrate, a resin substrate, or the like. The glass substrate includes, for example, high strain point glass, soda glass, borosilicate glass, forsterite, lead glass, quartz glass, or the like. The semiconductor substrate includes, for example, amorphous silicon, polycrystalline silicon, monocrystalline silicon, or the like. The resin substrate includes, for example, at least one selected from a group including polymethyl methacrylate, polyvinyl alcohol, polyvinyl phenol, polyethersulfone, polyimide, polycarbonate, polyethylene terephthalate, polyethylene naphthalate, and the like.

A plurality of contact plugs (not illustrated) for connecting the light emitting elements 13 and the various circuits provided on the substrate 11A is provided on the first surface of the drive substrate 11.

(Light Emitting Elements)

In the display device 10A, the plurality of light emitting elements 13 is provided on the first surface of the drive substrate 11. The light emitting elements 13 are provided for each sub-pixel 101. In the example of FIG. 1, as the plurality of light emitting elements 13, individual light emitting elements 13R, 13G, and 13B are provided so as to correspond to the individual sub-pixels 101R, 101G, and 101B, respectively. The light emitting element 13R illustrated in this example is a red OLED configured to emit red light. The light emitting element 13G is a green OLED configured to emit green light. Light emitting element 13B is a blue OLED configured to emit blue light. The light emitting elements 13 may be a Micro-OLED (MOLED) or a Micro-LED.

In the present specification, in a case where the types such as the light emitting elements 13R, 13G, and 13B are not particularly distinguished, the light emitting elements 13R, 13G, and 13B are collectively referred to as the light emitting elements 13. The plurality of light emitting elements 13 is, for example, two-dimensionally arranged in a prescribed arrangement pattern such as a matrix shape or the like. In the example of FIG. 2A, the plurality of light emitting elements 13 is two-dimensionally arranged in predetermined two directions (an X-axis direction and a Y-axis direction in FIG. 2A) according to an arrangement of the sub-pixels 101.

Each of the light emitting elements 13 includes an anode electrode 130, an organic layer 131, and a first cathode electrode 132. The anode electrode 130, the organic layer 131, and the first cathode electrode 132 are provided in this order in a direction away from the drive substrate 11 side (along the +Z direction). In the example of FIG. 1, the light emitting element 13R includes the anode electrode 130 provided on the drive substrate 11, the organic layer 131R provided on the anode electrode 130, and the first cathode electrode 132 provided on the organic layer 131R. The light emitting element 13G includes the anode electrode 130 provided on the drive substrate 11, an organic layer 131G provided on the anode electrode 130, and the first cathode electrode 132 provided on the organic layer 131G. The light emitting element 13B includes the anode electrode 130 provided on the drive substrate 11, an organic layer 131B provided on the anode electrode 130, and the first cathode electrode 132 provided on the organic layer 131B. Note that, in the following description, in a case where the organic layers 131R, 131G, and 131B are not particularly distinguished, the organic layers 131R, 131G, and 131B are collectively referred to as the organic layer 131.

(Light Emitting Region of Light Emitting Element)

In the present specification, as illustrated in FIG. 1, a light emitting region P of the light emitting element 13 is a region where the anode electrode 130, the organic layer 131, and the first cathode electrode 132 overlap with each other on a first surface side of the first cathode electrode 132 with a thickness direction of the light emitting element 13 as a line-of-sight direction.

(Anode Electrode)

In the display device 10A, a plurality of the anode electrodes 130 is provided on the first surface side of the drive substrate 11 in a state of being electrically separated for each sub-pixel 101. In the example of FIG. 1, the anode electrode 130 is electrically separated by an insulating layer 14 as described later. The anode electrode 130 also preferably serves as a reflection layer. In a case where this viewpoint is emphasized, it is preferable that the anode electrode 130 has as high a reflectance as possible. Moreover, the anode electrode 130 preferably includes a material having a large work function in order to enhance light emission efficiency.

The anode electrode 130 includes at least one of a metal layer or a metal oxide layer. For example, the anode electrode 130 may be constituted by a single-layer film of a metal layer or a metal oxide layer, or a laminated film of a metal layer and a metal oxide layer. In a case where the anode electrode 130 is constituted by a laminated film, the metal oxide layer may be provided on the organic layer 131 side, or the metal layer may be provided on the organic layer 131 side, but from the viewpoint of adjoining a layer having a high work function to the organic layer 131, the metal oxide layer is preferably provided on the organic layer 131 side.

The metal layer includes, for example, at least one metal element selected from a group including chromium (Cr), gold (Au), platinum (Pt), nickel (Ni), copper (Cu), molybdenum (Mo), titanium (Ti), tantalum (Ta), aluminum (Al), magnesium (Mg), iron (Fe), tungsten (W), and silver (Ag). The metal layer may include the at least one metal element described above as a constituent element of an alloy. Specific examples of the alloy include an aluminum alloy and a silver alloy. Specific examples of the aluminum alloy include, for example, AlNd and AlCu.

The metal oxide layer includes, for example, at least one of a mixture of indium oxide and tin oxide (ITO), a mixture of indium oxide and zinc oxide (IZO), or titanium oxide (TiO).

(Organic Layer)

The organic layer 131 is provided between the anode electrode 130 and the first cathode electrode 132. The organic layer 131 is provided in a state of being electrically separated (divided) for each sub-pixel 101. In the example of the drawing, the organic layers 131R, 131G, and 131B are provided. The organic layers 131R, 131G, and 131B have color types corresponding to a light emission color of the sub-pixel 101, and red, blue, and green are set as emission colors, respectively.

The organic layer 131 has a configuration in which a hole injection layer, a hole transport layer, a light emitting layer, and an electron transport layer are laminated in this order from the anode electrode 130 toward the first cathode electrode 132. Note that the configuration of the organic layer 131 is not limited thereto, and layers other than the light emitting layer are provided as necessary. The light emitting layer is an organic light emitting layer containing an organic light emitting material.

The hole injection layer is a buffer layer for enhancing hole injection efficiency into the light emitting layer and reducing leakage. The hole transport layer is for enhancing hole transport efficiency to the light emitting layer. The light emitting layer generates light by recombination of electrons and holes when an electric field is applied. The electron transport layer is for enhancing electron transport efficiency to the light emitting layer. An electron injection layer may be provided between the electron transport layer and the first cathode electrode 132. The electron injection layer is for enhancing electron injection efficiency.

Note that a thickness of the organic layer 131 may be the same or may be different between different color types of the sub-pixel 101. For example, the thicknesses of the organic layers 131R, 131G, and 131B corresponding to the sub-pixels 101R, 101G, and 101B may be different from each other. In the example of FIG. 1, the thicknesses of the organic layers 131R, 131G, and 131B are different among different color types of the sub-pixel 101.

(First Cathode Electrode)

The first cathode electrode 132 is provided to face the anode electrode 130. The first cathode electrode 132 faces the second cathode electrode 134. The first cathode electrode 132 is electrically separated for each of the sub-pixels 101R, 101G, and 101B.

The first cathode electrode 132 is a transparent electrode having transparency to light generated in the organic layer 131. Here, in the present specification, unless otherwise specified, the concept of the transparent electrode includes not only a transparent conductive layer but also a semi-transmissive reflecting layer and a combination thereof. The first cathode electrode 132 includes at least one of a metal layer or a metal oxide layer. More specifically, the first cathode electrode 132 is constituted by a single-layer film of a metal layer or a metal oxide layer, or a laminated film of a metal layer and a metal oxide layer. In a case where the first cathode electrode 132 is constituted by a laminated film, the metal layer may be provided on the organic layer 131 side, or the metal oxide layer may be provided on the organic layer 131 side, but from the viewpoint of adjoining a layer having a low work function to the organic layer 131, the metal layer is preferably provided on the organic layer 131 side.

The metal layer includes, for example, at least one metal element selected from a group including magnesium (Mg), aluminum (Al), silver (Ag), calcium (Ca), and sodium (Na). The metal layer may include the at least one metal element described above as a constituent element of an alloy. Specific examples of the alloy include an MgAg alloy, an MgAl alloy, an AlLi alloy, and the like. The metal oxide includes, for example, at least one of a mixture of indium oxide and tin oxide (ITO), a mixture of indium oxide and zinc oxide (IZO), or zinc oxide (ZnO).

(Second Cathode Electrode)

The second cathode electrode 134 is provided as an electrode common to all the sub-pixels 101R, 101G, and 101B in a region in the display surface 110A. The second cathode electrode 134 is connected to the first cathode electrode 132 separated for each sub-pixel 101 via a connection portion 18 as described later. The second cathode electrode 134 is provided on a lower protective layer 17 as described later. In the example of FIG. 1, the second cathode electrode 134 is provided on an element protective layer 15 on the lower protective layer 17 so as to cover the first surface side of the element protective layer 15.

Similarly to the first cathode electrode 132, the second cathode electrode 134 is a transparent electrode having transparency to light generated in the organic layer 131. Furthermore, similarly to the first cathode electrode 132, the second cathode electrode 134 includes at least one of a metal layer or a metal oxide layer. The metal layer and the metal oxide layer applicable to the second cathode electrode 134 are similar to the metal layer and the metal oxide layer applicable to the first cathode electrode 132.

(Insulating Layer)

In the display device 10A, as illustrated in FIG. 1, the insulating layer 14 is preferably provided on the first surface side of the drive substrate 11. The insulating layer 14 is provided between the adjacent anode electrodes 130, and electrically separates each anode electrode 130 for each light emitting element 13 (that is, for each sub-pixel 101). Furthermore, the insulating layer 14 has a plurality of openings 14A, and the first surface of the anode electrode 130 (the surface facing the first cathode electrode 132) is exposed from the openings 14A. Note that, in the example of FIG. 1 and the like, the insulating layer 14 covers a region from a peripheral edge portion 130A to a side surface (sometimes referred to as an end surface or a side wall) of the separated first surface of the anode electrode 130. Then, in this case, each opening 14A is disposed on the first surface of each anode electrode 130, and an opening end edge 140 of the opening 14A is located inside the end edge of the anode electrode 130. Furthermore, at this time, the anode electrode 130 is exposed from the opening 14A, and this exposed region defines the light emitting region P of the light emitting element 13. In the present specification, the peripheral edge portion 130A of the first surface of the anode electrode 130 refers to a region having a predetermined width from the outer peripheral edge on the first surface side of each anode electrode 130 toward the inside of the first surface.

The insulating layer 14 includes, for example, an organic material or an inorganic material. The organic material includes, for example, at least one of polyimide or acrylic resin. The inorganic material includes, for example, at least one of silicon oxide, silicon nitride, silicon oxynitride, or aluminum oxide.

(Lower Protective Layer)

The lower protective layer 17 is a protective layer formed below the second cathode electrode 134 (on a second surface side of the second cathode electrode 134), and protects the first cathode electrode 132 and the organic layer 131. In the example of FIG. 1, the lower protective layer 17 has a portion covering the first cathode electrode 132 and a portion formed between the adjacent light emitting elements 13. As described below, a portion covering the first cathode electrode 132 is referred to as the element protective layer 15. A portion formed between the adjacent light emitting elements 13 is referred to as a side wall protective layer 16.

In the present specification, as necessary, the term lower protective layer 17 is used as a concept including the element protective layer 15 as a protective layer and the side wall protective layer 16 as a protective layer.

(Element Protective Layer)

The element protective layer 15 is formed as a protective layer on the first surface of each of the first cathode electrodes 132, and covers the first surface of the first cathode electrode 132. The element protective layer 15 may entirely cover the first cathode electrode 132 or may be in a state of avoiding a partial region of the first cathode electrode 132. The element protective layer 15 is located above the light emitting element 13 and is interposed between the first cathode electrode 132 and the second cathode electrode 134. The element protective layer 15 shields the light emitting element 13 from the outside air, and suppresses moisture ingress into the light emitting element 13 from the external environment. The element protective layer 15 prevents the organic layer 131 from being damaged by being exposed to a process gas, a chemical liquid, or the like in a manufacturing process. Furthermore, in a case where the first cathode electrode 132 includes a metal layer, the element protective layer 15 may have a function of suppressing oxidation of the metal layer.

The element protective layer 15 includes an insulating material. As the insulating material, for example, thermosetting resin or the like can be used. In addition, the insulating material may be SiO, SiON, AlO, TiO, or the like. In this case, as the element protective layer 15, a CVD film containing SiO, SiON, or the like, an ALD film containing AlO, TiO, SiO, or the like, or the like can be exemplified. The element protective layer 15 may be formed as a single layer, or may be formed in a state where a plurality of layers is laminated. In a case where the element protective layer 15 includes a first protective layer in the first cathode electrode 132 and a second protective layer so as to cover the first protective layer as a two-layer laminated structure, the first protective layer preferably includes a CVD film, and the second protective layer preferably includes an ALD film. Note that the CVD film indicates a film formed using chemical vapor deposition. The ALD film indicates a film formed using atomic layer deposition.

The shape of the element protective layer 15 in the up-down direction (thickness direction) is not particularly limited, and the side wall of the element protective layer 15 may be tapered, or may be formed in a non-tapered shape as illustrated in FIG. 1.

In a case where the normal direction of the display surface 110A is the line-of-sight direction, the element protective layer 15 has a shape corresponding to the shape of the light emitting element 13, and it is preferable to cover the light emitting surface of the light emitting element 13 from the viewpoint of efficiently exhibiting the function of protecting the light emitting element 13 and from the viewpoint of forming the connection portion 18 to be described later at an appropriate position.

Note that the thickness of the element protective layer 15 may be the same or different among different color types of the sub-pixel 101. For example, in a case where the thicknesses of the organic layers 131R, 131G, and 131B corresponding to the sub-pixels 101R, 101G, and 101B are different from each other, the first surface for forming the second cathode electrode 134 can be flattened by making the thickness of the element protective layer 15 different.

(Side Wall Protective Layer)

In the example of FIG. 1, the side wall protective layer 16 is formed as a protective layer between the second cathode electrode 134 and the insulating layer 14 between the adjacent light emitting elements 13. The side wall protective layer 16 fills a space between the adjacent light emitting elements 13 and covers the side surface of the connection portion 18 to suppress moisture from entering the connection portion 18 from the external environment. The side wall protective layer 16 may include the similar material to the element protective layer 15.

(Upper Protective Layer)

The upper protective layer 19 is a protective layer covering the second cathode electrode 134. The upper protective layer 19 protects the second cathode electrode 134. Specifically, the upper protective layer 19 suppresses moisture from reaching the second cathode electrode 134 from the external environment. Moreover, similarly to the lower protective layer 17, the upper protective layer 19 also suppresses moisture ingress into the light emitting element 13 from the external environment. That is, the upper protective layer 19 reinforces the protection of the light emitting element 13 by the lower protective layer 17. In a case where the second cathode electrode 134 includes a metal layer, the upper protective layer 19 may have a function of suppressing oxidation of the metal layer.

The material of the upper protective layer 19 includes an insulating material similarly to the lower protective layer 17 such as the element protective layer 15. The kind of the insulating material may be similar to that described in the element protective layer 15. Similarly to the element protective layer 15, the upper protective layer 19 may also be formed as a single layer or in a state where a plurality of layers is laminated.

(Connection Portion)

The connection portion 18 is a portion that electrically connects the first cathode electrode 132 and the second cathode electrode 134. In the display device 10A according to the first embodiment, the connection portion 18 is provided separately from the first cathode electrode 132 and the second cathode electrode 134. However, the application range of the connection portion 18 is not limited to the technology of providing the connection portion separately from the first cathode electrode 132 and the second cathode electrode 134, and the connection portion 18 can be applied to a technology in which a part of the first cathode electrode 132 or a part of the second cathode electrode 134 is used as a portion connecting the first cathode electrode 132 and the second cathode electrode 134.

The connection portion 18 is formed along the side wall of the element protective layer 15. The connection portion 18 may be formed along a part of the surface of the side wall 15A of the element protective layer 15, but is preferably formed on the entire circumference of the side wall 15A of the element protective layer 15 as illustrated in FIGS. 1, 2B, and the like from the viewpoint of securing the connection between the first cathode electrode 132 and the second cathode electrode 134.

Furthermore, in a case where the element protective layer 15 covers the light emitting region P, the connection portion 18 is provided outside the light emitting region P, and the influence of the connection portion 18 on the light emitting state is suppressed. Therefore, it is possible to suppress a decrease in luminance of the display device 10A.

The proximal end 18A of the connection portion 18 is a position where the side wall 15A of the element protective layer 15 is in contact with the first cathode electrode 132, and the connection portion 18 extends from the proximal end 18A toward the second cathode electrode 134 along the side wall 15A of the element protective layer 15. The distal end 18B of the connection portion 18 is in contact with the second surface side of the second cathode electrode 134.

The connection portion 18 contains a conductive material. The connection portion 18 preferably includes a product of the first cathode electrode 132 (so-called depot) from the viewpoint of simplifying the process. In this case, the connection portion 18 contains an element (metal element) that forms the first cathode electrode 132, contains a conductive material, and has conductivity. Furthermore, the connection portion 18 may be newly provided by a sidewall process. The sidewall process refers to a technique of forming a layer on a side wall surface or the like by appropriately combining a lithography technique, a CVD technique, an etching technique, and the like.

(Filling Resin Layer)

A filling resin layer 20 may be formed on the first surface side of the upper protective layer 19. The filling resin layer 20 can have a function as an adhesive layer for bonding a counter substrate 21 described later. Examples of the filling resin layer 20 include ultraviolet curable resin, thermosetting resin, and the like.

(Counter Substrate)

The counter substrate 21 is provided on the filling resin layer 20 in a state of facing the drive substrate 11. The counter substrate 21 seals the light emitting elements 13 together with the filling resin layer 20. The counter substrate 21 may include a similar material to the substrate 11A included in the drive substrate 11, and preferably includes a material such as glass or the like.

Note that, for convenience of description, description of the filling resin layer 20 and the counter substrate 21 is omitted in FIGS. 2 to 11 for the first embodiment and FIGS. 12 to 43 for the second to sixth embodiments. Furthermore, for convenience of description, description of the upper protective layer 19 may be further omitted in the drawings.

1-2 Manufacturing Method

Figure 3:
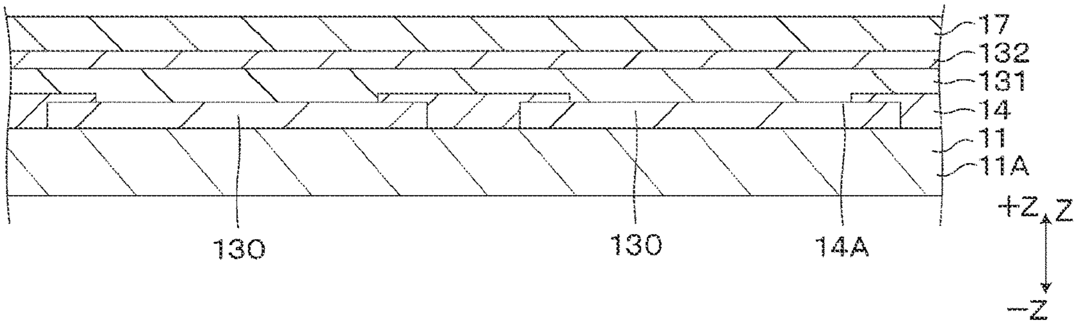
FIGS. 3A to 3D are cross-sectional views illustrating an example of a method of manufacturing the display device according to the first embodiment.
Figure 3:
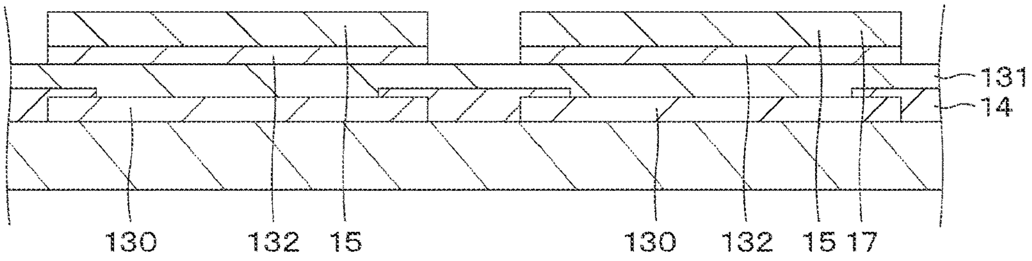
Figure 3:
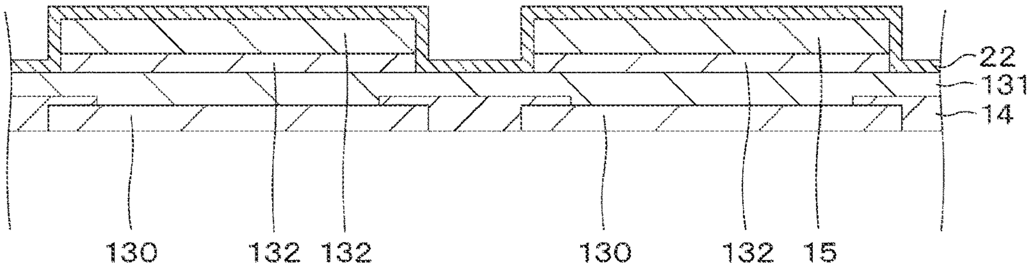
Figure 3:
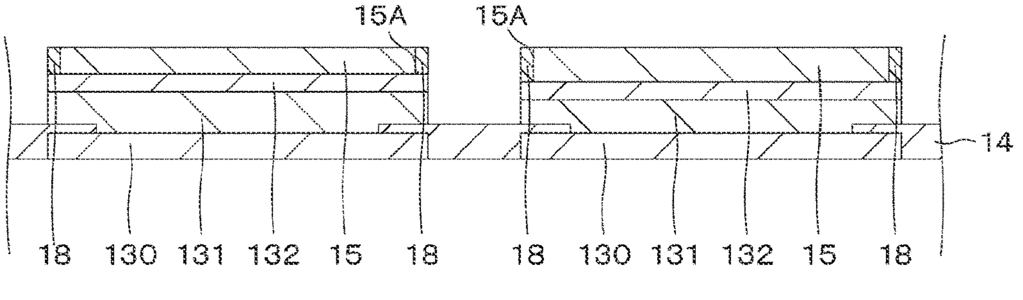
Figure 4:
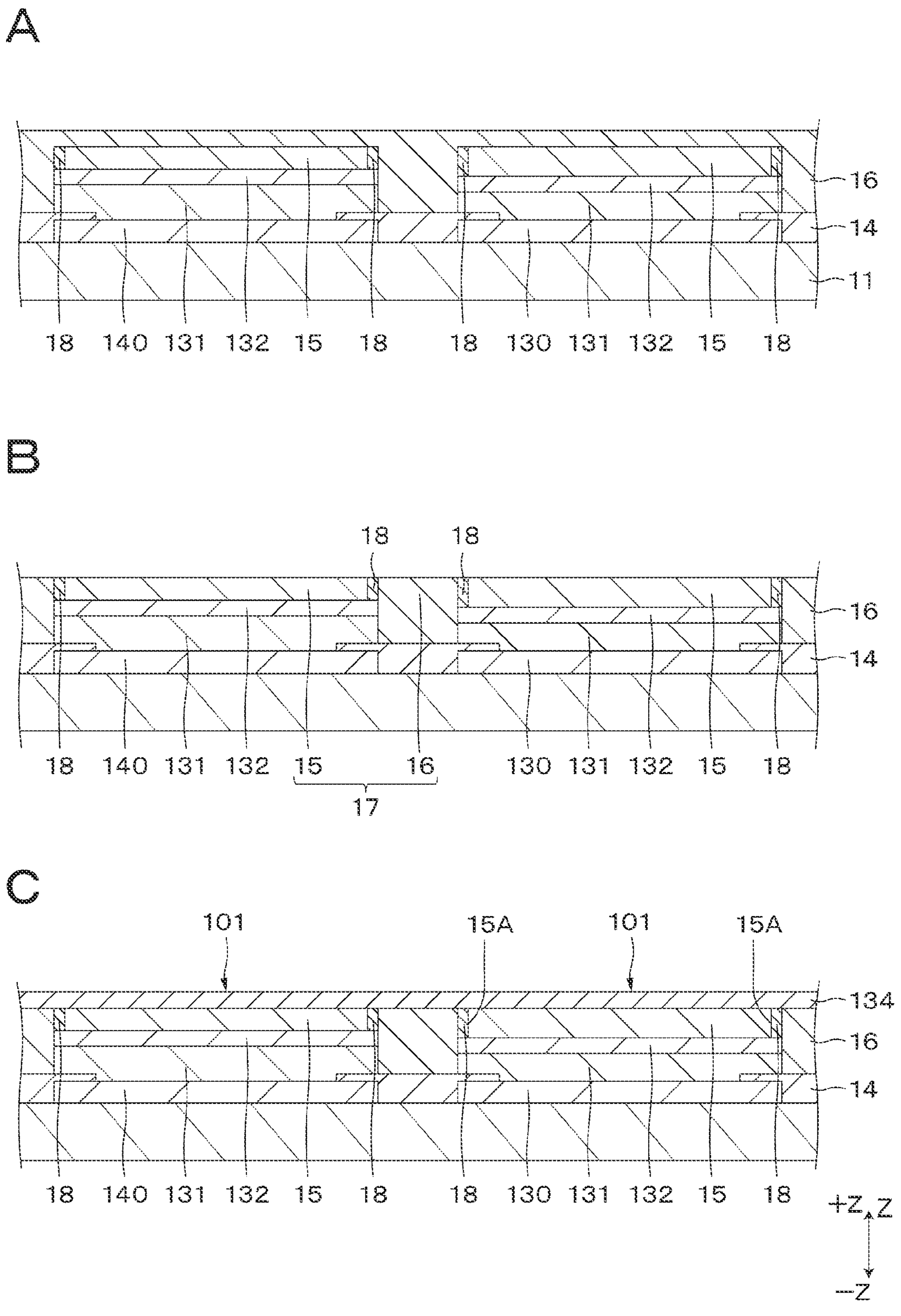
FIGS. 4A to 4C are cross-sectional views illustrating an example of a method of manufacturing the display device according to the first embodiment.

A method of manufacturing the display device 10A according to the first embodiment will be described with reference to FIGS. 3 and 4. FIGS. 3 and 4 are diagrams illustrating an example of a method of manufacturing the display device 10A according to the first embodiment. First, the anode electrode 130 and the insulating layer 14 are formed on the drive substrate 11, and the organic layer 131, the first cathode electrode 132, and the lower protective layer 17 (element protective layer 15) are formed (FIG. 3A). Next, the element protective layer 15 and the first cathode electrode 132 are patterned for each sub-pixel 101 (FIG. 3B). At this time, the side end portion of the first cathode electrode 132 is exposed. Moreover, a conductive film 22 including the material of the first cathode electrode 132 is formed on the first surface (FIG. 3C). As a method of forming the conductive film 22, it is preferable to use a method excellent in film formability, such as ALD, for example. The conductive film 22 is in contact with the first cathode electrode 132. Then, a dry etching method or the like is applied to the entire surface of the conductive film 22 (FIG. 3D). At this time, the connection portion 18 includes the conductive film 22 left on the side wall 15A of the element protective layer 15. Furthermore, the organic layer 131 is divided and processed for each sub-pixel 101. Thereafter, the side wall protective layer 16 is formed (FIG. 4A), and planarization processing is performed using a dry etching method or the like (FIG. 4B). At this time, the element protective layer 15 and the upper end portion of the connection portion 18 are exposed. Then, the second cathode electrode 134 is entirely formed on the first surface (FIG. 4C). The second cathode electrode 134 is electrically connected to the first cathode electrode 132 via the connection portion 18. Then, the upper protective layer 19 is formed on the second cathode electrode 134, and the upper protective layer 19 and the counter substrate 21 are fixed via the filling resin layer 20. Thus, the display device 10A is obtained.

1-3 Action and Effect

According to the first embodiment, since the connection portion 18 can have a self-alignment structure at a position along the side wall 15A of the element protective layer 15, the via opening process can be omitted. Furthermore, since the connection between the second cathode electrode 134 and the first cathode electrode 132 can be realized without securing a region having a certain size inside the sub-pixel 101 for the purpose of securing the connection portion, it is advantageous for high definition of the sub-pixel 101.

Furthermore, in the display device 10A, the element protective layer 15 is provided between the first cathode electrode 132 and the second cathode electrode 134. As a result, the element protective layer 15 can prevent the organic layer 131 from being exposed to a process gas, a chemical liquid, or the like in an etching process or the like of the organic layer 131 and the first cathode electrode 132. That is, the organic layer 131 can be prevented from being damaged. Therefore, it is possible to suppress a decrease in reliability of the light emission state of the display device 10A.

Furthermore, the anode electrode 130, the organic layer 131, and the first cathode electrode 132 are separated for each sub-pixel 101, and the insulating side wall protective layer 16 is provided between the sub-pixels 101. As a result, a leakage current between the adjacent sub-pixels 101 can be suppressed. Therefore, color mixing can be suppressed, and color reproducibility and light emission efficiency can be improved, so that the reliability of the light emission state of the display device 10A can be improved.

1-4 Modification Example of Display Device

Next, a modification example of the display device 10A according to the first embodiment will be described.

First Modification Example

Figure 5:
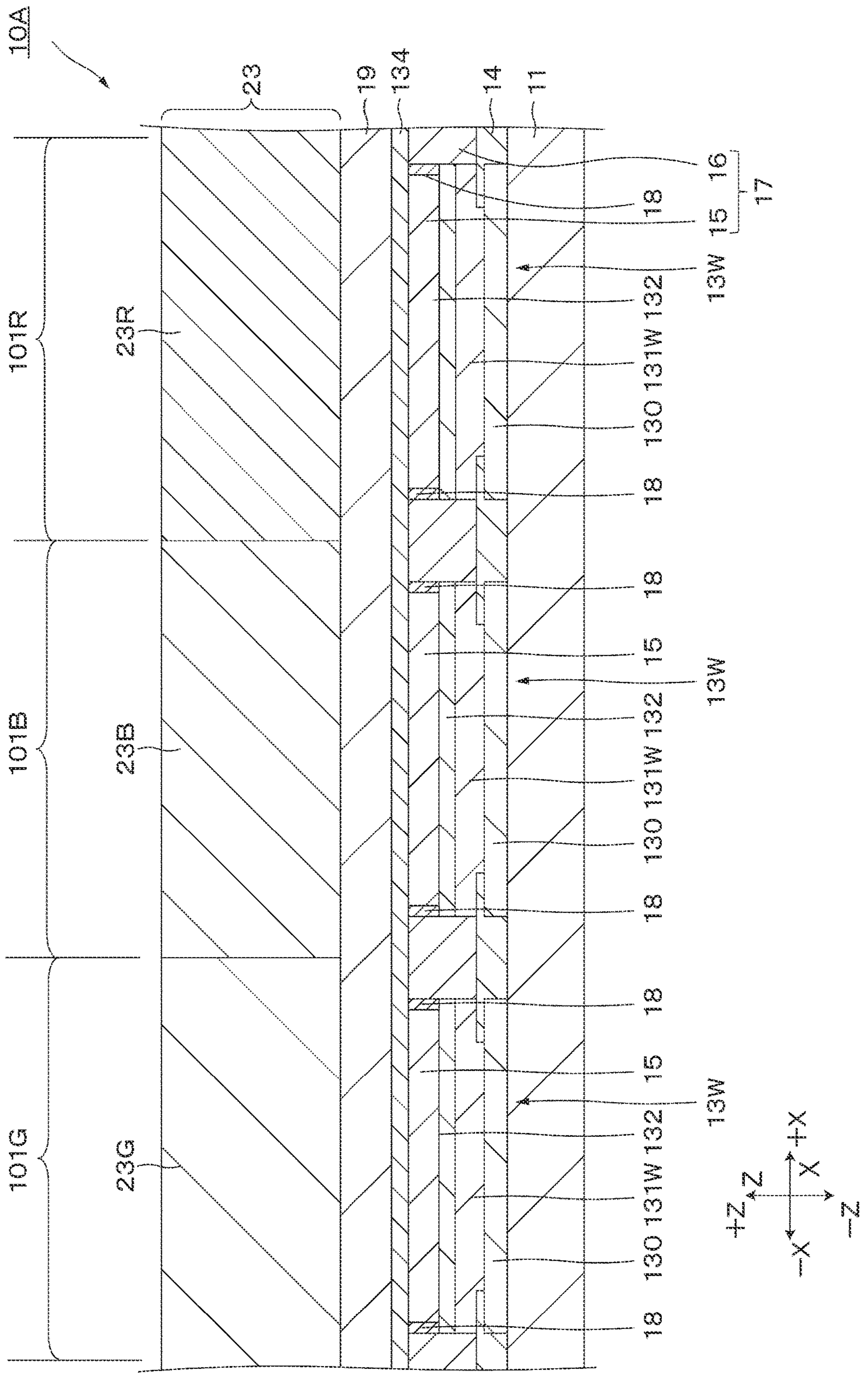
FIG. 5 is a cross-sectional view illustrating a modification example of the display device according to the first embodiment.
Figure 6:
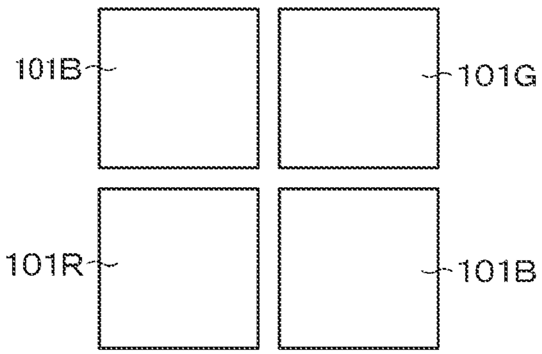
FIGS. 6A to 6C are plan views for explaining an example of a layout of sub-pixels of the display device according to the first embodiment.
Figure 6:
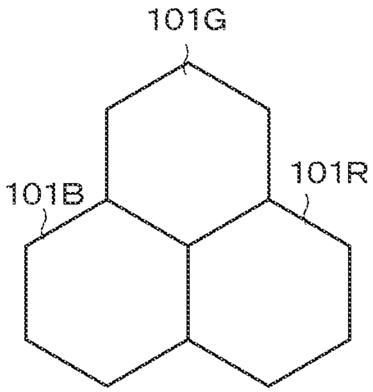
Figure 6:
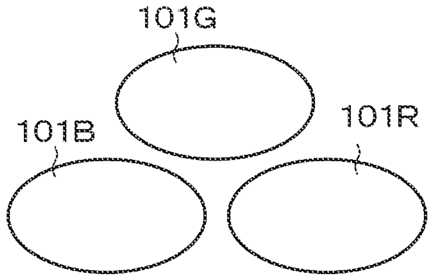
Figure 7:
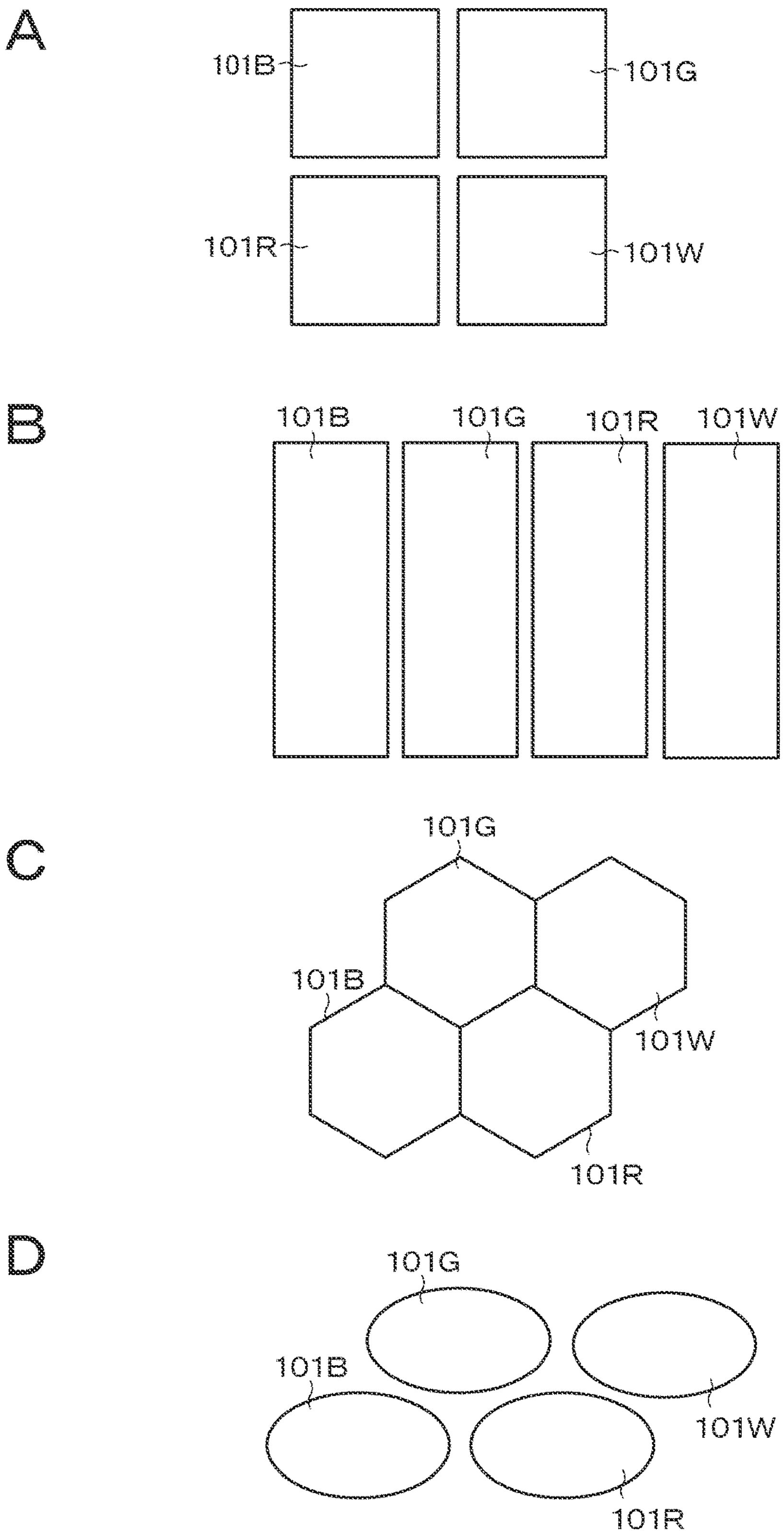
FIGS. 7A to 7D are plan views for explaining an example of a layout of sub-pixels of the display device according to the first embodiment.

In the description of the first embodiment, the light emission color of the organic layer 131 is the color type corresponding to the light emission color of the sub-pixel 101, but in the display device 10A according to the first embodiment, the light emission color of the light emitting element 13 may be a color type other than the color type corresponding to the light emission color of the sub-pixel 101. For example, specifically, the light emitting element 13W in which the light emission color is white regardless of the color type of the sub-pixel 101 may be provided (FIG. 5). FIG. 5 is a cross-sectional view illustrating an example of a display device 10A according to the first modification example of the first embodiment. Furthermore, in the display device 10A according to the first modification example, the light emitting element 13W is provided, and a color filter 23 according to the color type of the sub-pixel 101 is provided. As a result, light corresponding to the color type of the sub-pixel 101 is displayed on the display surface 110A. However, this does not restrict provision of the color filter 23 in a case where the light emitting element 13 corresponding to the light emission color of the sub-pixel 101 is provided.

(Organic Layer)

The light emitting element 13W includes an organic layer 131 W that emits white light. The structure of the organic layer 131W is not particularly limited to the above, and examples thereof include a light emitting layer having a so-called 1 stack structure having a combination of a red light emitting layer, a green light emitting layer, and a blue light emitting layer. Note that the thickness of the organic layer 131W may be the same or different for each sub-pixel 101. In the example of FIG. 5, the thickness of the organic layer 131W is made uniform among the sub-pixels 101G, 101B, and 101R.

(Color Filter)

The color filter 23 is provided on the first surface side (upper side, +Z direction side) of the upper protective layer 19. Furthermore, the color filter 23 illustrated in FIG. 5 is an on-chip color filter (OCCF). Examples of the color filter 23 include a red color filter (red filter 23R), a green color filter (green filter 23G), and a blue color filter (blue filter 23B) as illustrated in the example of FIG. 5. Each of the red filter 23R, the green filter 23G, and the blue filter 23B is provided to face the light emitting element 13W. As a result, the white light emitted from each of the light emitting elements 13W in the red sub-pixel 101R, the green sub-pixel 101G, and the blue sub-pixel 101B passes through the red filter 23R, the green filter 23G, and the blue filter 23B, respectively, so that the red light, the green light, and the blue light are emitted from the display surface 110A, respectively.

Second Modification Example

In the display device 10A of the first embodiment, the layout of the sub-pixels 101R, 101G, and 101B may be a pattern other than the stripe-shaped pattern as illustrated in the example of FIG. 2B. For example, a delta-shaped layout pattern as illustrated in FIGS. 6B and 6C may be used, or a square arrangement pattern as illustrated in FIG. 6A may be used. Note that the delta shape indicates an arrangement in which the centers of the three sub-pixels 101R, 101G, and 101B are connected to form a triangle. The square arrangement indicates an arrangement in which the centers of four sub-pixels (In the example of FIG. 3B, the sub-pixels 101R, 101G, 101B, and 101B) are connected to form a square. Furthermore, the number of color types of the sub-pixel 101 is not limited to three. For example, as illustrated in FIGS. 7A to 7D, the sub-pixel 101 may have four types of color types. FIGS. 7A to 7D are diagrams illustrating exemplary layouts in a case where the display device 10A includes the sub-pixels 101R, 101G, 101B, and 101W corresponding to four types of color types (red, green, blue, and white). Also in this case, the layout of the sub-pixel 101 is not particularly limited, and may be, for example, a delta shape (FIGS. 7C and 7D), a square array (FIG. 7A), a stripe array (FIG. 7B), or the like.

Third Modification Example

Figure 8:
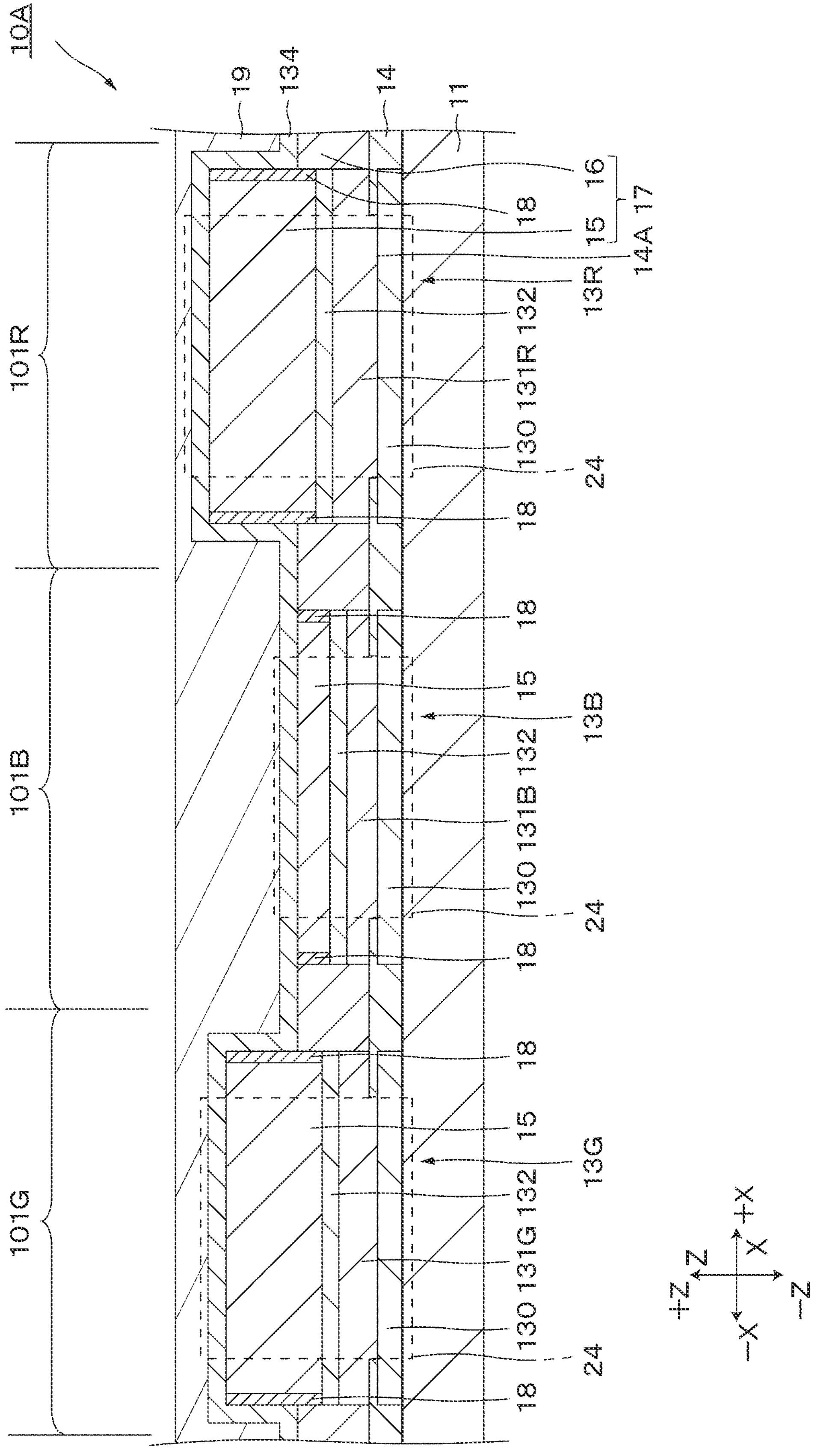
FIG. 8 is a cross-sectional view illustrating a modification example of the display device according to the first embodiment.

In the display device 10A of the first embodiment, as illustrated in FIG. 8, the sub-pixel 101 may form a resonator structure 24 (Third modification example). FIG. 8 is a cross-sectional view illustrating an example of a display device 10A according to a third modification example.

In the third modification example, the resonator structure 24 includes the second cathode electrode 134 and the light emitting element 13. The resonator structure 24 shows a structure that causes light of a predetermined wavelength to resonate. In the third modification example, for example, it is preferable that the first cathode electrode 132 of the light emitting element 13 includes a transparent electrode, and the second cathode electrode 134 includes a semi-transmission reflection layer. Note that the case that the semi-transmission reflection layer is included includes the case that only the semi-transmission reflection layer is formed. The anode electrode 130 preferably has light reflectivity. The optical distance between the second cathode electrode 134 and the anode electrode 130 is adjusted such that the resonator structure 24 resonates light corresponding to the color type of the sub-pixel 101 for each sub-pixel 101. This is specifically realized, for example, by adjusting the thickness of the element protective layer 15 as illustrated in FIG. 8. In the example of FIG. 8, the element protective layers 15 have different thicknesses among the sub-pixels 101 corresponding to different color types. Furthermore, in the example of FIG. 8, organic layers 131R, 131G, and 131B are provided corresponding to the sub-pixels 101R, 101G, and 101B. In this case, light in which red, green, and blue are more emphasized is emitted from the display surface 110A side for each of the organic layers 131R, 131G, and 131B by the resonator structure 24, and the color purity can be improved. Note that the optical distance is a sum of products of thicknesses and refractive indexes of the respective layers forming the resonator structure 24.

According to the display device 10A, even if the element protective layer 15 has different thicknesses as described above, the connection portion 18 is formed on the side wall 15A of the element protective layer 15, so that the first cathode electrode 132 and the second cathode electrode 134 can be effectively connected by the connection portion 18.

Fourth Modification Example

Figure 9:
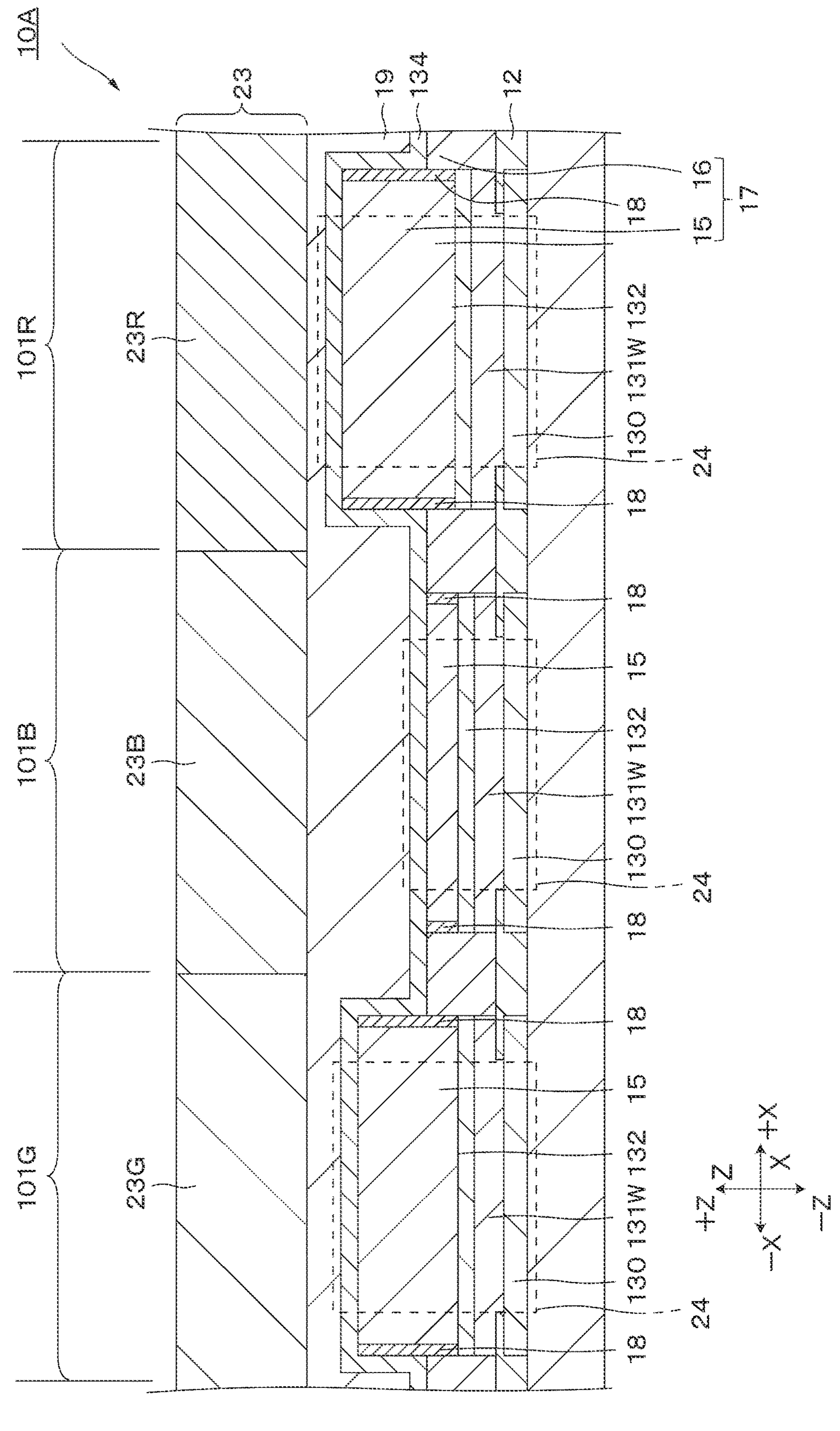
FIG. 9 is a cross-sectional view illustrating a modification example of the display device according to the first embodiment.

As illustrated in FIG. 9, the display device 10A according to the third modification example of the first embodiment may include an organic layer 131W having white as a light emission color regardless of the color type of the sub-pixel 101 (Fourth modification example). In the case of the fourth modification example, the blue light among the light emitted from the organic layer 131W is emphasized in the sub-pixel 101B by the resonator structure 24. Similarly, in the sub-pixel 101G, green light out of light emitted from the organic layer 131W is emphasized. Furthermore, similarly, in the sub-pixel 101R, red light among the light emitted from the organic layer 131W is emphasized. From the viewpoint of further increasing the color purity of the emphasized light, the color filter 23 is preferably formed as illustrated in FIG. 9. The organic layer 131W and the color filter 23 are similar to those in the first modification example.

Fifth Modification Example

Figure 10:
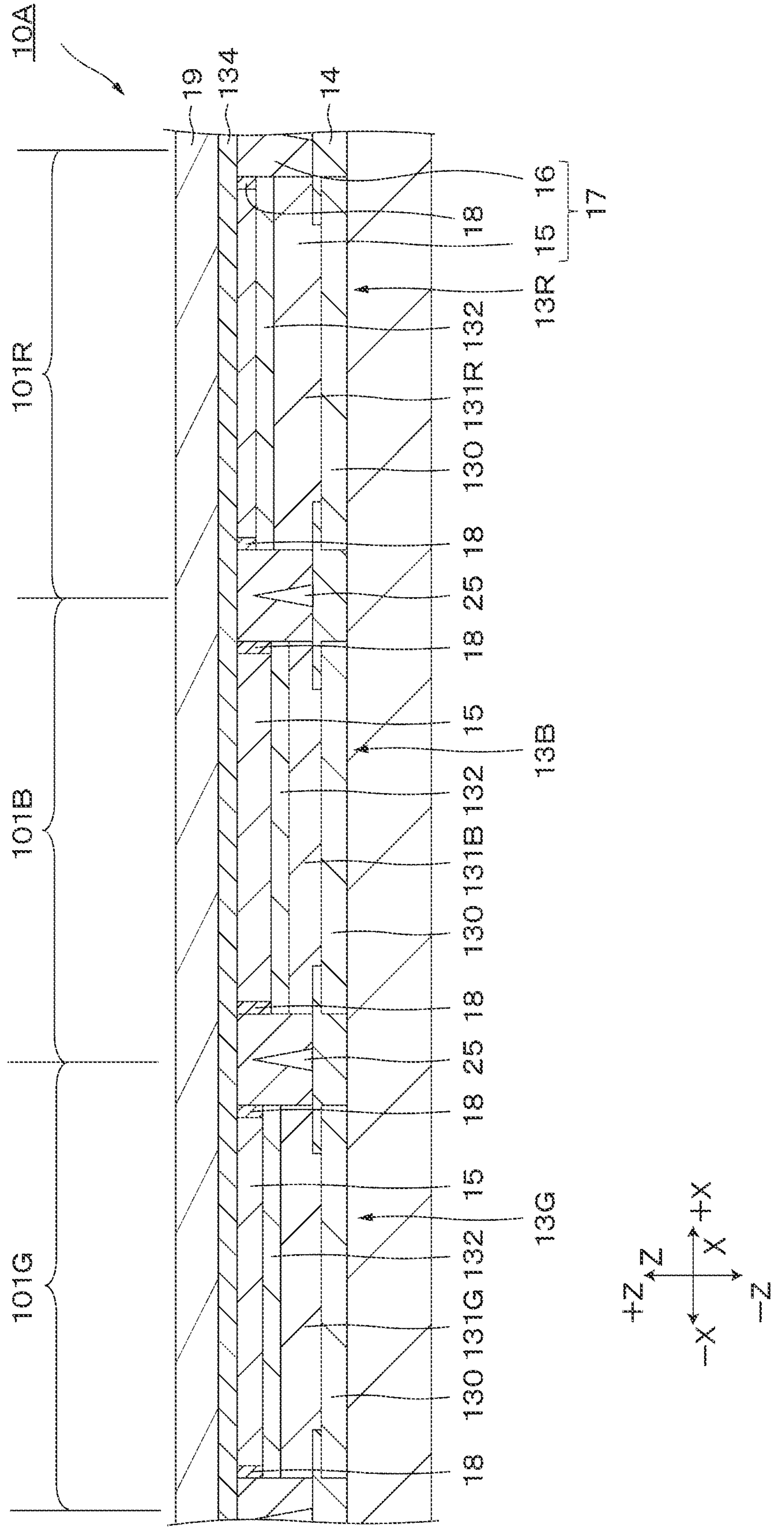
FIG. 10 is a cross-sectional view illustrating a modification example of the display device according to the first embodiment.

In the display device 10A of the first embodiment, as illustrated in FIG. 10, the void portion 25 may be formed in the side wall protective layer 16 formed between the adjacent sub-pixels 101 (between the adjacent light emitting elements 13) (Fifth modification example). In a display device 10A of the fifth modification example illustrated in FIG. 10, the void portion 25 is formed in a tapered shape, but the shape of the void portion 25 is not limited thereto. The void portion 25 can be formed by adjusting a forming condition when the side wall protective layer 16 is formed.

Sixth Modification Example

Figure 11:
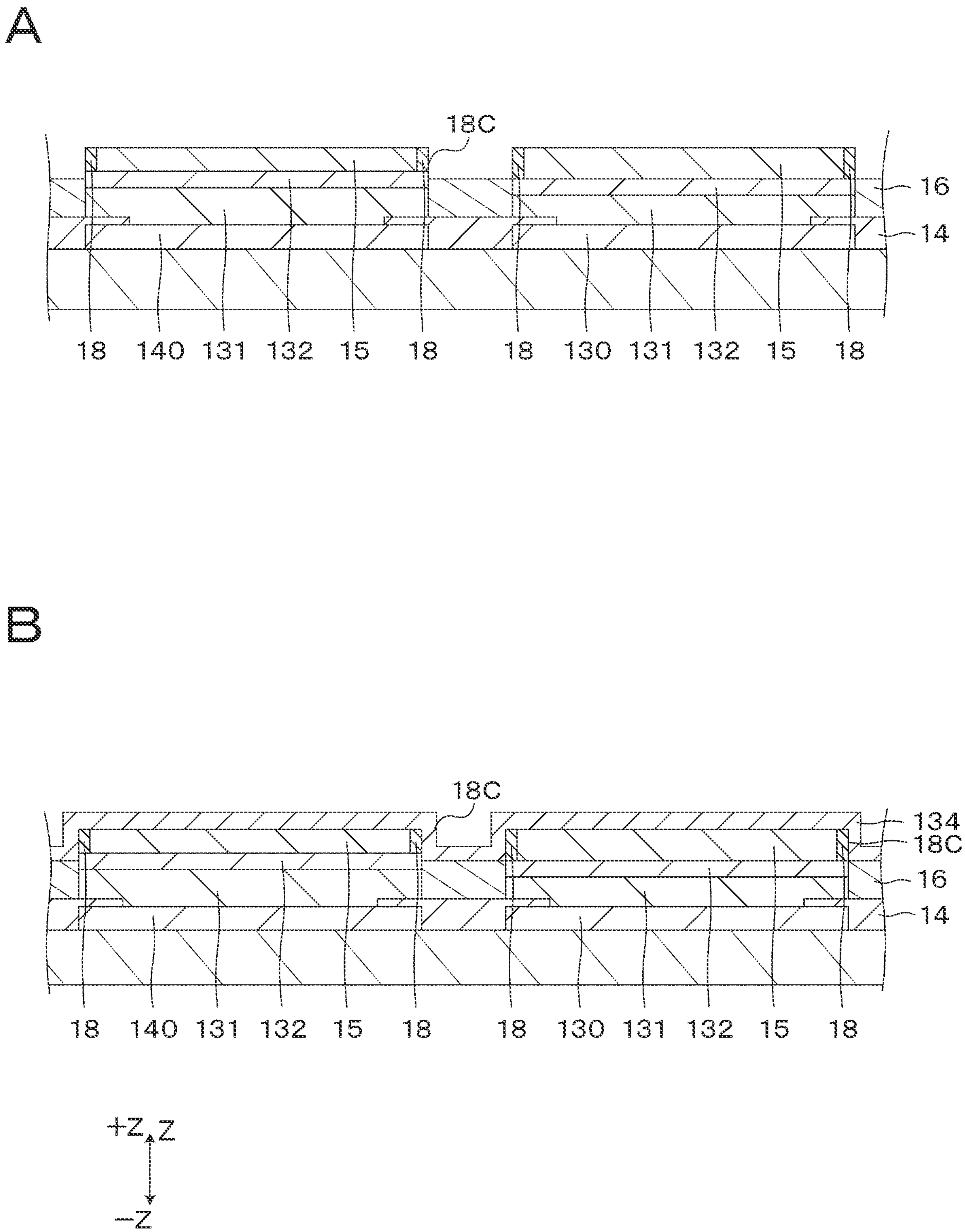
FIGS. 11A and 11B are cross-sectional views for explaining a modification example of the display device according to the first embodiment.

In the display device 10A of the first embodiment, as illustrated in FIG. 11, a side surface 18C (a surface not facing the element protective layer 15) of the connection portion 18 may be connected to the second cathode electrode 134 (Sixth modification example). The display device 10A according to the sixth modification example can be manufactured as follows. The side wall protective layer 16 is formed in a similar manner as described in the method of manufacturing the display device 10A of the first embodiment, and the side wall protective layer 16 is selectively etched. At this time, the side surface 18C of the connection portion 18 is exposed (FIG. 11A). Thereafter, the second cathode electrode 134 is formed (FIG. 11B). As a result, the second cathode electrode 134 is connected to the outer side surface 18C of the connection portion 18. After the formation of the second cathode electrode 134, a similar method to the method of manufacturing the display device 10A of the first embodiment is applied. According to the display device 10A according to the sixth modification example, even if a partial disconnection occurs in the connection portion 18, the first cathode electrode 132 and the second cathode electrode 134 can be connected.

2 Second Embodiment

Figure 12:
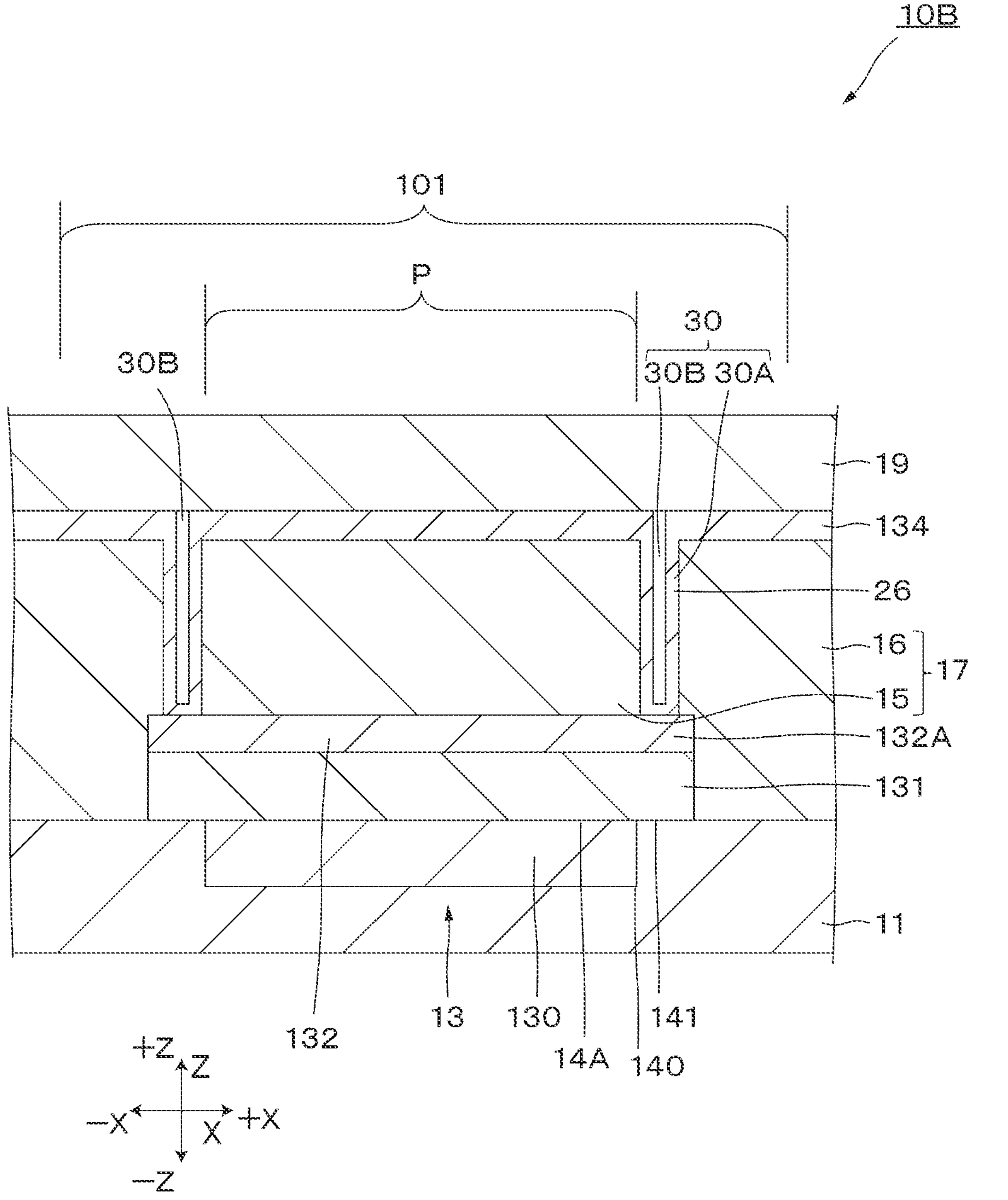
FIG. 12 is a cross-sectional view for explaining an example of a display device according to a second embodiment.
Figure 13:
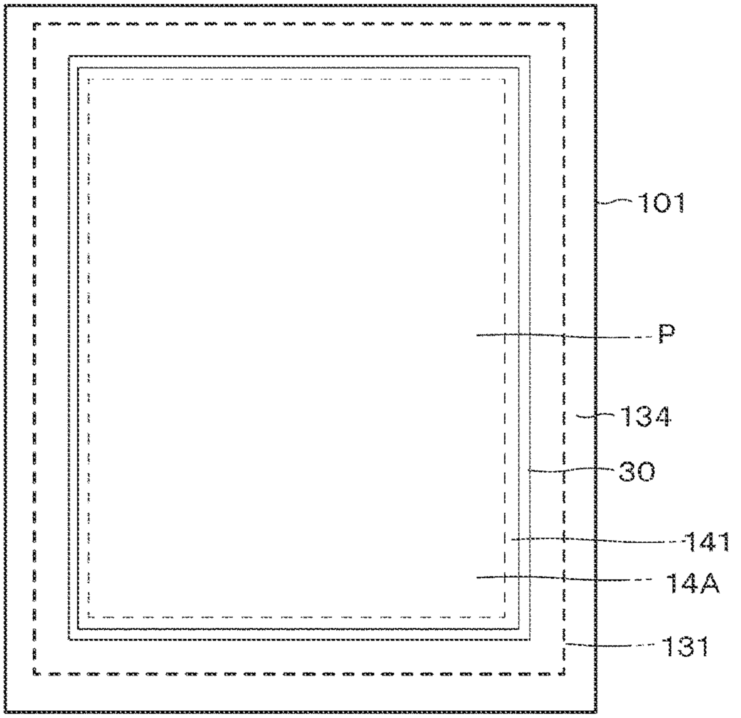
FIGS. 13A and 13B are plan views for explaining an example of the display device according to the second embodiment.
Figure 13:
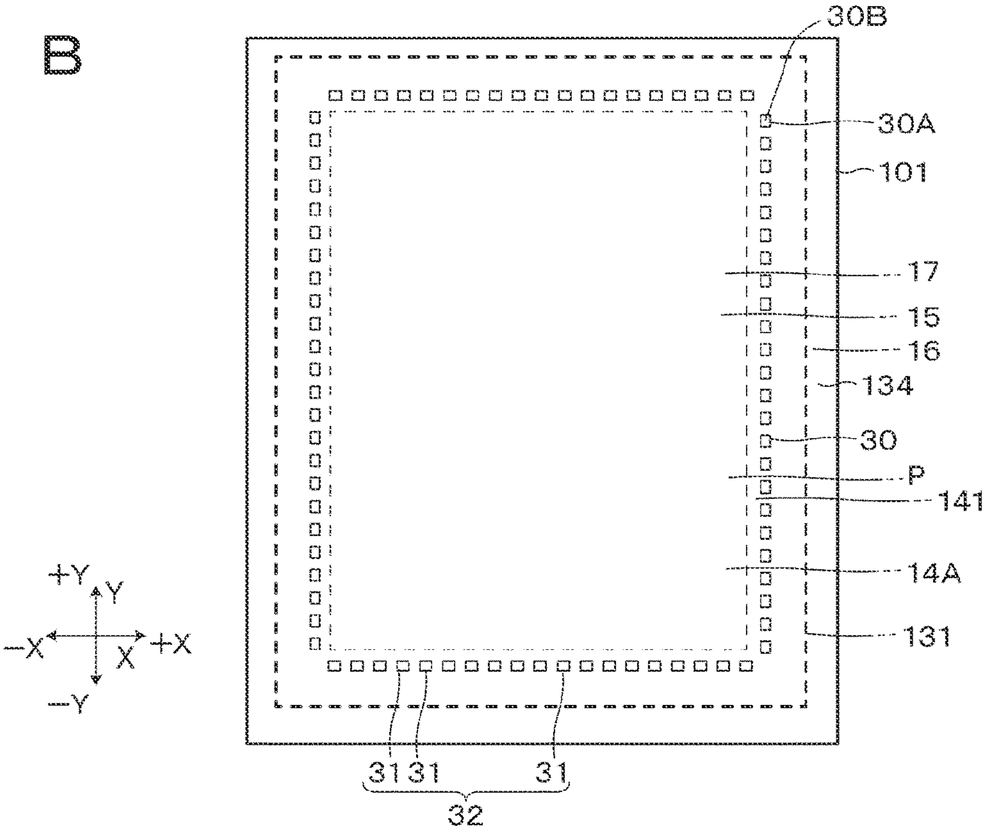
Figure 14:
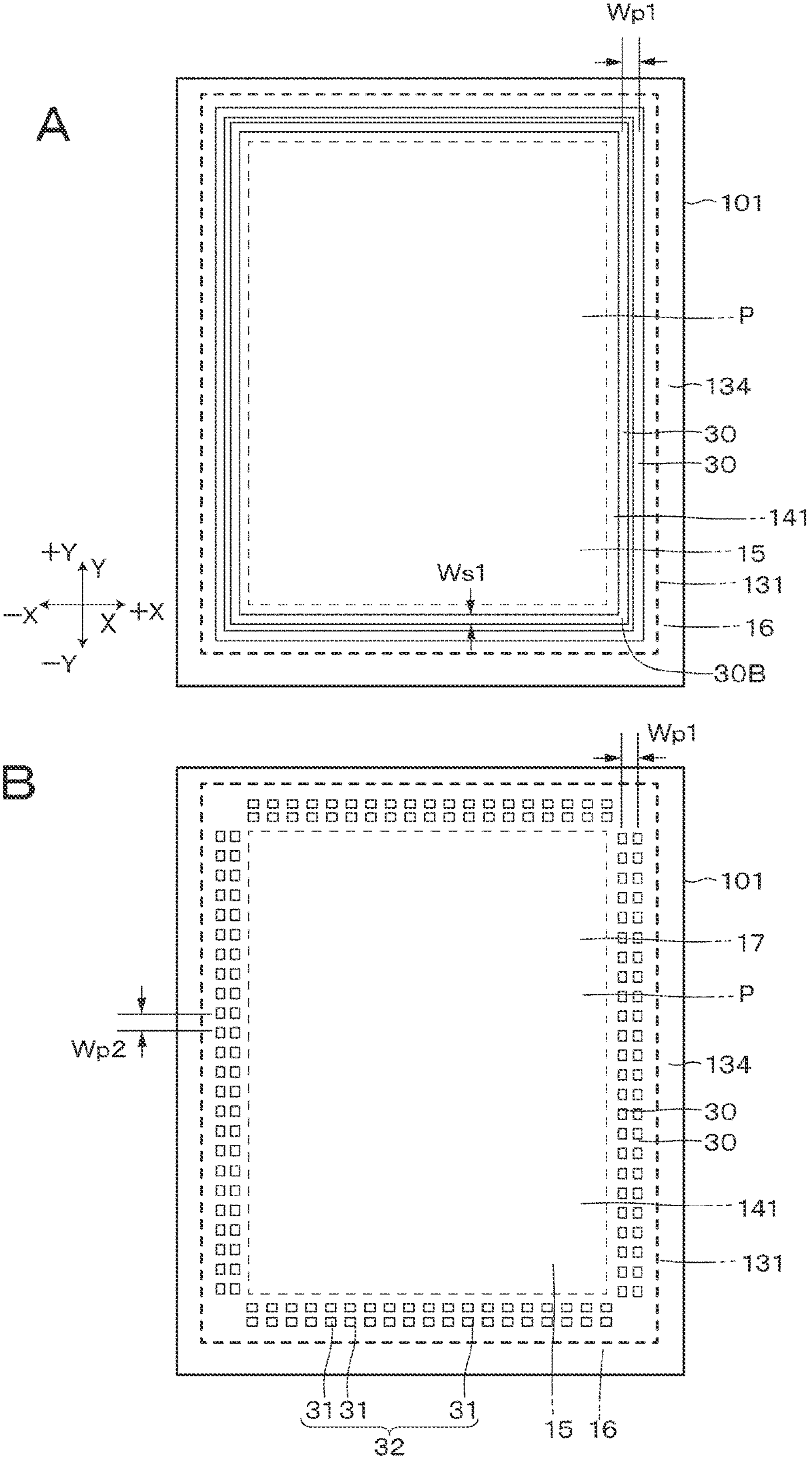
FIGS. 14A and 14B are plan views for explaining a modification example of the display device according to the second embodiment.
Figure 15:
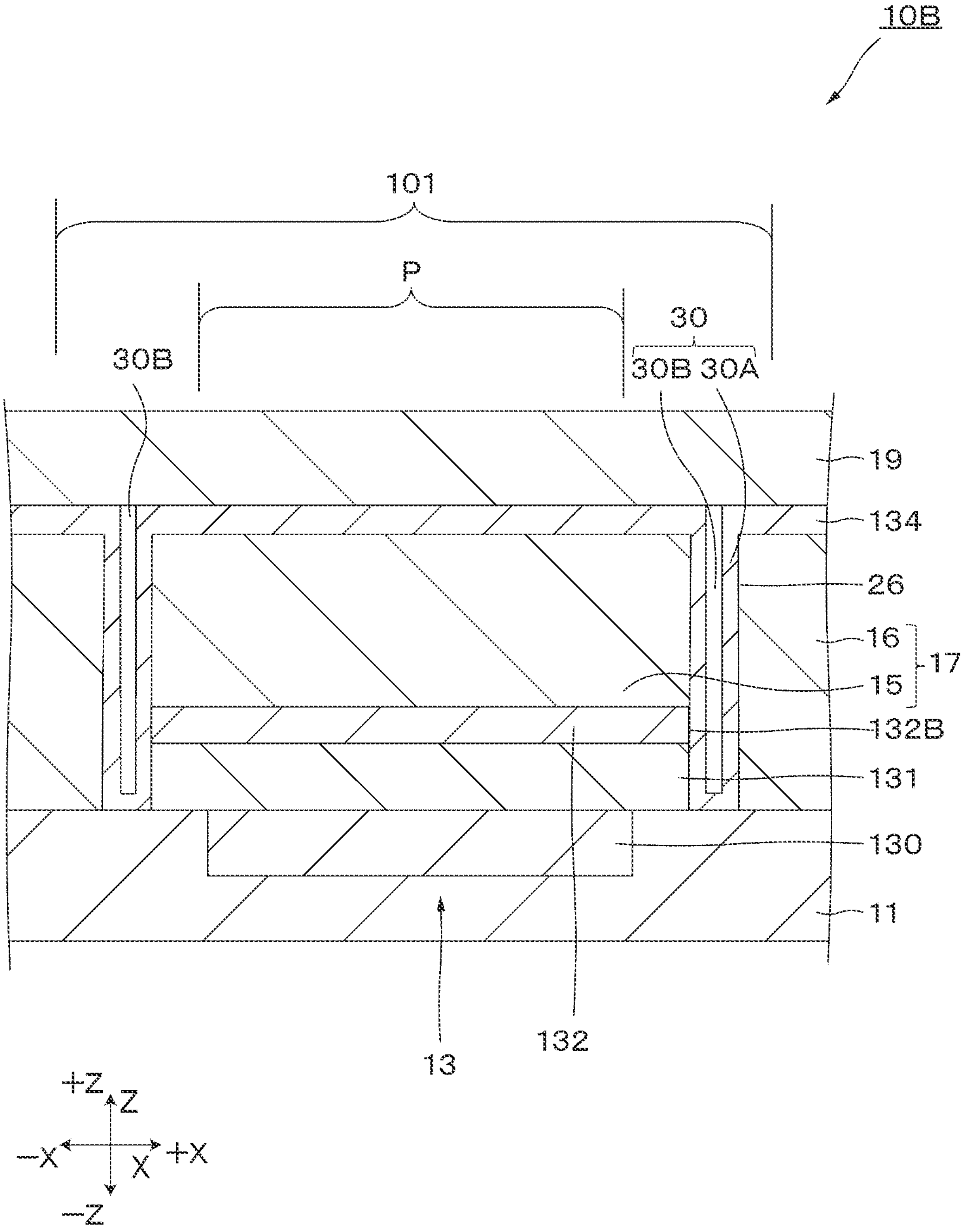
FIG. 15 is a plan view for explaining a modification example of the display device according to the second embodiment.

A display device 10B according to a second embodiment will be described. As illustrated in FIG. 12, the display device 10B includes a plurality of light emitting elements 13 including an anode electrode 130, an organic layer 131, and a first cathode electrode 132, in which the anode electrode 130, the organic layer 131, and the first cathode electrode 132 are separated for each sub-pixel 101, and a second cathode electrode 134. These configurations are similar to those of the display device 10A according to the first embodiment, and thus, the same reference signs are used and description thereof is omitted. The display device 10B is also similar to the first embodiment in that the display device 10B includes the plurality of sub-pixels. Note that these configurations are similar in the third to sixth embodiments. Therefore, similarly to in the second embodiment, the reference numerals used in the first embodiment are used for these configurations in the third to sixth embodiments to be described later, and the description thereof will be omitted.

Furthermore, the display device 10B is provided with an upper protective layer 19, a filling resin layer 20, a counter substrate 21, and a color filter 23 as necessary. Since these configurations are similar to those of the display device 10A according to the first embodiment, description and illustration thereof are omitted. This similarly applies to the third to sixth embodiments as long as these omissions are not particularly described in the modification examples and the like.

In the description of the first embodiment, the sub-pixel 101, the organic layer 131, and the like are collectively described in a case where color types are not particularly distinguished, but this similarly applies to the second to sixth embodiments.

In the second embodiment and third to sixth embodiments as described later, configurations different from those of the first embodiment will be described.

2-1 Configuration of Display Device

The display device 10B according to the second embodiment includes a lower protective layer 17 as a protective layer similarly to the display device 10A according to the first embodiment. In the example of FIG. 12, a plurality of element protective layers 15 each covering a plurality of light emitting elements 13 is provided, and a side wall protective layer 16 is provided between adjacent light emitting elements. In the second embodiment, in a case where the Z-axis direction is the line-of-sight direction, the element protective layer 15 is formed in the light emitting region P of the light emitting element 13 for each sub-pixel 101. In FIG. 12, one of the sub-pixels 101 is extracted to describe the main part. This similarly applies to FIGS. 13 to 15.

(Connection Portion)

As illustrated in FIG. 12, the display device 10B is provided with a connection portion 30 that electrically connects the second cathode electrode 134 and the first cathode electrode 132. The connection portion 30 illustrated in FIG. 12 is an extension portion 26 of the second cathode electrode 134 extending from the second cathode electrode 134 toward the first cathode electrode 132. An end portion of the connection portion 30 (an extending end of the extending portion 26) illustrated in this example is connected to an outer peripheral end portion 132A of the upper surface (first surface) of the first cathode electrode 132.

As illustrated in FIG. 13A, the connection portion 30 is provided at a position around the light emitting region P of the light emitting element 13 so as to surround the light emitting region P in a plan view of the display surface 110A (in a case where the Z-axis direction is a line-of-sight direction). FIG. 13A is a plan view illustrating an example of the second embodiment.

In the connection portion 30 illustrated in the example of FIG. 12, the outer peripheral portion 30A includes a conductive material such as ITO or IZO which can be used as a material for forming the second cathode electrode 134, and the inner portion 30B of the connection portion 30 is a portion having a refractive index different from the refractive index of the element protective layer 15 which is a protective layer. In the example of FIG. 12, the inner portion 30B is a space portion. In this case, the inner portion 30B of the connection portion 30 is a portion having a refractive index lower than the refractive index of the element protective layer 15. Furthermore, at this time, the connection portion 30 has a hollow shape. The space portion forming the inner portion 30B of the connection portion 30 is formed by a continuous space surrounding the light emitting region P as illustrated in FIG. 13A.

The position where the connection portion 30 is formed is not particularly limited, but is preferably formed on the position of the outer periphery 141 of the opening 14A in a case where the Z-axis direction (thickness direction of the light emitting element 13) is defined as the line-of-sight direction. In this case, it is possible to suppress the connection portion 30 from being arranged at a position entering the light emitting region P of the light emitting element 13. The outer periphery 141 of the opening 14A indicates a region in a predetermined outer range from the opening end edge 140.

2-2 Operation and Effect

In this regard, according to the display device 10B according to the second embodiment, since the inner portion 30B of the connection portion 30 is a portion having a refractive index lower than the refractive index of the lower protective layer 17 (element protective layer 15), the connection portion 30 can totally reflect light emitted from the organic layer 131 in an oblique direction, leakage of light to the adjacent sub-pixel 101 can be reduced, and utilization efficiency of light can be enhanced.

Furthermore, the connection portion 30 is provided so as to surround the periphery of the light emitting region P. As a result, as a connection structure between the first cathode electrode 132 and the second cathode electrode 134, an equivalent structure is formed at any position surrounding the light emitting surface (an equivalent structure is formed in all directions), variations in viewing angle characteristics can be suppressed, and the reliability of the light emitting state of the display device 10B can be improved.

According to the display device 10B according to the second embodiment, the first cathode electrode 132 and the organic layer 131 are covered with the lower protective layer 17 such as the element protective layer 15, and it is possible to suppress deterioration of the organic layer 131 at the time of forming the second cathode electrode 134.

2-3 Modification Example

Next, a modification example of the display device 10B according to the second embodiment will be described.

First Modification Example

In the display device 10B according to the second embodiment, as illustrated in FIG. 14A, a plurality of the connection portions 30 may be arranged to be separated from each other in a direction from the center of each sub-pixel 101 toward the outside (direction from the center of the element protective layer 15 toward the outside) with the Z-axis direction as the line-of-sight direction (modified example 1). In this case, the interval Wp1 between the adjacent connection portions 30 is preferably set to a value that is equal to or less than the peak wavelength of the light emitted from the light emitting element 13 for each sub-pixel 101, and more preferably set to a value that is equal to or less than ½ of the peak wavelength. Furthermore, the width Ws1 of the inner portion 30B is preferably equal to or less than the peak wavelength, and more preferably equal to or less than ½ of the peak wavelength.

In such a display device 10B according to the first modification example of the second embodiment, in the plurality of arranged connection portions 30, the member forming the side wall protective layer 16 and the inner portion 30B of the connection portion 30 are periodically and repeatedly arranged in the direction from the center of the element protective layer 15 toward the outside at a cycle shorter than the peak wavelength of the emission light. Therefore, in the display device 10B, since a portion in which the refractive index periodically changes at the wavelength level of the emission light is formed around the light emitting surface of the light emitting element 13 for each sub-pixel 101, the emission light in the oblique direction hardly leaks out from the position of the connection portion 30.

Second Modification Example

In the display device 10B according to the second embodiment, the inner portion 30B of the connection portion 30 is formed so as to surround the light emitting region P in a continuous space portion, but the connection portion 30 is not limited thereto. For example, the connection portion 30 may include vias 31 formed in the lower protective layer 17 as illustrated in FIG. 13B, and a via column 32 in which a plurality of vias 31 is arranged may be formed.

(Lower Protective Layer)

In the second modification example of the second embodiment, the element protective layer 15 and the side wall protective layer 16 are connected (continuous) between the adjacent vias 31, and in the example of FIG. 13B, the lower protective layer 17 is continuously integrated. In the second modification example second embodiment, the peripheral surface of each via 31 is surrounded by the lower protective layer 17, (Via)

In the present specification, the via 31 is assumed to be a porous structure having conductivity. The via 31 shown in the second modification example of the second embodiment has a hole-like structure extending from the second cathode electrode 134 side to the first cathode electrode 132. The via 31 has a structure in which the second cathode electrode 134 is extended along the inner peripheral surface and the bottom surface (first surface of the first cathode electrode 132) of the hole formed in the lower protective layer 17. Therefore, in a case where the connection portion 30 is formed by the via 31, the outer peripheral portion 30A is formed by the second cathode electrode 134. The inside of the via 31 forming the inner portion 30B of the connection portion 30 is a portion having a refractive index lower than the refractive index of the lower protective layer 17. Specifically, in the example of FIG. 13B, the via 31 has a hollow shape. Therefore, in a case where the connection portion 30 includes the via 31, the inner portion 30B is a space portion. Note that the three-dimensional shape of the via 31 is not particularly limited, and may be, for example, a cylindrical shape or a prismatic shape. However, a case where the inside of the via 31 is hollow is an example, and the inside of the via 31 may be filled with a material having a refractive index lower than that of the lower protective layer 17. In this case, the inner portion 30B includes a material having a low refractive index.

(Via Column)

The plurality of vias 31 is arranged so as to surround the light emitting region P of the light emitting element 13, and form a via column 32. The connection portion 30 includes via columns 32.

According to the display device 10B according to the second modification example of the second embodiment, the via 31 to be the connection portion 30 is provided so as to surround the periphery of the light emitting surface of the light emitting element 13, whereby the via column 32 is formed. As a result, an equivalent structure is formed at any position surrounding the light emitting surface (an equivalent structure is formed in all directions), and variations in viewing angle characteristics can be suppressed.

Furthermore, in the display device 10B, since the via column 32 is formed, even if disconnection occurs in the predetermined via 31 or a contact failure occurs between a part of the via 31 and the first cathode electrode 132, the connection between the first cathode electrode 132 and the second cathode electrode 134 can be secured in the other via 31, and the reliability of the display device 10B can be improved.

Third Modification Example

In the display device 10B according to the second modification example of the second embodiment, a plurality of via columns 32 forming the connection portion 30 may be arranged at intervals in a direction from the center of each sub-pixel 101 toward the outside (direction away from the light emitting element 13) with the Z-axis direction as the line-of-sight direction (the third modification example).

In the third modification example of the second embodiment, the interval Wp1 between the adjacent connection portions 30 (the interval between the adjacent via columns 32) is preferably set to a value that is equal to or less than the peak wavelength of the emission light of the light emitting element 13 for each sub-pixel 101, and more preferably set to a value that is ½ or less of the peak wavelength.

For each of the light emitting elements 13 constituting the plurality of light emitting elements 13, the pitch of the plurality of vias surrounding the light emitting region P of each of the light emitting elements 13 is preferably smaller than the peak wavelength corresponding to the light emitted from each of the light emitting elements 13. That is, as a specific example, in the light emitting element 13R among the light emitting elements 13R, 13G, and 13B, for example, the pitch of the vias 31 arranged around the light emitting region P of the light emitting element 13R is preferably smaller than the peak wavelength of the red light which is the emission light from the light emitting element 13R. In the via column 32, the interval Wp2 (pitch) between the adjacent vias 31 is preferably set to a value that is equal to or less than the peak wavelength of the emission light of the light emitting element 13 for each sub-pixel 101, and more preferably set to a value that is equal to or less than ½ of the peak wavelength. Furthermore, the width of the space portion formed inside each via 31 is preferably equal to or less than the peak wavelength, and more preferably equal to or less than ½ of the peak wavelength.

The peak wavelength of the emission light of the light emitting element 13 varies depending on the color type of the sub-pixel 101. In view of this point, in a case where the display device 10B includes the plurality of sub-pixels 101 corresponding to the plurality of color types, and the connection portion 30 is provided for each sub-pixel 101, it is preferable that the pitch of the adjacent vias 31 forming the via column 32 be different according to the color type of the sub-pixel 101.

In such a display device 10B according to the third modification example of the second embodiment, the connection portion 30 is configured such that the vias 31 and the material forming the lower protective layer 17 are periodically and repeatedly arranged in a period smaller than the peak wavelength of the emission light in both the alignment direction of the vias 31 in the via column 32 and the arrangement direction of the plurality of via columns 32. In this case, in the display device 10B, since a portion in which the refractive index periodically changes at the wavelength level of the emission light is formed around the light emitting region P of the light emitting element 13 for each sub-pixel 101, the emission light in the oblique direction hardly leaks out from the position of the connection portion 30. Therefore, according to the display device 10B according to the third modification example of the second embodiment, light leakage can be more effectively suppressed, and light utilization efficiency can be improved.

Fourth Modification Example

In the display device 10B according to the second embodiment, the connection portion 30 is not limited to the case of being connected to the outer peripheral end portion 132A of the upper surface of the first cathode electrode 132, and may be connected at the position of the side wall 132B of the first cathode electrode 132.

3 Third Embodiment

3-1 Configuration of Display Device

Figure 16:
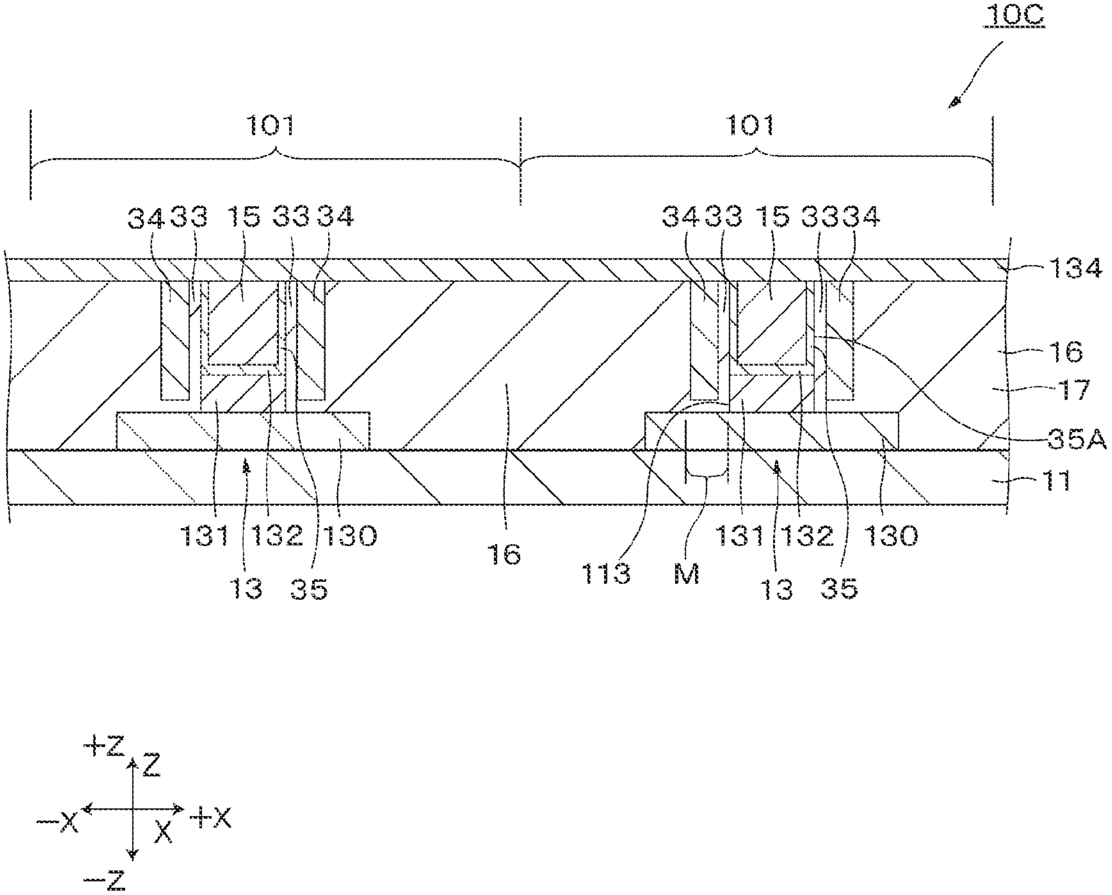
FIG. 16 is a cross-sectional view for explaining an example of a display device according to a third embodiment.
Figure 17:
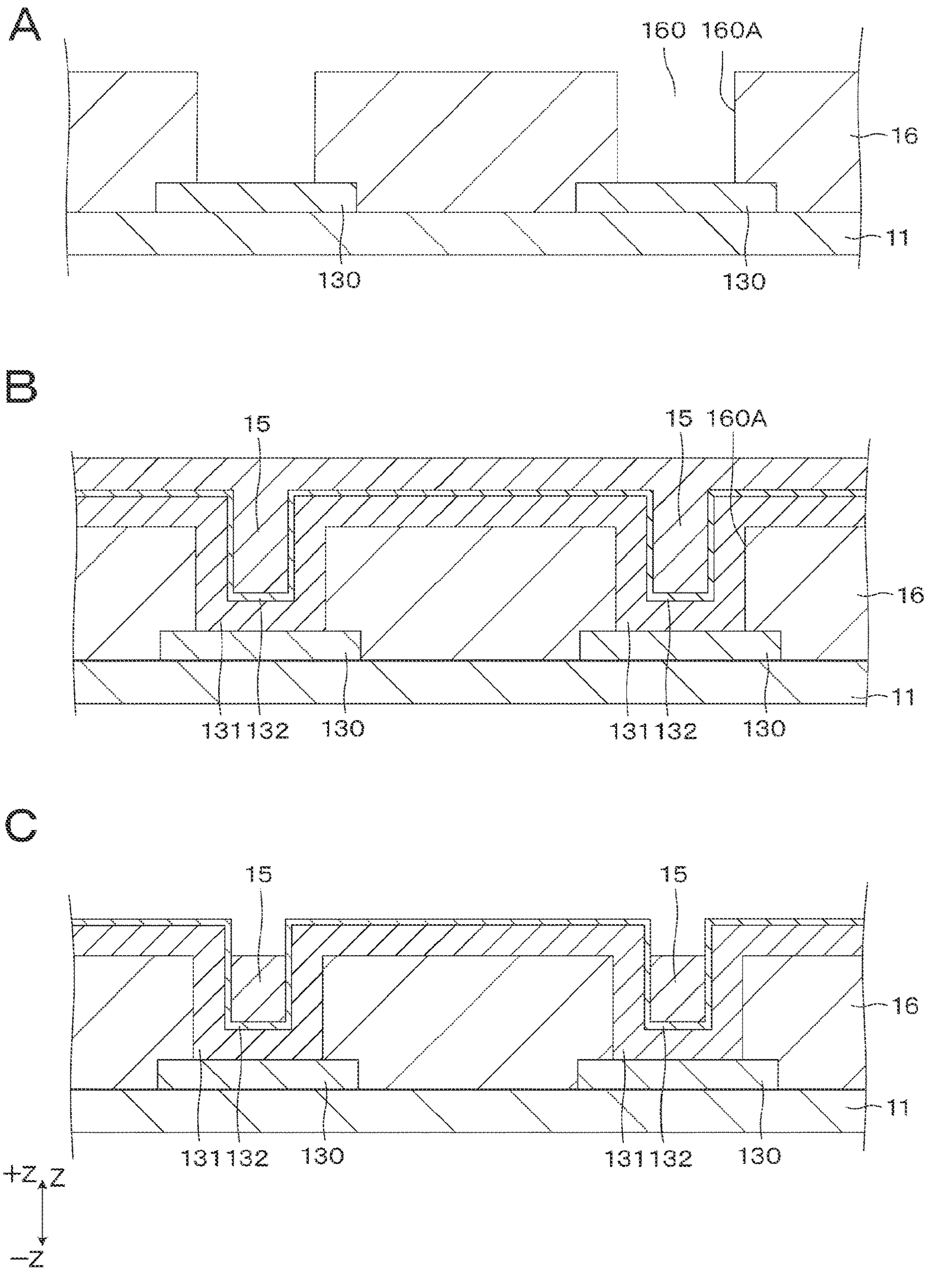
FIGS. 17A to 17C are cross-sectional views for explaining an example of a method of manufacturing the display device according to the third embodiment.
Figure 18:
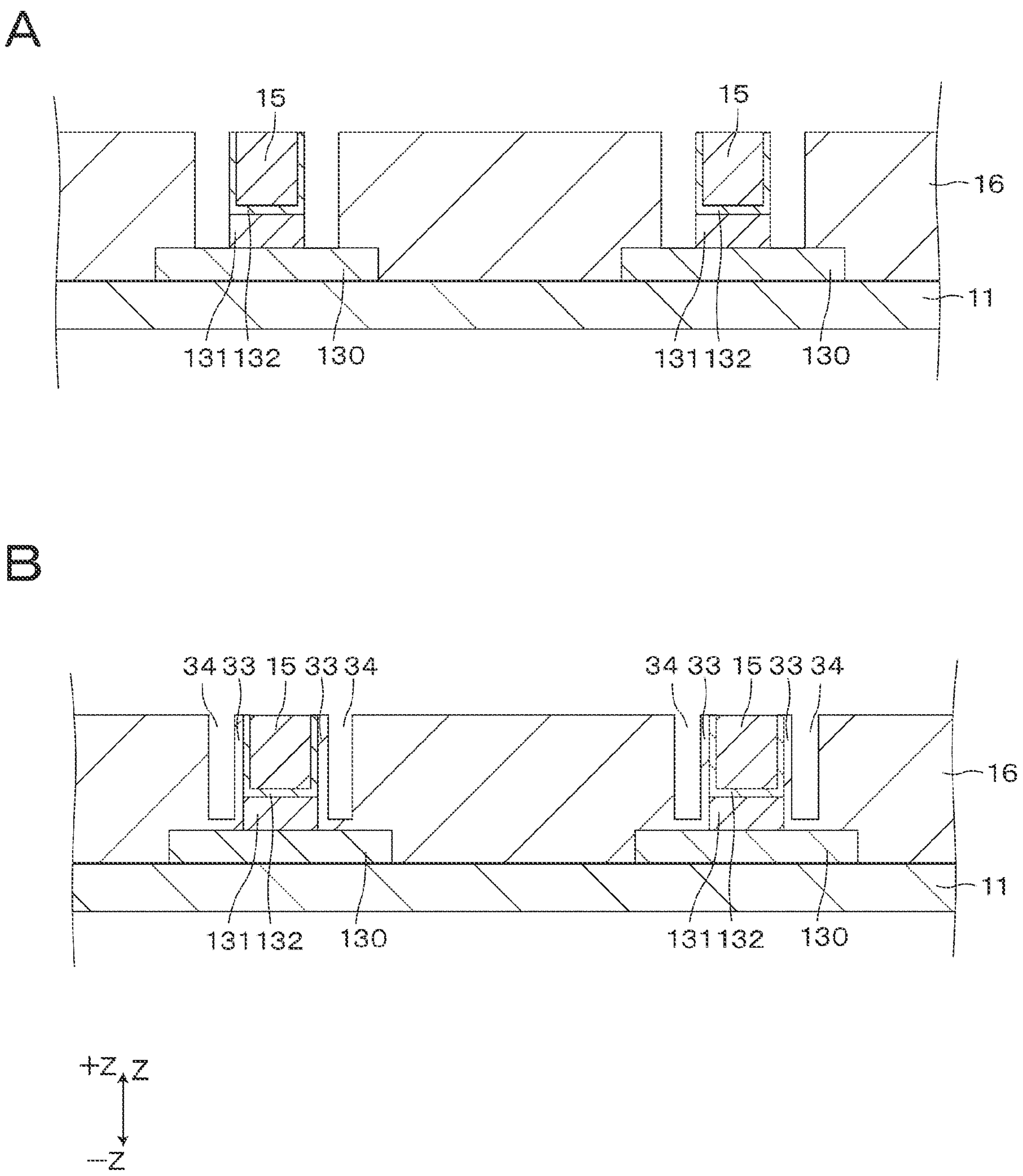
FIGS. 18A and 18B are cross-sectional views for explaining an example of the method of manufacturing the display device according to the third embodiment.

A display device 10C according to a third embodiment will be described. In the display device 10C according to the third embodiment, as illustrated in FIG. 16, similarly to the display device 10A according to the first embodiment, a side wall protective layer 16 (also serving as a lower protective layer 17) is formed as a protective layer between the adjacent sub-pixels 101. FIG. 16 is a cross-sectional view illustrating an example of a display device according to a third embodiment; Note that, in the display device 10C according to the third embodiment exemplified in FIG. 16, unlike the first embodiment, the insulating layer 14 between the adjacent anode electrodes 130 is omitted, but the insulating layer 14 may be provided.

Furthermore, in the display device 10C according to the third embodiment, as illustrated in FIG. 16, in the side wall protective layer 16, a first refractive index portion 33 and a second refractive index portion 34 are formed in side regions of the respective light emitting elements 13. The first refractive index portion 33 and the second refractive index portion 34 are arranged in this order in a direction from the side closer to the light emitting element 13 toward the outside of the light emitting element 13 (direction away from the light emitting element 13) for each sub-pixel 101. The side region M of the light emitting element 13 indicates a range from the position of the side wall 113 of the light emitting element 13 to a predetermined position outward.

(First Refractive Index Portion)

In the example of FIG. 16, the first refractive index portion 33 is formed as a layer that covers a side surface 35A of a connection portion 35 and a side wall of the organic layer 131 as described later. Since the first refractive index portion 33 covers the side surface 35A of the connection portion 35 and the side wall of the organic layer 131 in this manner, entry of moisture and the like from the external environment to the organic layer 131 side is suppressed, and deterioration of the organic layer 131 is suppressed. The first refractive index portion 33 includes a material constituting the side wall protective layer 16 described in the first embodiment.

(Second Refractive Index Portion)

The second refractive index portion 34 has a refractive index lower than that of the first refractive index portion 33. The second refractive index portion 34 is preferably a space portion. The space portion may be a portion filled with air, rare gas, or the like, but is preferably a vacuum portion from the viewpoint of lowering the refractive index of the second refractive index portion 34. The second refractive index portion 34 is formed in a space extending along the thickness direction of the light emitting element 13 in a direction from the drive substrate 11 side toward the light emitting element 13.

(Connection Portion)

As illustrated in FIG. 16, the display device 10C is provided with the connection portion 35 that electrically connects the second cathode electrode 134 and the first cathode electrode 132. The connection portion 35 illustrated in FIG. 16 is a standing wall portion erected toward the second cathode electrode 134 with the outer edge of the first cathode electrode 132 as a base end, and forms a part of the first cathode electrode 132. In addition, the tip (upper end) of the connection portion 35 illustrated in this example is electrically connected to the lower surface (second surface) of the second cathode electrode 134.

3-2 Method of Manufacturing Display Device

A method of manufacturing the display device 10C according to the third embodiment will be described. Here, a method of manufacturing the display device 10C illustrated in the drawing will be described. However, a case where the second refractive index portion 34 is a space portion is taken as an example.

After the anode electrode 130 separated for each sub-pixel 101 is formed on the first surface of the drive substrate 11, the side wall protective layer 16 is formed on the entire surface of the first surface by a PCVD method (Plasma CVD (plasma-enhanced chemical vapor deposition) method) (for example, a layer is formed with a thickness of 2000 nm), and the opening 160 is formed for each sub-pixel 101 by using a lithography method or the like (FIG. 17A). At this time, the first surface of the anode electrode 130 is exposed from the opening 160. The above-described formation of the side wall protective layer 16 can be realized, for example, by forming a PSiO film (plasma silicon oxide film) by a PCVD method.

Next, the organic layer 131 (for example, a layer having a thickness of about 1000 nm) is formed along the surface on the first surface side by using a vapor deposition method or the like, and the first cathode electrode 132 is further formed. The formation of the first cathode electrode 132 can be realized by forming an IZO film (for example, a film having a thickness of about 50 nm) on the first surface side using, for example, a reactive sputtering method or the like. At this time, the organic layer 131 and the first cathode electrode 132 are also formed on the side surface portion 160A formed in the opening 160 of the side wall protective layer 16.

Thereafter, the element protective layer 15 is formed on the first surface side (FIG. 17B). Formation of the element protective layer 15 is realized by forming a PSiN film (for example, a film having a thickness of about 2000 nm) or the like using, for example, a low-temperature PCVD method or the like.

As illustrated in FIG. 17C, dry etching is performed to remove the element protective layer 15 above the upper surface position of the side wall protective layer 16. The position of the upper surface of the side wall protective layer 16 and the position of the upper surface of the element protective layer 15 are preferably approximately the same, but may not be completely the same.

Further, as illustrated in FIG. 18A, both the organic layer 131 and the first cathode electrode 132 are removed by using a dry etching method in a portion of the organic layer 131 and the first cathode electrode 132 exposed above the upper surface position of the side wall protective layer 16. This can be achieved by selecting conditions such as etching gas. Then, the organic layer 131 formed along the side surface portion 160A formed in the opening 160 of the side wall protective layer 16 is removed by using a dry etching method. This can also be realized by selecting conditions such as an etching gas.

Next, the side wall protective layer 16 is further formed on the first surface side using a low-temperature PCVD method or the like. The thickness of a portion of the side wall protective layer 16 further additionally formed in this step is, for example, about 50 nm. Then, the end surface of the connection portion 35 exposed to the first surface side and the side wall protective layer 16 formed on the element protective layer 15 are removed by a dry etching method or the like. At this time, the side wall protective layer 16 is formed so as to cover the portion of the first cathode electrode 132 to be the connection portion 35 (FIG. 18B). With the thickness direction of the light emitting element 13 as the line-of-sight direction, a portion of the side wall protective layer 16 formed at the position of the side region M of the light emitting element 13 forms the first refractive index portion 33. Furthermore, at this time, the side end surface of the organic layer 131 is also covered with the side wall protective layer 16, and a space portion directed toward the first surface side is formed at the position of the side region M of the light emitting element 13 as the thickness direction line-of-sight direction of the light emitting element 13. This space portion becomes the second refractive index portion 34.

Then, as illustrated in FIG. 16, one surface of the second cathode electrode 134 is formed on the first surface side by using a sputtering method or the like. This can be realized, for example, by sputtering using a material of the second cathode electrode 134 such as IZO. The second cathode electrode 134 may have a thickness of about 100 nm. Note that it is possible to avoid formation of the second cathode electrode 134 in the space portion to be the second refractive index portion 34 depending on the conditions of the sputtering method using the material of the second cathode electrode 134.

After the formation of the second cathode electrode 134, the display device 10C can be obtained in a similar manner to the method of manufacturing the display device described in the first embodiment.

In the above description of the manufacturing method, the second refractive index portion 34 is a space portion, but may be filled with another material instead of the space portion. For example, the side wall protective layer 16 (and the first refractive index portion 33) may be silicon nitride, and the second refractive index portion 34 may be a silicon oxide film.

3-3 Operation and Effect

In this regard, in the display device 10C according to the third embodiment, the first refractive index portion 33 and the second refractive index portion 34 having different refractive indexes are formed in the side wall protective layer 16 at the position of the side portion of the light emitting element 13 for each sub-pixel 101. Since the first refractive index portion 33 and the second refractive index portion 34 can be formed on the side portion of the light emitting element 13 so as to surround the light emitting element 13, total reflection can be generated. Furthermore, in the display device 10C according to the third embodiment, since the structure of the connection portion 35 connecting the second cathode electrode 134 and the first cathode electrode 132 can also be formed so as to surround the light emitting element 13, structural variations are less likely to occur in all directions.

As a display device using an organic EL element, in a display device having a structure in which an organic layer including at least an organic light emitting layer and a first cathode electrode are laminated on an anode electrode formed separately for each pixel, the first cathode electrode is separated for each sub-pixel. For this reason, a display device in which a second cathode electrode is connected on a first cathode electrode has been proposed. In such a display device, structural variation (asymmetry) may occur at a structurally connected portion and other portions. In the display device 10C as described above, the reliability of the light emission state can be improved by eliminating the structural variation and improving the light use efficiency.

3-4 Modification Example

First Modification Example (Configuration of Display Device of First Modification Example)

Figure 19:
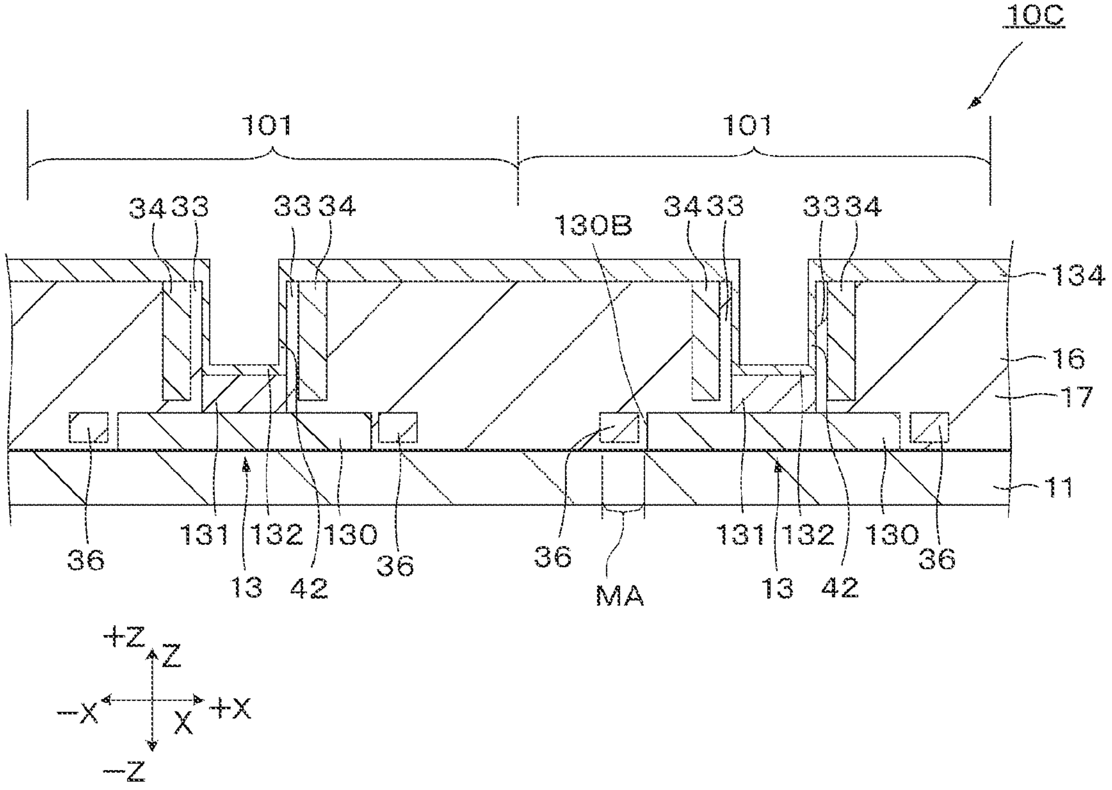
FIG. 19 is a cross-sectional view for explaining a modification example of the display device according to the third embodiment.
Figure 20:
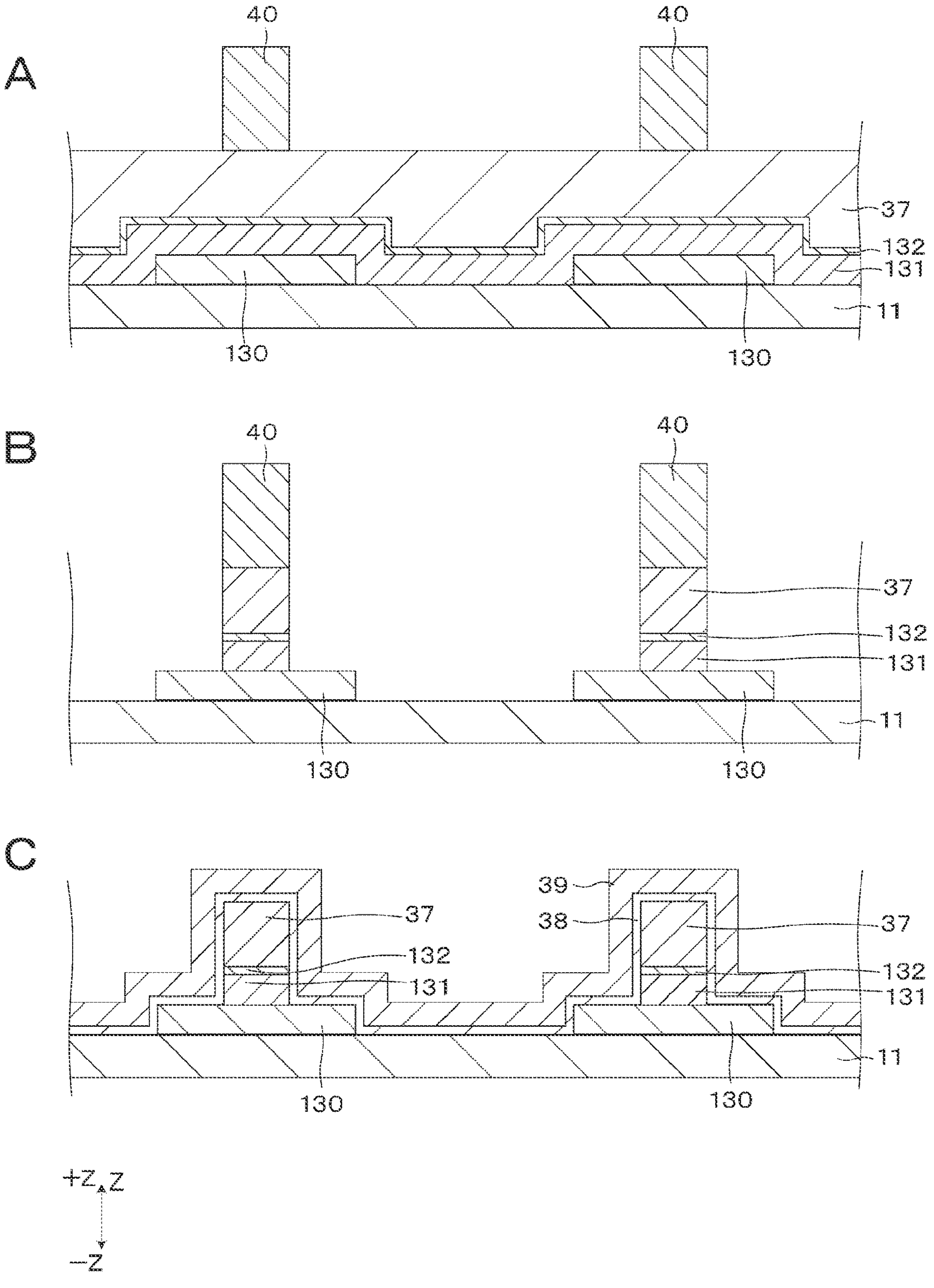
FIGS. 20A to 20C are cross-sectional views for explaining a manufacturing method of a modification example of the display device according to the third embodiment.
Figure 21:
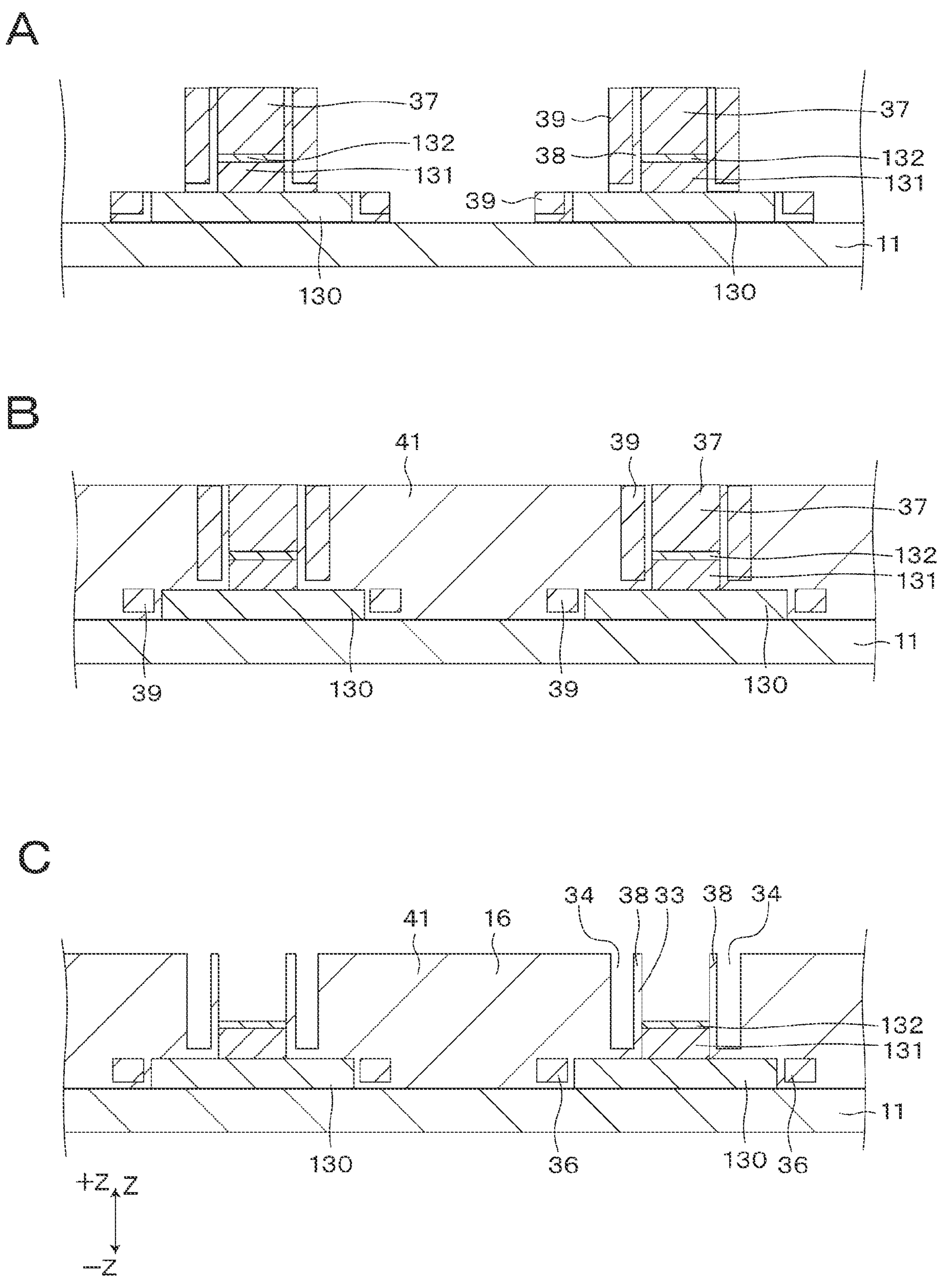
FIGS. 21A to 21C are cross-sectional views for explaining a manufacturing method of a modification example of the display device according to the third embodiment.
Figure 22:
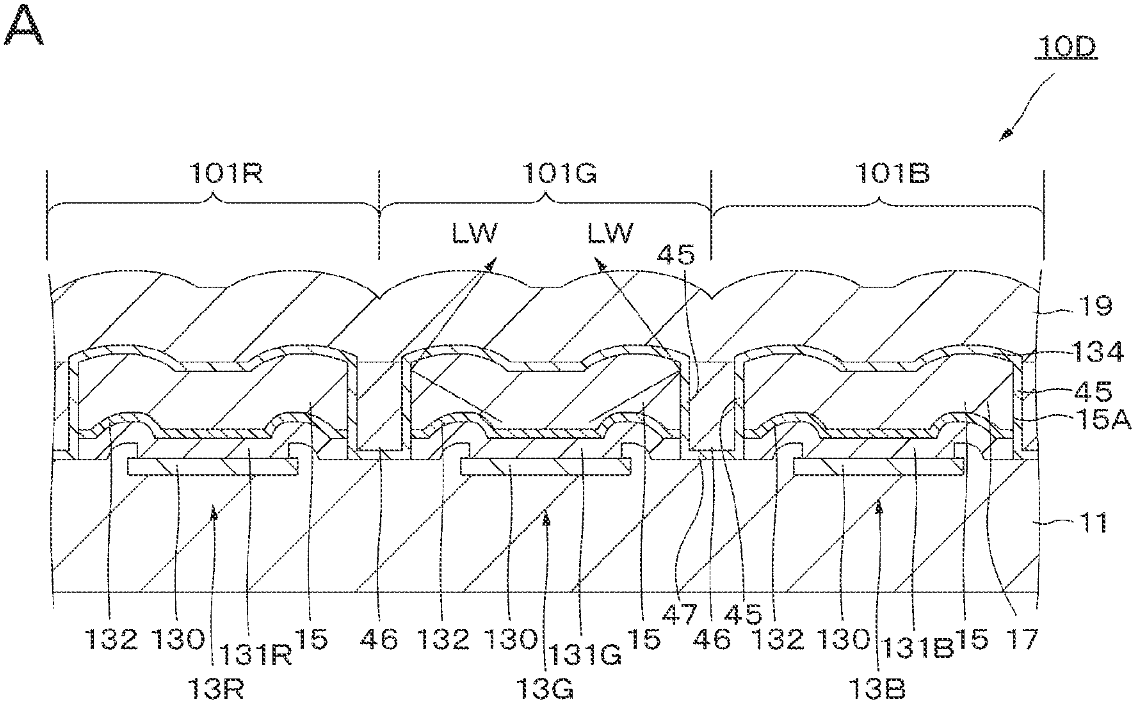
FIGS. 22A and 22B are cross-sectional views for explaining an example of a display device according to a fourth embodiment.
Figure 22:
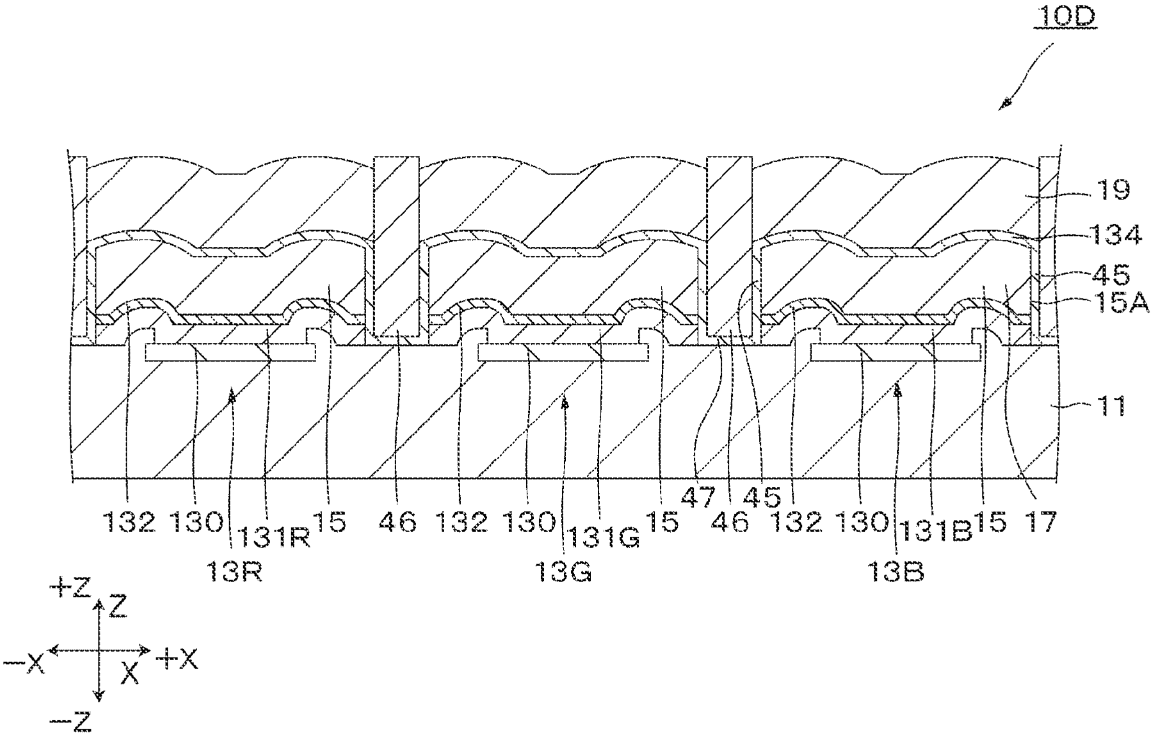
Figure 23:
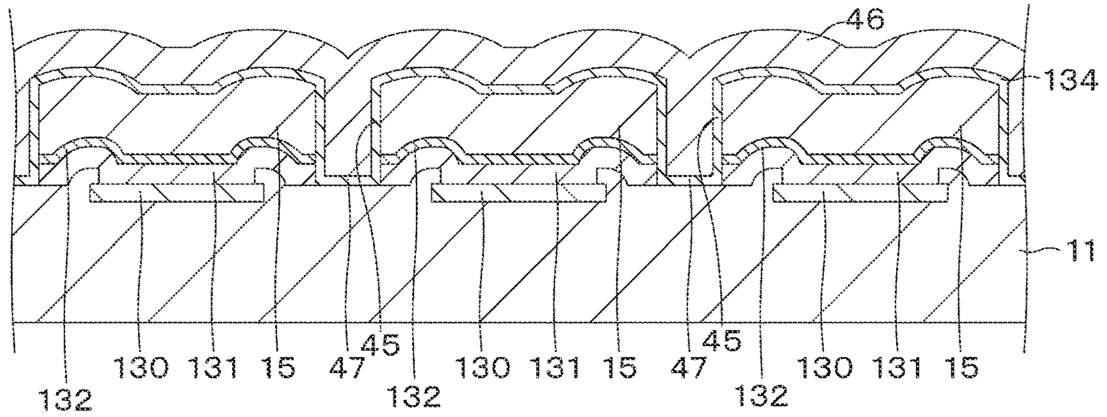
FIGS. 23A and 23B are cross-sectional views for explaining a method of manufacturing the display device according to the fourth embodiment.
Figure 23:
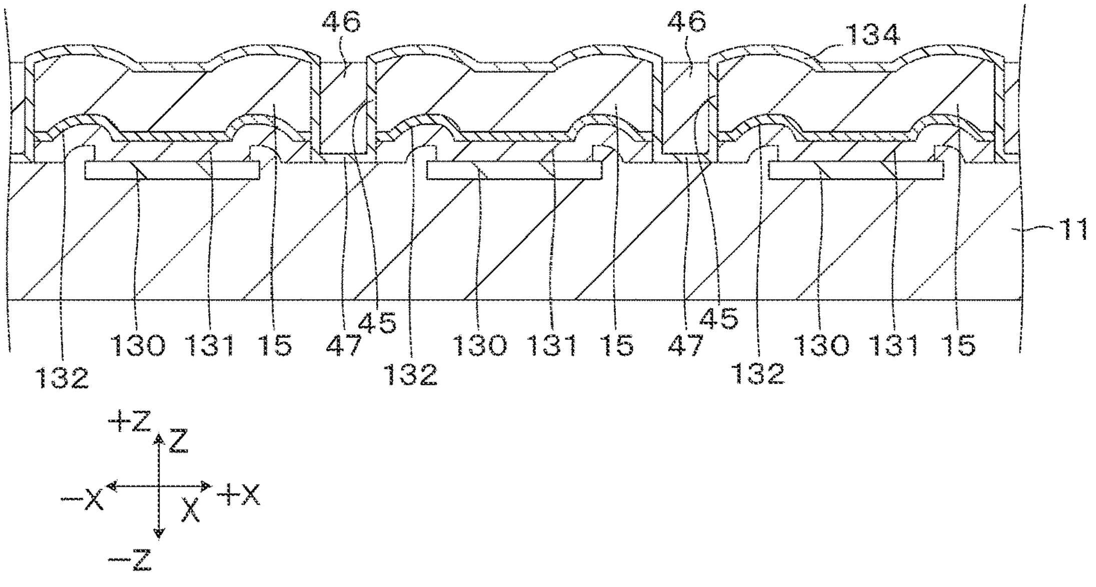

Next, a modification example of the display device 10C according to the third embodiment will be described. In the display device 10C according to the third embodiment, the second cathode electrode 134 is provided on the element protective layer 15 in the lower protective layer 17, but as illustrated in FIG. 19, the element protective layer 15 may be omitted (the first modification example). Moreover, in the display device 10C according to the third embodiment described above, the connection portion 35 is formed in a part of the first cathode electrode 132, but in the display device 10C according to the first modification example illustrated in FIG. 19, the connection portion 35 is formed in the second cathode electrode 134. Specifically, the second cathode electrode 134 is formed along the side wall protective layer 16 as a protective layer, and forms a dropping portion 42 at a position corresponding to each sub-pixel 101 along a wall surface of the side wall protective layer 16, and a lower end portion of the dropping portion 42 is connected to the first cathode electrode. Therefore, the connection portion 35 is formed at a portion corresponding to the dropping portion 42. Furthermore, in the example of the display device 10C according to the first modification example of the third embodiment illustrated in FIG. 19, the third refractive index portion 36 is formed in the side region MA of the anode electrode 130 for each sub-pixel 101. Side region MA of anode electrode 130 indicates a range from a position of side wall 130B of anode electrode 130 to a predetermined position outward.

(Method of Manufacturing Display Device of First Modification Example)

A method of manufacturing the display device 10C will be described particularly with an example in which the second refractive index portion 34 is a space portion. After the anode electrode 130 separated for each sub-pixel 101 is formed on the first surface of the drive substrate 11, the organic layer 131 is formed with a predetermined thickness (specifically, for example, the thickness is about 1000 nm.) using a vacuum deposition method or the like. Moreover, the first cathode electrode 132 is formed with a predetermined thickness (specifically, for example, the IZO film has a thickness of about 50 nm.) so as to cover the organic layer 131.

Next, the layer 37 is formed on the first surface with a material for forming the third refractive index portion 36. The material forming the third refractive index portion 36 can be, for example, a PSiO film (plasma silicon oxide film). As the thickness of this layer 37, for example, a thickness of about 2000 nm can be exemplified. Then, a resist 40 having a pattern corresponding to the organic layer 131 and the first cathode electrode 132 is formed on the first surface of the layer 37 (FIG. 20A), and dry etching is performed (FIG. 20B). At this time, a laminated structure of the anode electrode 130, the organic layer 131, and the first cathode electrode 132 is formed for each sub-pixel 101. The layer 37 remains on the first cathode electrode 132.

Next, the resist 40 is removed, and the layer 38 of the material for forming the side wall protective layer 16 and the layer 39 of the material for forming the third refractive index portion 36 are sequentially laminated (FIG. 20C). This lamination can be realized by using a low temperature PCVD method or the like. For example, in a case where the material for forming the side wall protective layer 16 is PSiN, PSIN having a predetermined thickness (for example, the thickness is 50 nm.) and PSiO having a predetermined thickness (for example, the thickness is 100 nm.) are sequentially formed by using a low-temperature PCVD method or the like. At this time, these layers 38 and 39 are formed along the first surface, and are also formed on a side wall surface of the laminated structure of the anode electrode 130, the organic layer 131, and the first cathode electrode 132.

Moreover, the layer 38 of the material forming the side wall protective layer 16 and the layer 39 forming the third refractive index portion 36 are partially removed using a dry etching method or the like (FIG. 21A). At this time, portions of the layer 38 and the layer 39 formed on the side wall surface of the laminated structure of the anode electrode 130, the organic layer 131, and the first cathode electrode 132 are left.

Next, as illustrated in FIG. 21B, a layer 41 of a material for forming the side wall protective layer 16 is formed on the entire surface on the first surface side to a predetermined thickness (For example, the thickness is 3000 nm.) by using a low-temperature PCVD method or the like. Then, by removing a part of the layer 41 by dry etching or the like, the upper end surface (end surface on the first surface side) of the layer 37 and the layer 39 (for example, a PSiO film) of the material forming the third refractive index portion 36 is exposed.

Moreover, a portion of the layer exposed to the first surface side among the layer 37 and the layer 39 of the material forming the third refractive index portion 36 is selectively removed by dry etching. At this time, a portion of the layer 37 formed on the surface of the first cathode electrode 132 and the layer 37 adjacent to the layer 38 with the layer 39 interposed therebetween is a space portion. Note that the layer 37 formed around the anode electrode 130 remains embedded in the layer 41. Furthermore, a space portion formed by the portion of the layer 39 becomes the second refractive index portion 34. Furthermore, a portion of the layer 37 sandwiched between the space portion formed by the portion of the layer 38 and the second refractive index portion 34 becomes the first refractive index portion 33 (FIG. 21C).

Then, the second cathode electrode 134 is formed with a predetermined thickness (for example, the thickness is 100 nm.) on the entire surface on the first surface side by a sputtering method or the like (FIG. 19). In a case where the material for forming the second cathode electrode 134 is IZO, an IZO film is formed by sputtering or the like. The second cathode electrode 134 is formed along the side wall of the layer 39 up to the surface of the first cathode electrode 132 in the space portion on the first surface of the first cathode electrode 132, and is electrically connected to the first cathode electrode 132. At this time, the portion connected to the first cathode electrode 132 and the portion formed along the side wall of the layer 39 up to the surface of the first cathode electrode 132 correspond to the dropping portion 42 of the second cathode electrode 134.

Note that it is possible to avoid formation of the second cathode electrode 134 in the space portion to be the second refractive index portion 34 depending on the conditions of the sputtering method using the material of the second cathode electrode 134.

After the formation of the second cathode electrode 134, the display device 10C according to the first modification example of the third embodiment can be obtained in a similar manner to the method of manufacturing the display device 10A described in the first embodiment.

Note that, in the first modification example, the third refractive index portion 36 is formed around the anode electrode 130, but the third refractive index portion 36 may be omitted.

Operation and Effect

Also in the first modification example, the similar effect to the effect described in the third embodiment can be obtained.

4 Fourth Embodiment

4-1 Configuration of Display Device

A display device 10D according to a fourth embodiment will be described. In the display device 10D according to the fourth embodiment, as illustrated in FIG. 22A, similarly to the display device 10A according to the first embodiment, an element protective layer 15 (lower protective layer 17) as a protective layer is formed on the first cathode electrode 132 for each sub-pixel 101. In the example of the display device 10D according to the fourth embodiment illustrated in FIG. 22A, unlike the first embodiment, the side wall protective layer 16 between the adjacent sub-pixels 101 is omitted. However, this does not prohibit the arrangement of the side wall protective layer 16, and the side wall protective layer 16 may be formed similarly to the first embodiment. FIG. 22A is a cross-sectional view illustrating an example of a display device 10D according to the fourth embodiment. Furthermore, in the example of FIG. 22A, three types of sub-pixels 101R, 101G, and 101B are provided as the sub-pixels 101 forming one pixel.

In the display device 10D according to the fourth embodiment, the metal layer 46 is charged between the mutually adjacent connection portions 45 connected to the first cathode electrodes 132 of the adjacent light emitting elements 13. That is, metal is charged between the mutually adjacent connection portions 45 connected to the first cathode electrode 132 of each sub-pixel 101, and the metal layer 46 includes the charged metal.

(Second Cathode Electrode and Connection Portion)

In the display device 10D of the fourth embodiment illustrated in the example of FIG. 22A, the connection portion 45 includes a part of the second cathode electrode 134. The second cathode electrode 134 is formed along the outer peripheral surface of the element protective layer 15. Then, in the second cathode electrode 134, a portion extending toward the side wall 132B of the first cathode electrode 132 along the side wall 15A of the element protective layer 15 forms a connection portion 45. The second cathode electrode 134 is connected to the side wall 132B of the first cathode electrode 132 on the lower end side of the connection portion 45. Furthermore, the second cathode electrode 134 includes a coupling portion 47 that couples the lower end portions of the adjacent connection portions 45 to each other, and functions as a common electrode common to the sub-pixel 101 as a whole.

(Metal Layer)

In the display device 10D according to the fourth embodiment, as described above, the metal layer 46 is charged between the adjacent connection portions 45 connected to the adjacent first cathode electrodes 132. In the example of FIG. 22A, the metal layer 46 is formed so as to be in contact with the coupling portion 47 and the adjacent connection portion 45. As the material of the metal layer 46, a material having light reflectivity and conductivity is used, and for example, metals of Groups 1, 2, and 13 to 16, and transition metals can be exemplified. Furthermore, from the viewpoint of light reflectivity and conductivity, aluminum, silver, an alloy containing these, or the like can be suitably used as the material of the metal layer 46. At this time, AlCu, AlSi, and the like can be exemplified as an alloy to be a material of the metal layer 46. However, from the viewpoint of ease of processing, the material of the metal layer 46 is preferably such a material that the boiling point of a halide (fluoride or the like) is 100° C. or lower in vacuuming. From this viewpoint, the material of the metal layer 46 is preferably one or more metal materials selected from aluminum and an aluminum alloy.

With respect to the dimension of the metal layer 46 in the vertical direction, it is preferable that the upper end (end portion on the first surface side) of the metal layer 46 is positioned at or near the upper end of the side wall 15A of the element protective layer 15, and the lower end (end portion on the second surface side) of the metal layer 46 is positioned at or near the formation position of the coupling portion 47 of the second cathode electrode 134.

As illustrated in FIG. 22B, the upper end of the metal layer 46 may extend further upward than the upper end of the side wall 15A of the element protective layer 15 or the vicinity thereof, or may further extend from the upper surface of the upper protective layer 19. Note that, although the metal layer 46 in the example of FIG. 22A is embedded inside the upper protective layer 19 as described later, the metal layer 46 may be provided on the lower protective layer 17 side according to the shape of the second cathode electrode 134.

(Element Protective Layer)

The material of the element protective layer 15 is not particularly limited, and the material described in the first embodiment can be used. For example, the material of the element protective layer 15 may be SiN or the like. Furthermore, the element protective layer 15 may be a single layer or may have a multilayer structure. For example, the element protective layer 15 may have a laminated structure of a layer including SiN and an AlOx film by atomic layer deposition (ALD).

(Upper Protective Layer)

In the fourth embodiment, similarly to the first embodiment, the upper protective layer 19 is formed so as to cover the second cathode electrode 134. In the example of FIG. 22A, metal layer 46 is embedded in upper protective layer 19. As the material of the upper protective layer 19, the material described in the first embodiment can be used similarly to the material of the element protective layer 15. Furthermore, similarly to the element protective layer 15, the upper protective layer 19 may have a single layer or a multilayer structure.

4-2 Method of Manufacturing Display Device

A method of manufacturing the display device 10D according to the fourth embodiment will be described. Here, a method of manufacturing the display device 10D illustrated in FIG. 22A will be described.

First, the anode electrode 130 and the insulating layer 14 are formed on the drive substrate 11, and the organic layer 131, the first cathode electrode 132, and the element protective layer 15 are formed. Next, the second cathode electrode 134 is formed on the first surface. As a method of forming the second cathode electrode 134, it is preferable to use a method excellent in film forming coatability, such as ALD, for example. The second cathode electrode 134 covers the first cathode electrode 132 on the upper surface side of the element protective layer 15. Furthermore, the second cathode electrode 134 forms a connection portion 45 at a portion extending toward the drive substrate 11 side along the side wall 15A of the element protective layer 15. The connection portion 45 formed on the second cathode electrode 134 is connected to the side wall 132B of the first cathode electrode 132 at a predetermined position on the lower end side thereof. Then, the adjacent connection portions 45 connected to the adjacent first cathode electrodes 132 are connected, and a portion connecting the connection portions 45 forms the coupling portion 47.

Next, the metal layer 46 is formed on the entire surface so as to cover the second cathode electrode 134 (FIG. 23A). At this time, the gap between the adjacent connection portions 45 is also filled with the metal forming the metal layer 46. Then, the metal layer 46 is etched to expose a portion of the second cathode electrode 134 formed on the upper surface of the element protective layer 15 (FIG. 23B). At this time, the metal layer 46 charged in the gap between the adjacent connection portions 45 is left.

Moreover, the upper protective layer 19 is formed on the first surface side, and the upper protective layer 19 and the counter substrate 21 are fixed via the filling resin layer 20. Thus, the display device 10D is obtained.

4-3 Operation and Effect

As a display device using an organic EL element, in a display device having a structure in which an organic layer including at least an organic light emitting layer and a first cathode electrode are laminated on an anode electrode formed separately for each pixel, the first cathode electrode is separated for each sub-pixel. For this reason, a display device in which a second cathode electrode is connected on a first cathode electrode has been proposed. In such a display device, the connection portion between the second cathode electrode and the first cathode electrode may be formed using a film forming technique or the like. In a case where a material such as ITO which is difficult to form a film is used as the material of the connection portion, a film having a sufficient thickness is hardly formed. For this reason, even in a case where a material that is difficult to form a film is used as the material of the connection portion, it is required to suppress disconnection failure of the connection portion and improve reliability of the light emitting state of the display device.

In the display device 10D according to the fourth embodiment, since the gap between the adjacent connection portions 45 is filled with the metal layer 46, conductivity can be maintained even if a disconnection failure occurs in the connection portion 45, and the reliability of the light emission state of the display device 10D can be improved. Furthermore, as also illustrated in FIG. 22A, light emitted from the organic layer 131 in an oblique direction becomes reflected light LW by the metal layer 46, whereby light leakage to the adjacent sub-pixel 101 can be suppressed.

4-4 Modification Example

First Modification Example

Next, a modification example of the display device 10D according to the fourth embodiment will be described.

(Configuration of First Modification Example)

Figure 24:
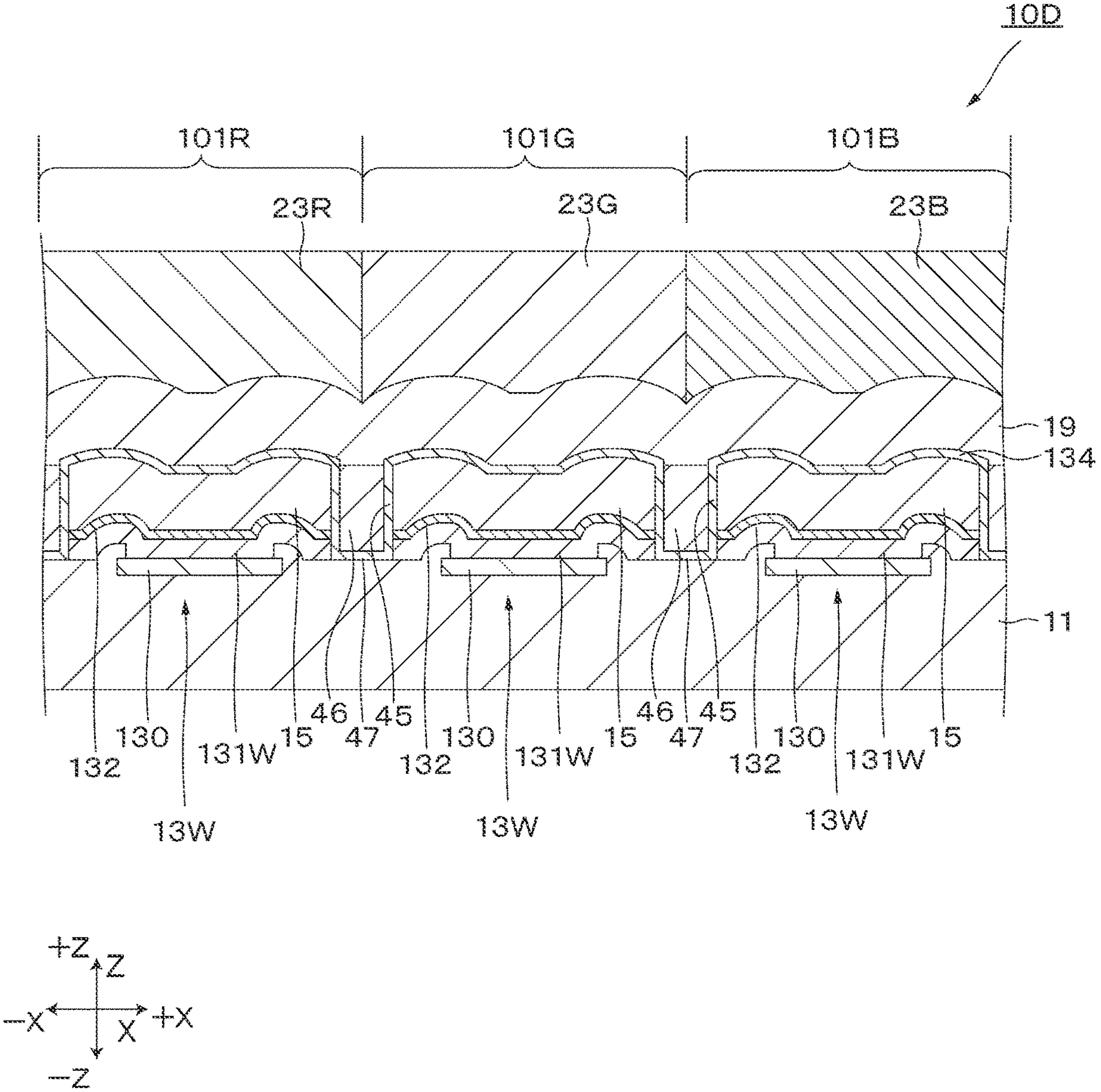
FIG. 24 is a cross-sectional view for explaining a modification example of the display device according to the fourth embodiment.
Figure 25:
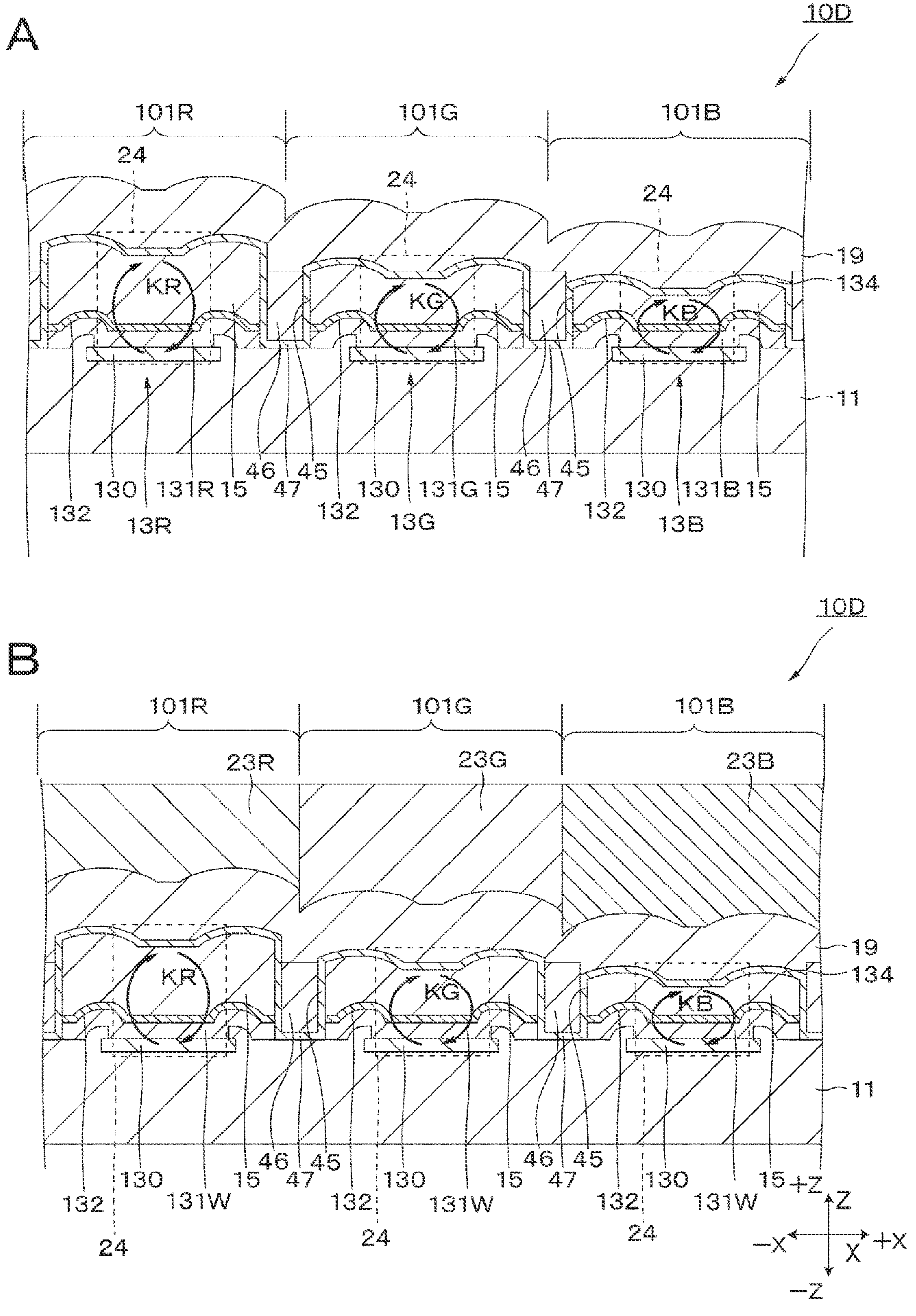
FIGS. 25A and 25B are cross-sectional views for explaining a modification example of the display device according to the fourth embodiment.
Figure 26:
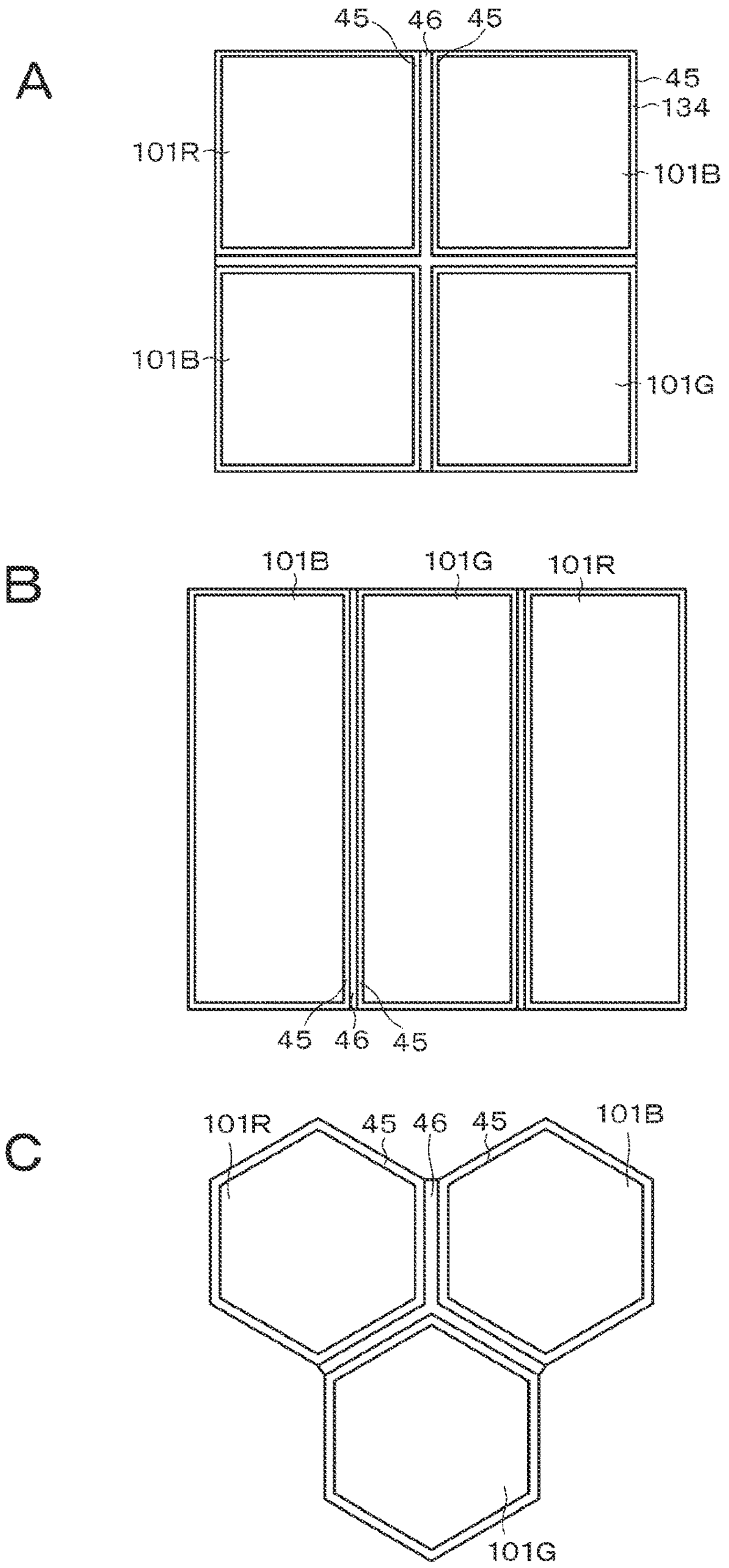
FIGS. 26A to 26C are plan views for explaining an example of a layout of sub-pixels of the display device according to the fourth embodiment.

In the description of the fourth embodiment, the light emission color of the organic layer 131 is the color type corresponding to the light emission color of the sub-pixel 101. However, in the display device 10D according to the fourth embodiment, similarly to the first modification example of the display device 10A according to the first embodiment, the light emission color of the light emitting element 13 may be a color type other than the color type corresponding to the light emission color of the sub-pixel 101 (First modification example). For example, in the display device 10D according to the first modification example of the fourth embodiment, as illustrated in the example of FIG. 24, a light emitting element 13W having an organic layer 131W having white as a light emission color regardless of the color type of the sub-pixel 101 may be provided as the organic layer 131. Note that, in the example of the display device 10D according to the first modification example of the fourth embodiment illustrated in FIG. 24, similarly to the display device 10A according to the first modification example of the first embodiment, a color filter 23 corresponding to the color type of the light emitting element 13W and the sub-pixel 101 is provided. As a result, in the display device 10D, light according to the color type of the sub-pixel 101 is displayed on the display surface 110A. Note that the light emitting element 13W and the color filter 23 are similar to those described in the first modification example of the first embodiment.

Second Modification Example

In the display device 10D of the fourth embodiment, the layout of the sub-pixels 101R, 101G, and 101B is not limited. For example, the layout of the sub-pixels 101 may be a stripe-shaped pattern as illustrated in the example of FIG. 26B, but may be other patterns similarly to the second modification example of the display device 10A of the first embodiment. That is, in the display device 10D of the fourth embodiment, the layout pattern of the sub-pixels 101 may be, for example, a delta pattern as illustrated in FIG. 26C or a square pattern as illustrated in FIG. 26A. Note that the delta shape indicates an arrangement in which the centers of the three sub-pixels 101R, 101G, and 101B are connected to form a triangle. The square arrangement indicates an arrangement in which the centers of four sub-pixels (in the example of FIG. 26A, the sub-pixels 101R, 101G, 101B, and 101B) are connected to form a square. Also in these cases, the connection portion 45 of the second cathode electrode 134 is formed on the outer peripheral edge of each sub-pixel 101, and the metal layer 46 is charged between the adjacent connection portions 45.

Third Modification Example

In the display device 10D of the fourth embodiment, similarly to the third modification example of the first embodiment, as illustrated in FIG. 25A, the sub-pixel 101 may have a resonator structure 24 (Third modification example). FIG. 25A is a cross-sectional view illustrating an example of the display device 10D according to the third modification example of the fourth embodiment.

In the display device 10D according to the third modification example of the fourth embodiment, the resonator structure 24 includes the second cathode electrode 134 and the light emitting element 13. The resonator structure 24 is similar to that described in the third modification example of the first embodiment. In the example of FIG. 25A, similarly to the third modification example of the first embodiment, the element protective layers 15 have different thicknesses between the sub-pixels 101 corresponding to different color types. The display device 10D according to the third modification example of the fourth embodiment includes the light emitting elements 13R, 13G, and 13B having a color corresponding to the color type of the sub-pixel 101 as a light emission color, and the resonator structure 24 emphasizes light of a predetermined color (red light (KR), green light (KG), and blue light (KB), respectively), and color purity of light corresponding to the color type of the sub-pixel 101 can be improved.

According to the display device 10D, even if the element protective layer 15 has different thicknesses as described above, the metal layer 46 is charged between the adjacent connection portions 45, so that it is possible to suppress a defect in the conductive state due to a disconnection defect of the connection portion 45 of the second cathode electrode 134.

Fourth Modification Example

In the display device 10D of the third modification example of the fourth embodiment, as illustrated in FIG. 25B, the organic layer 131W may be provided regardless of the color type of the sub-pixel 101. The organic layer 131W is similar to the first modification example of the fourth embodiment. Also in this case, light according to the color type of the sub-pixel 101 is extracted by the resonator structure 24.

In the display device 10D according to the fourth modification example of the fourth embodiment, as illustrated in FIG. 25B, a color filter 23 is preferably provided. The color purity can be improved by providing the color filter 23. The color filter 23 is similar to the first modification example of the fourth embodiment.

5 Fifth Embodiment 5-1 Configuration of Display Device

A display device 10E according to a fifth embodiment will be described. In the example of the display device 10E according to the fifth embodiment illustrated in FIGS. 27A and 27B, an insulating layer 14 disposed between the adjacent anode electrodes 130 and covering the peripheral edge portion 130A of the anode electrode 130 is provided. FIGS. 27A and 27B are cross-sectional views illustrating an example of the display device 10E according to the fifth embodiment. Furthermore, in the examples of FIGS. 27A and 27B, three types of sub-pixels 101R, 101G, and 101B are provided as the sub-pixels 101 forming one pixel.

In the example of the display device 10E illustrated in FIG. 27A, the opening end edge 140 of the insulating layer 14 is located on the anode electrode 130, and a step due to the thickness of the opening end edge 140 of the opening 14A is formed at the position of the peripheral edge portion 130A of the anode electrode 130. Furthermore, the organic layer 131 is formed so as to cover the portion where the step is formed and cover the portion of the anode electrode 130 exposed from the opening 14A and the insulating layer 14. Moreover, the first cathode electrode 132 is formed so as to cover the organic layer 131. Furthermore, similarly to the first embodiment and the like, the organic layer 131 and the first cathode electrode 132 are separately formed for each sub-pixel 101. In the example of the fifth embodiment illustrated in FIGS. 27A and 27B, a laminated structure 52 of the organic layer 131 and the first cathode electrode 132 forms a raised portion 53 on the position of the opening end edge 140 of the opening 14A. The laminated structure 52 of the organic layer 131 and the first cathode electrode 132 is divided into a predetermined shape at a predetermined position inside the peripheral edge portion 130A of each anode electrode 130 (a predetermined position inside the opening end edge 140 of the opening 14A). In the example of FIG. 27B, the laminated structure 52 is separated into a rectangular portion inside the peripheral edge portion 130A (a peripheral edge inner portion 50) and an outer peripheral edge portion thereof (an outer edge portion 51). The inside of the peripheral edge portion 130A of the anode electrode 130 indicates that the anode electrode is located in an inner region in a case where the Z-axis direction is the line-of-sight direction (in a case where the thickness direction of the light emitting element 13 is the line-of-sight direction).

(Peripheral Edge Inner Portion)

Figure 27:
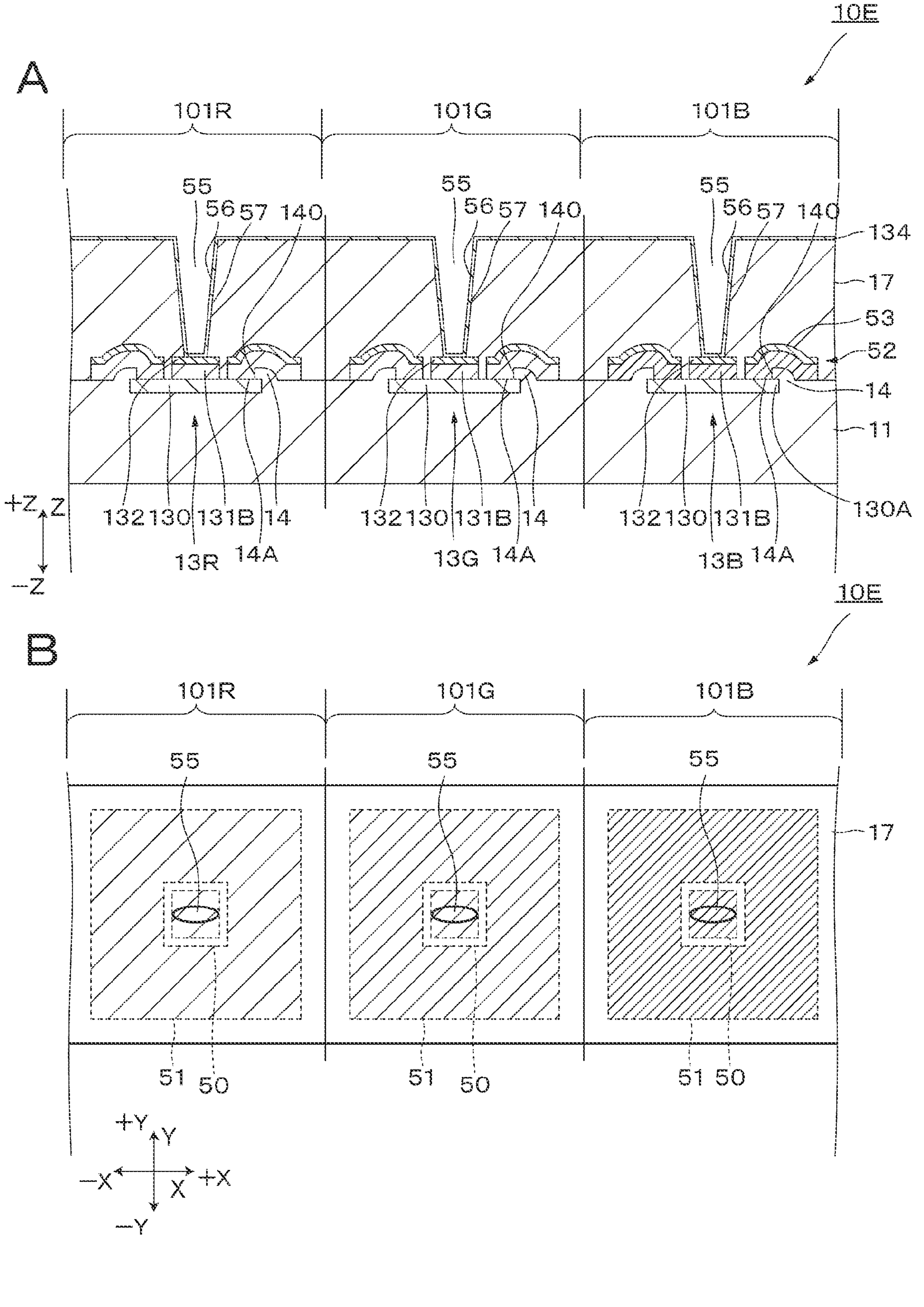
FIGS. 27A and 27B are a cross-sectional view and a plan view for explaining an example of a display device according to a fifth embodiment.
Figure 28:
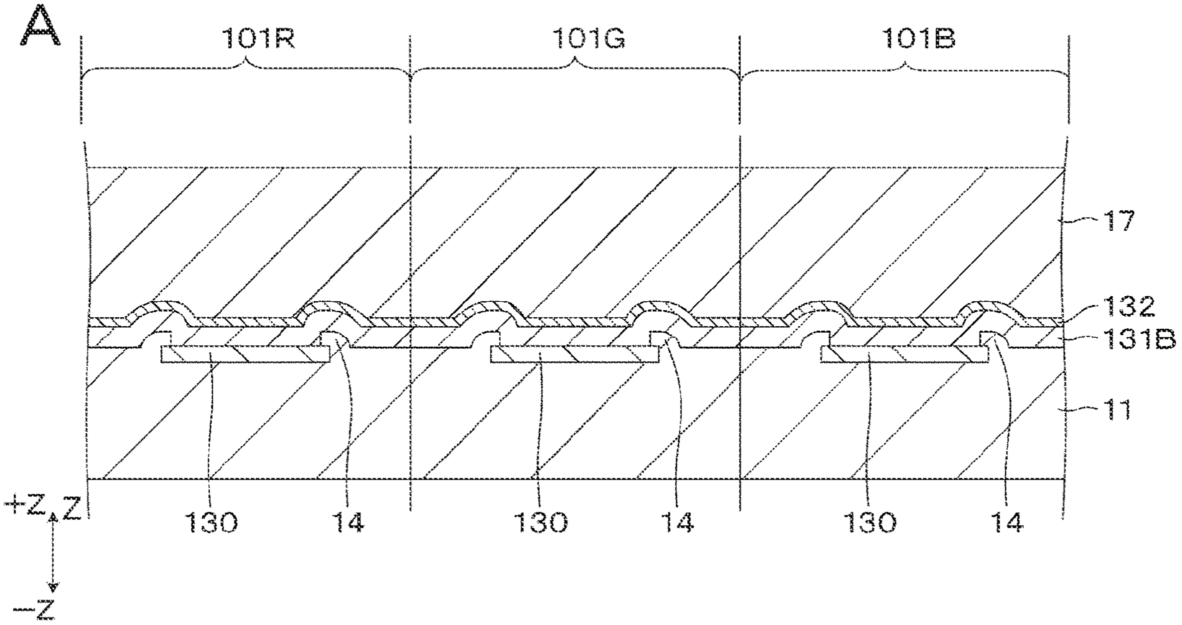
FIGS. 28A and 28B are a cross-sectional view and a plan view for explaining a method of manufacturing the display device according to the fifth embodiment.
Figure 28:
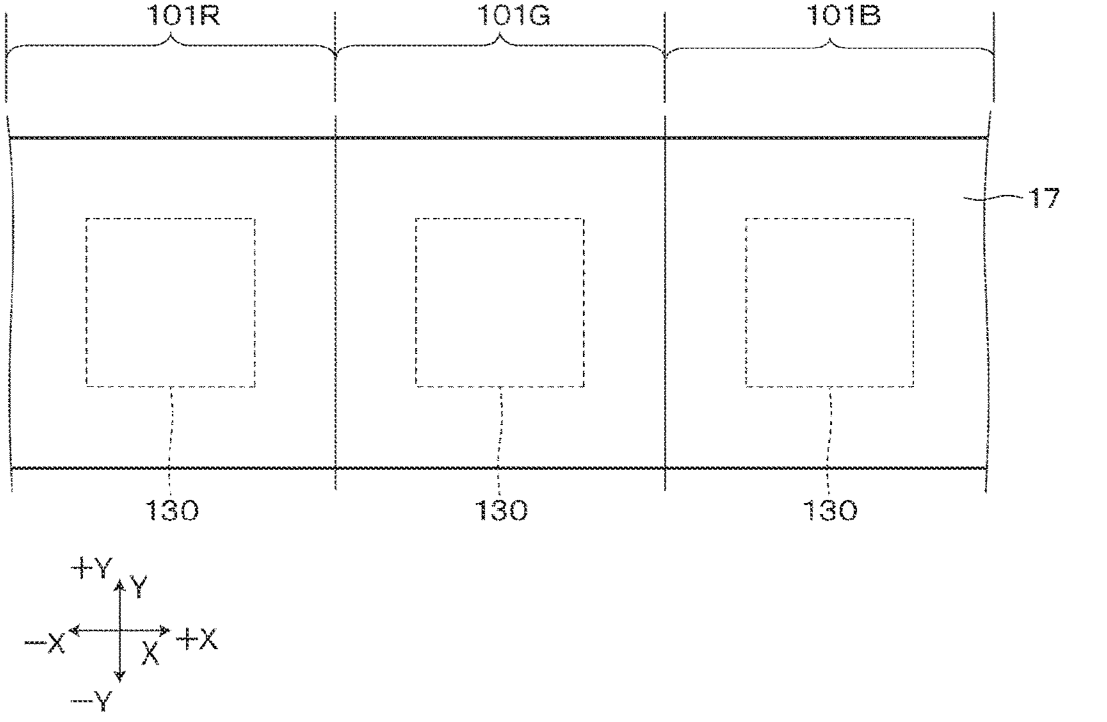
Figure 29:
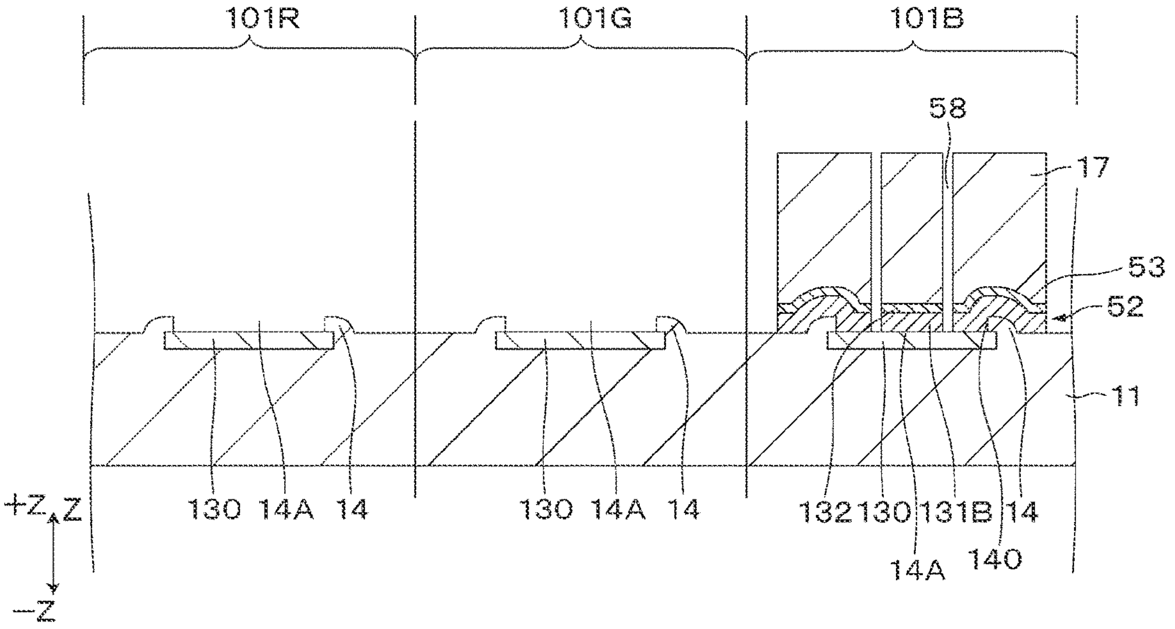
FIGS. 29A and 29B are a cross-sectional view and a plan view for explaining a method of manufacturing the display device according to the fifth embodiment.
Figure 29:
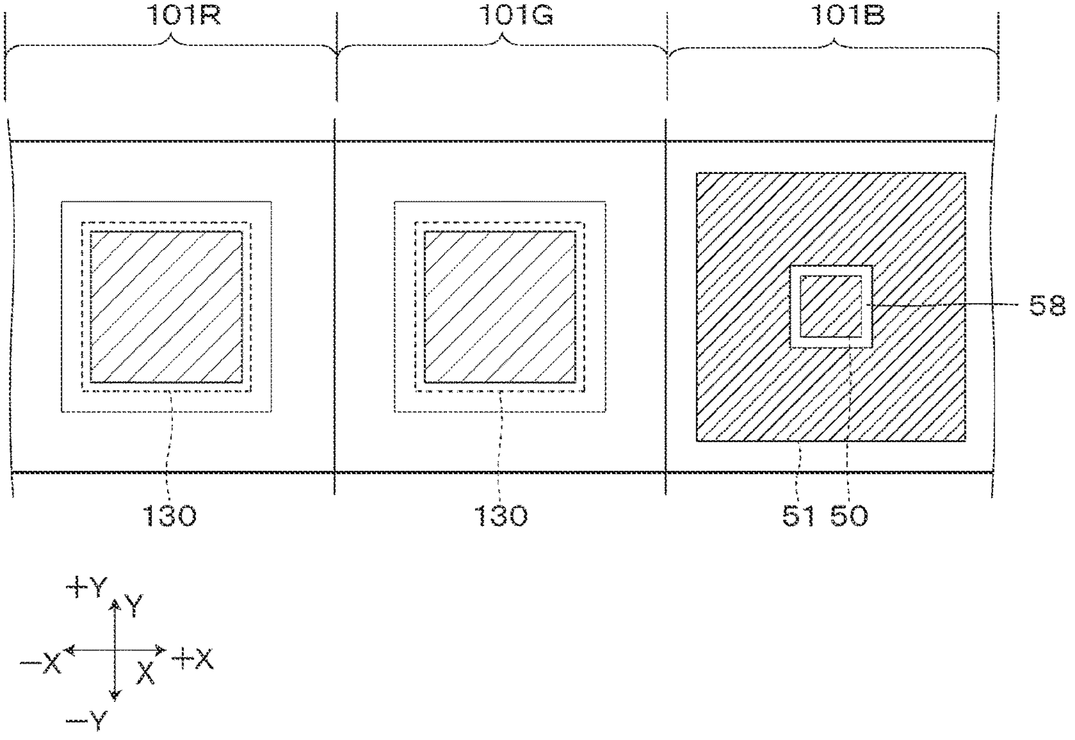
Figure 30:
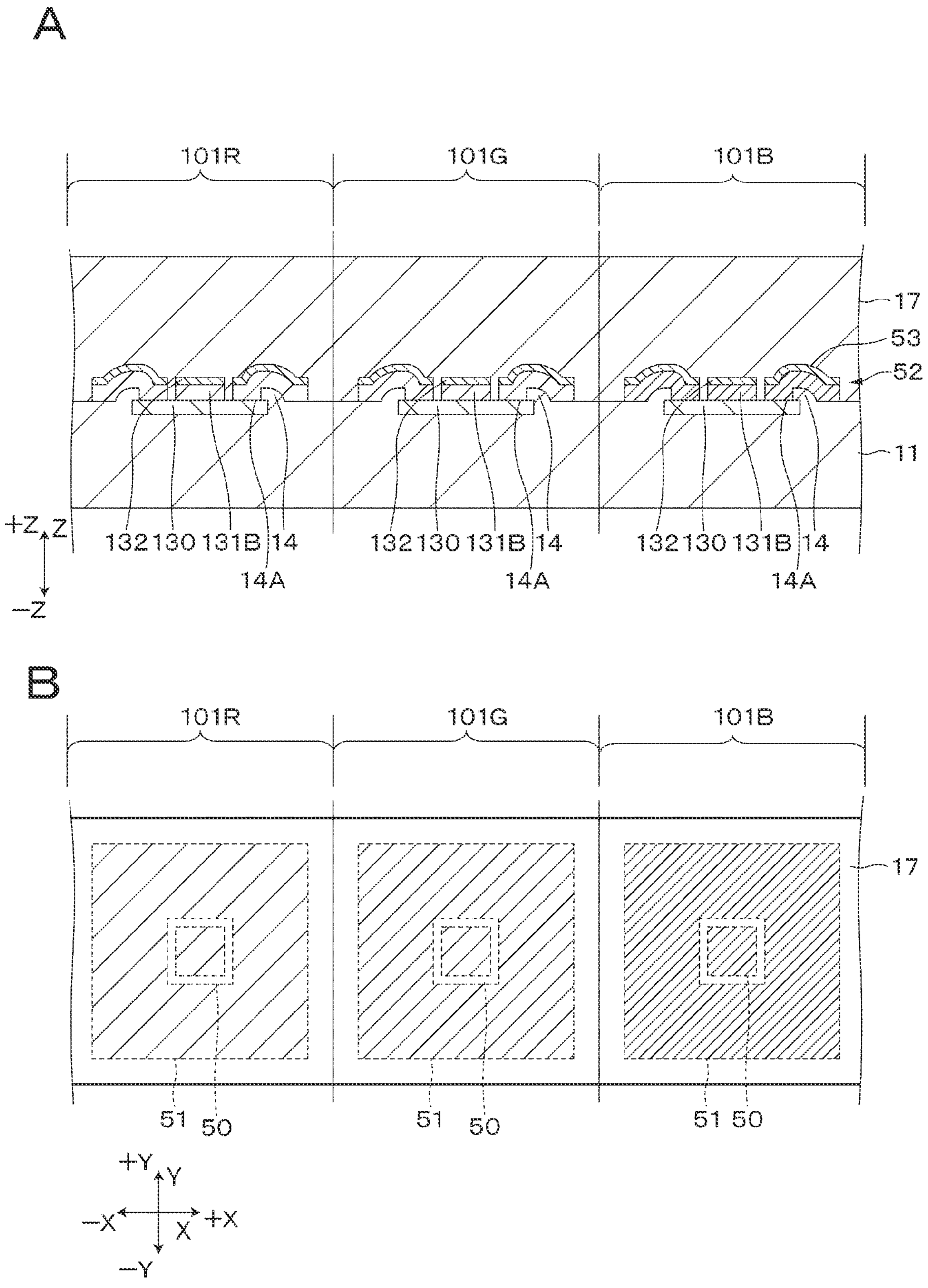
FIGS. 30A and 30B are a cross-sectional view and a plan view for explaining a method of manufacturing the display device according to the fifth embodiment.
Figure 31:
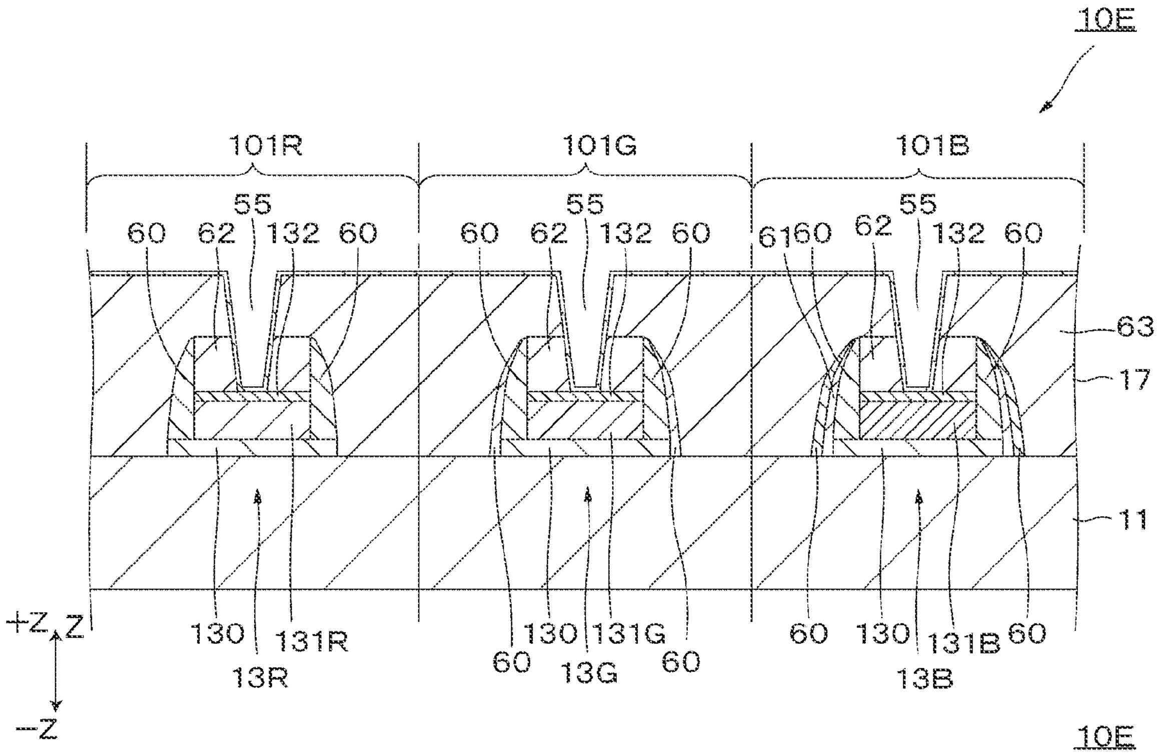
FIGS. 31A and 31B are a cross-sectional view and a plan view for explaining a modification example of the display device according to the fifth embodiment.
Figure 31:
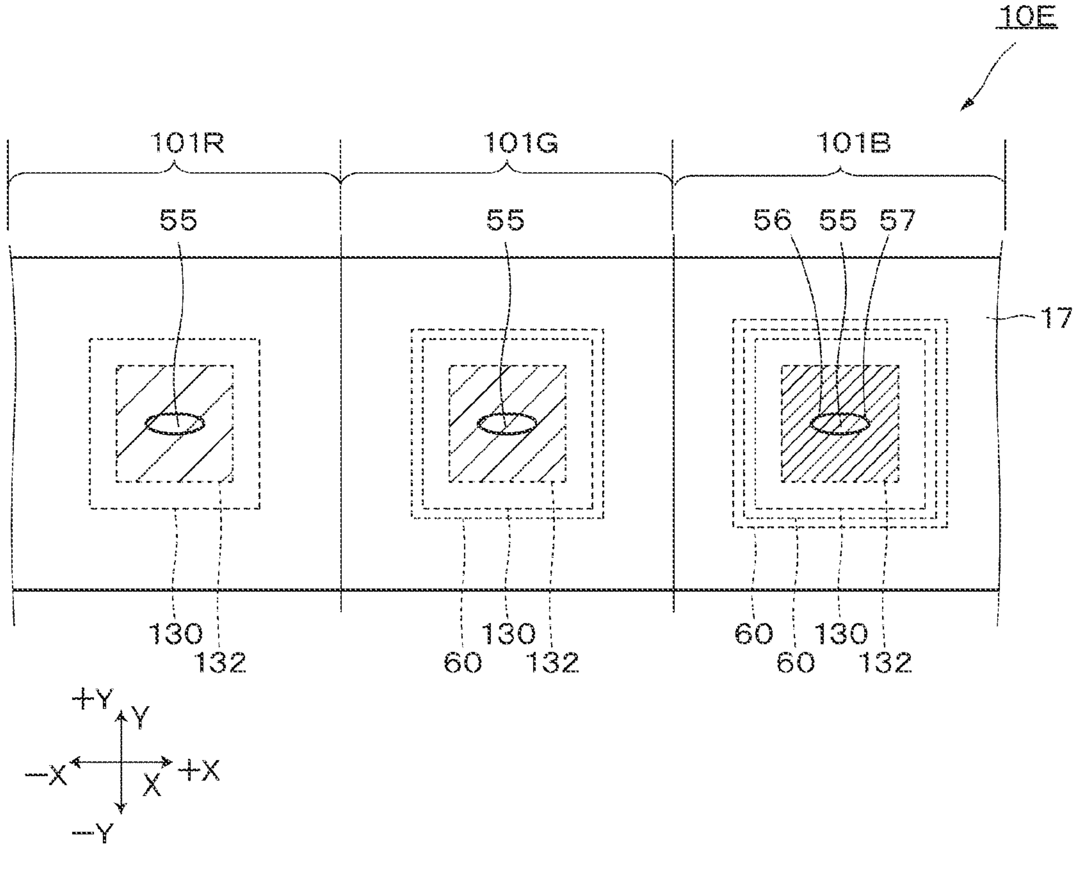
Figure 32:
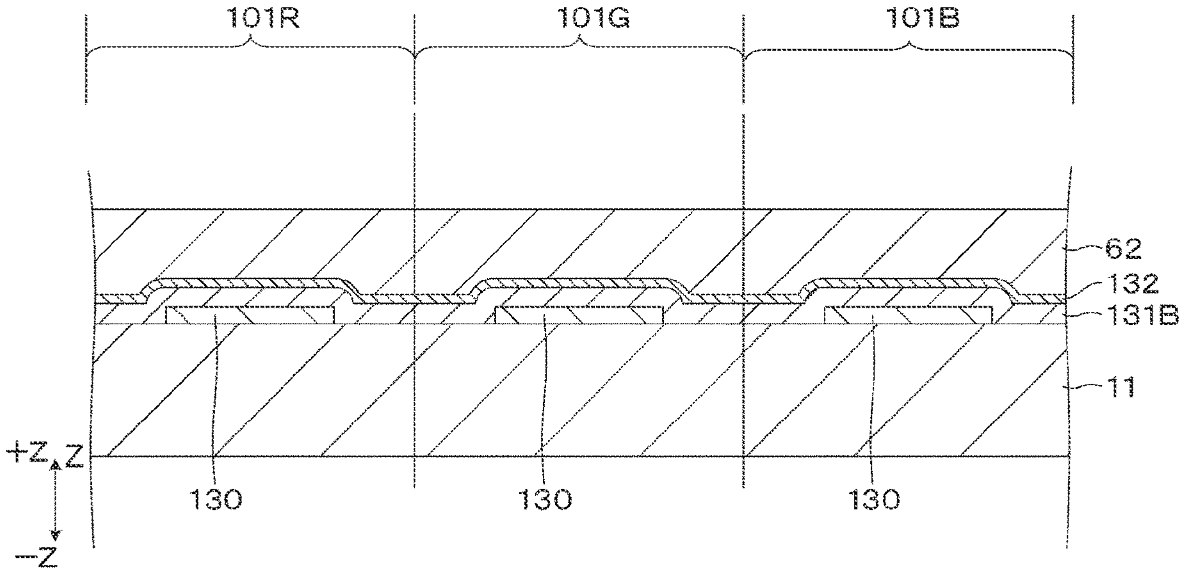
FIGS. 32A and 32B are a cross-sectional view and a plan view for explaining a manufacturing method of a modification example of the display device according to the fifth embodiment.
Figure 32:
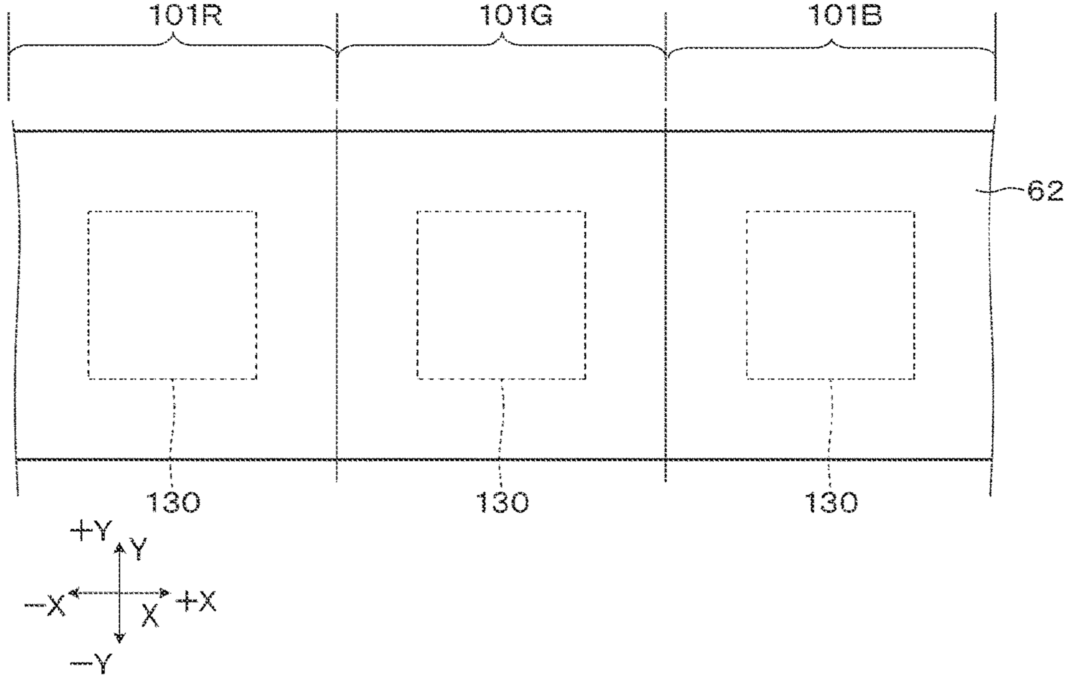
Figure 33:
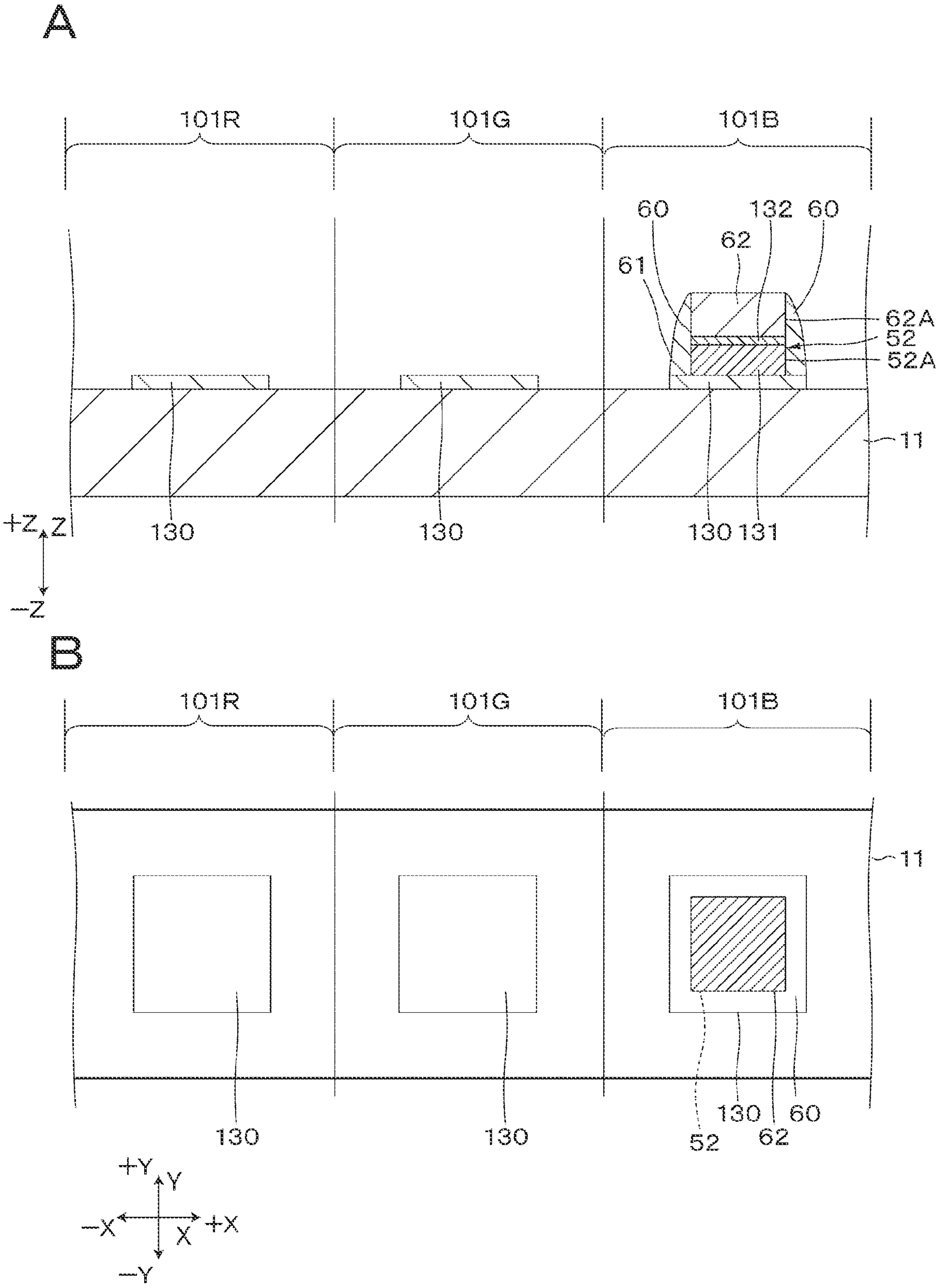
FIGS. 33A and 33B are a cross-sectional view and a plan view for explaining a manufacturing method of a modification example of the display device according to the fifth embodiment.
Figure 34:
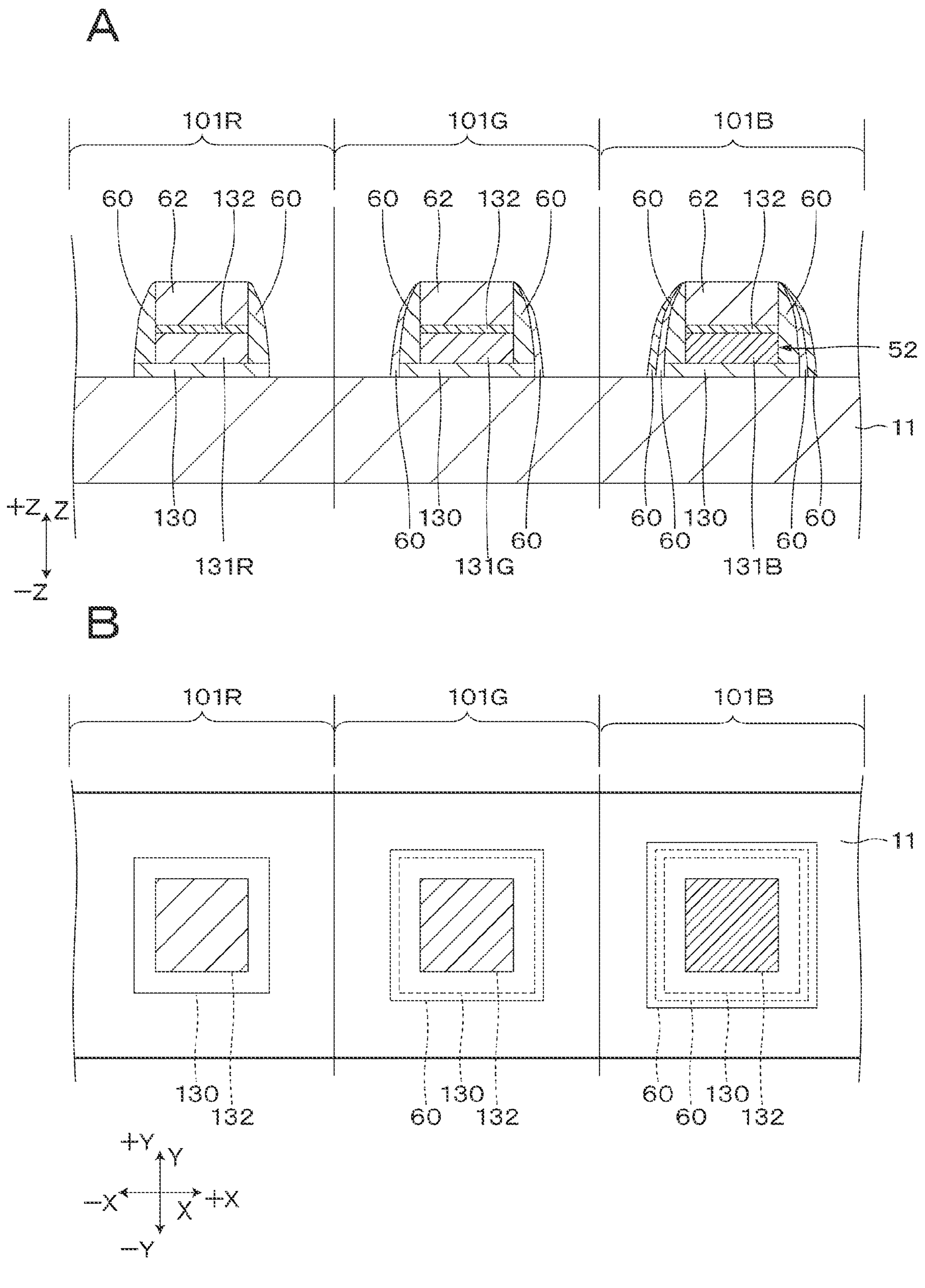
FIGS. 34A and 34B are a cross-sectional view and a plan view for explaining a manufacturing method of a modification example of the display device according to the fifth embodiment.
Figure 35:
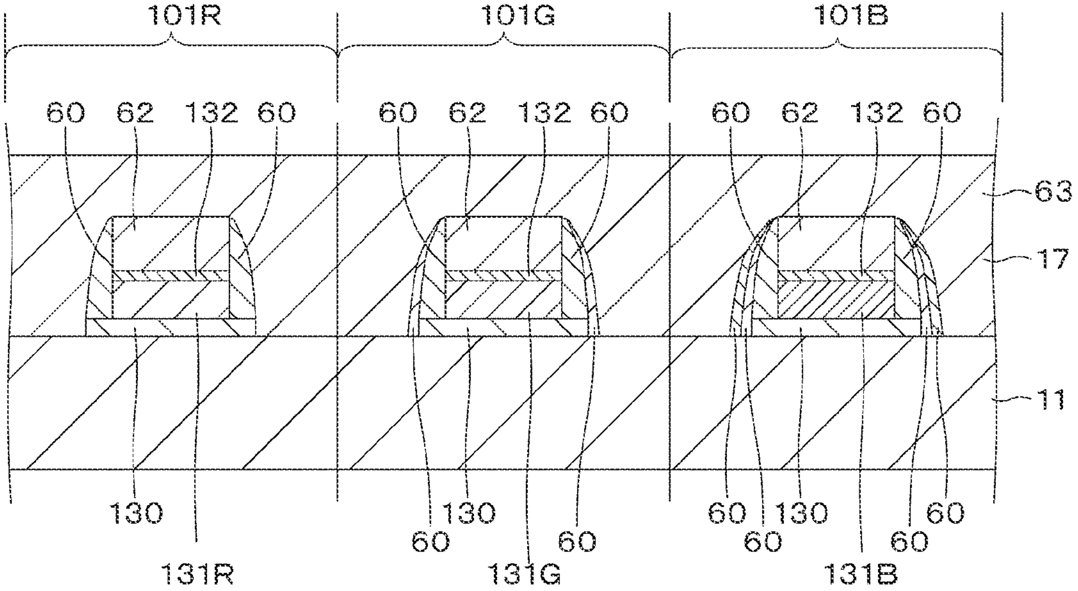
FIGS. 35A and 35B are a cross-sectional view and a plan view for explaining a manufacturing method of a modification example of the display device according to the fifth embodiment.
Figure 35:
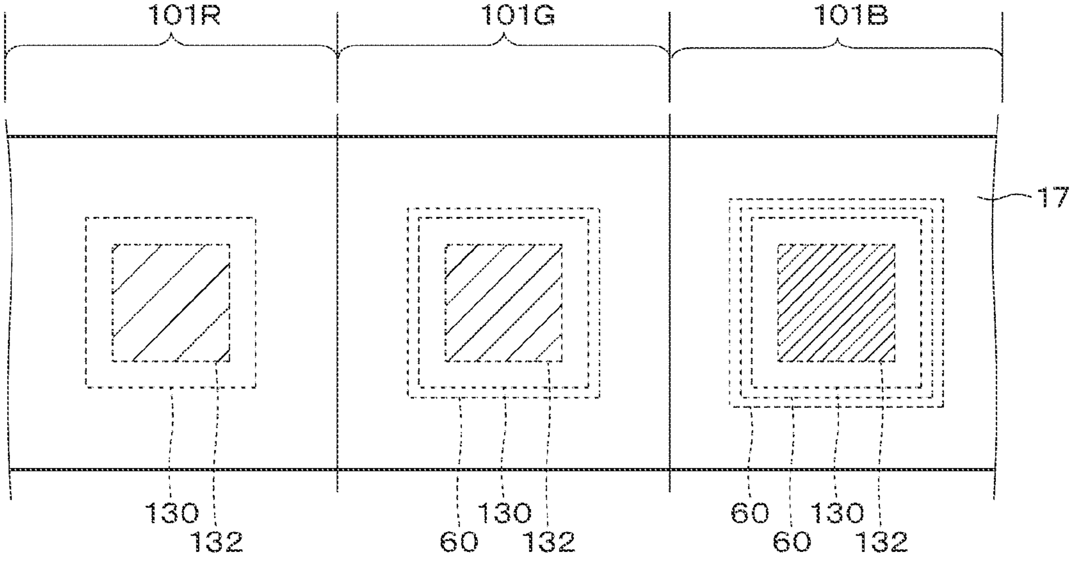
Figure 36:
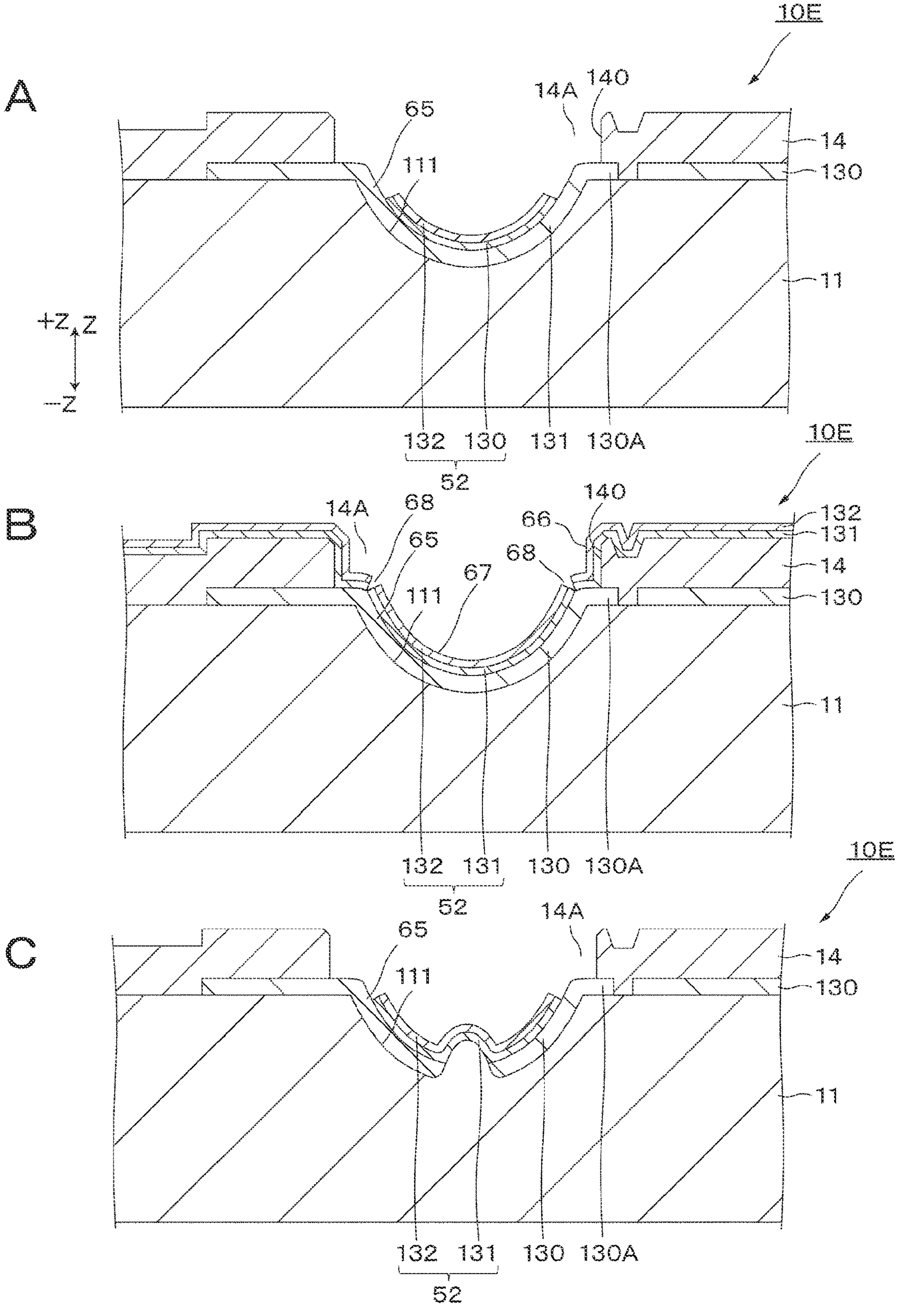
FIGS. 36A to 36C are cross-sectional views for explaining a modification example of the display device according to the fifth embodiment.
Figure 37:
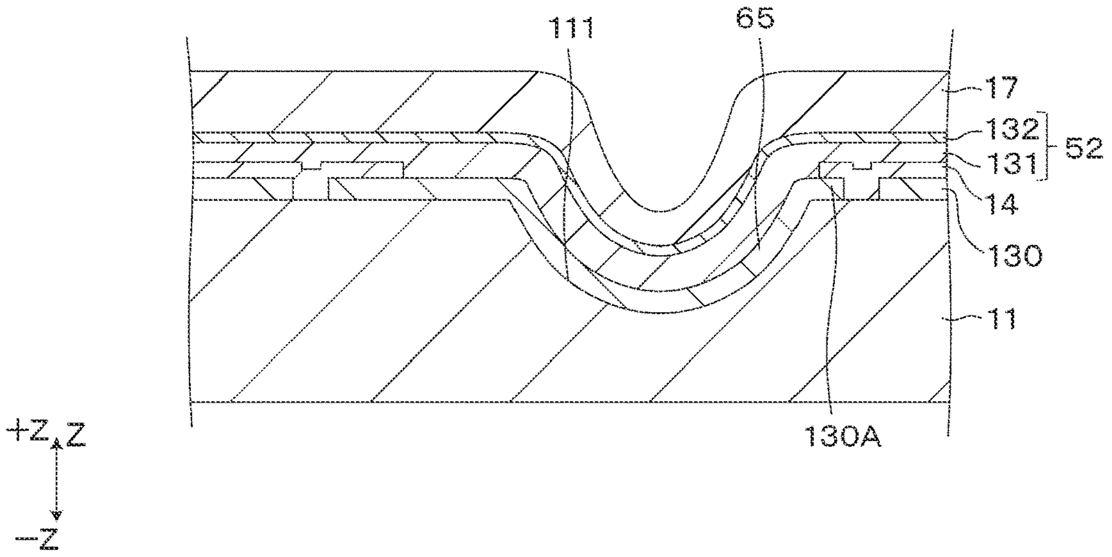
FIGS. 37A and 37B are a cross-sectional view and a plan view for explaining a manufacturing method of a modification example of the display device according to the fifth embodiment.
Figure 37:
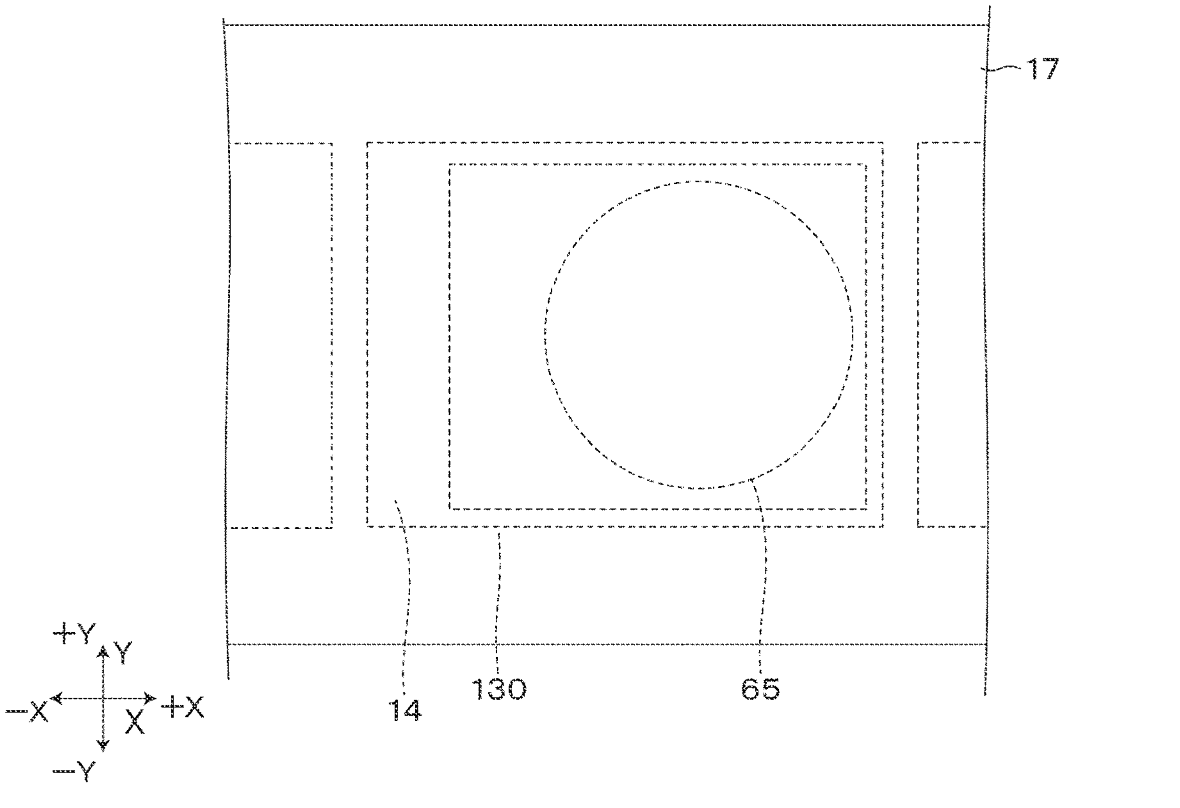
Figure 38:
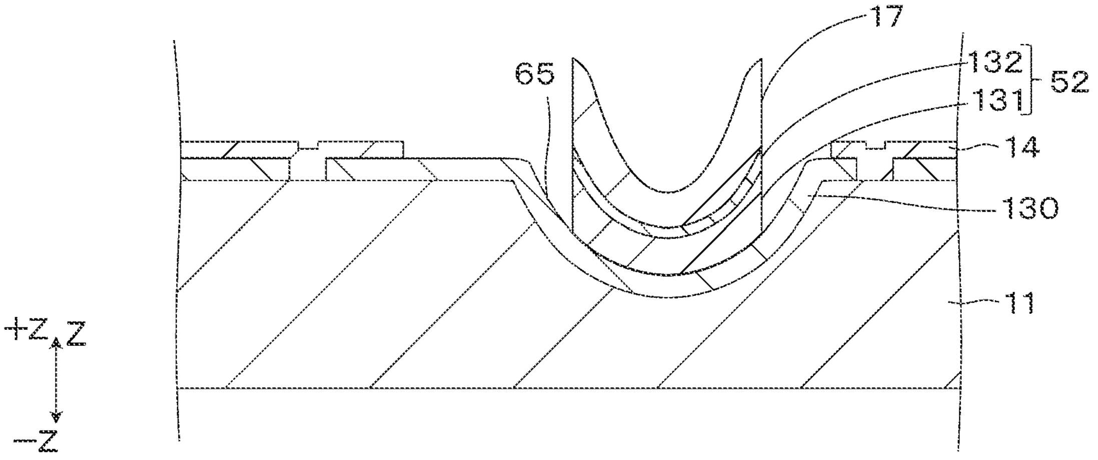
FIGS. 38A and 38B are a cross-sectional view and a plan view for explaining a manufacturing method of a modification example of the display device according to the fifth embodiment.
Figure 38:
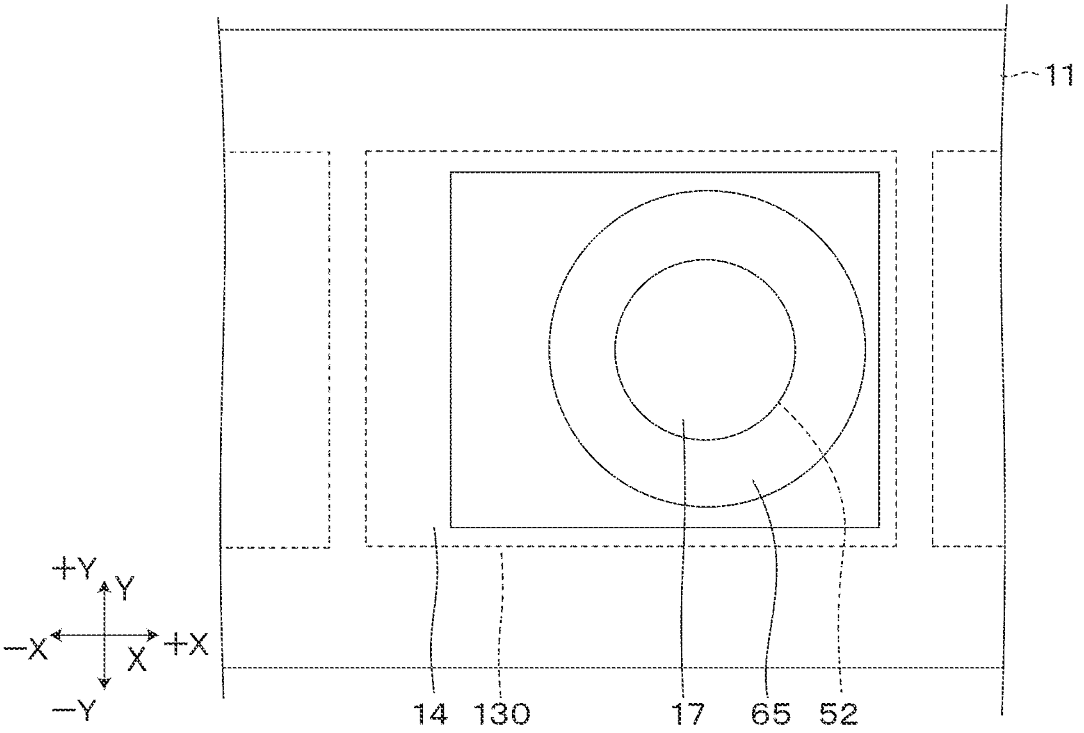
Figure 39:
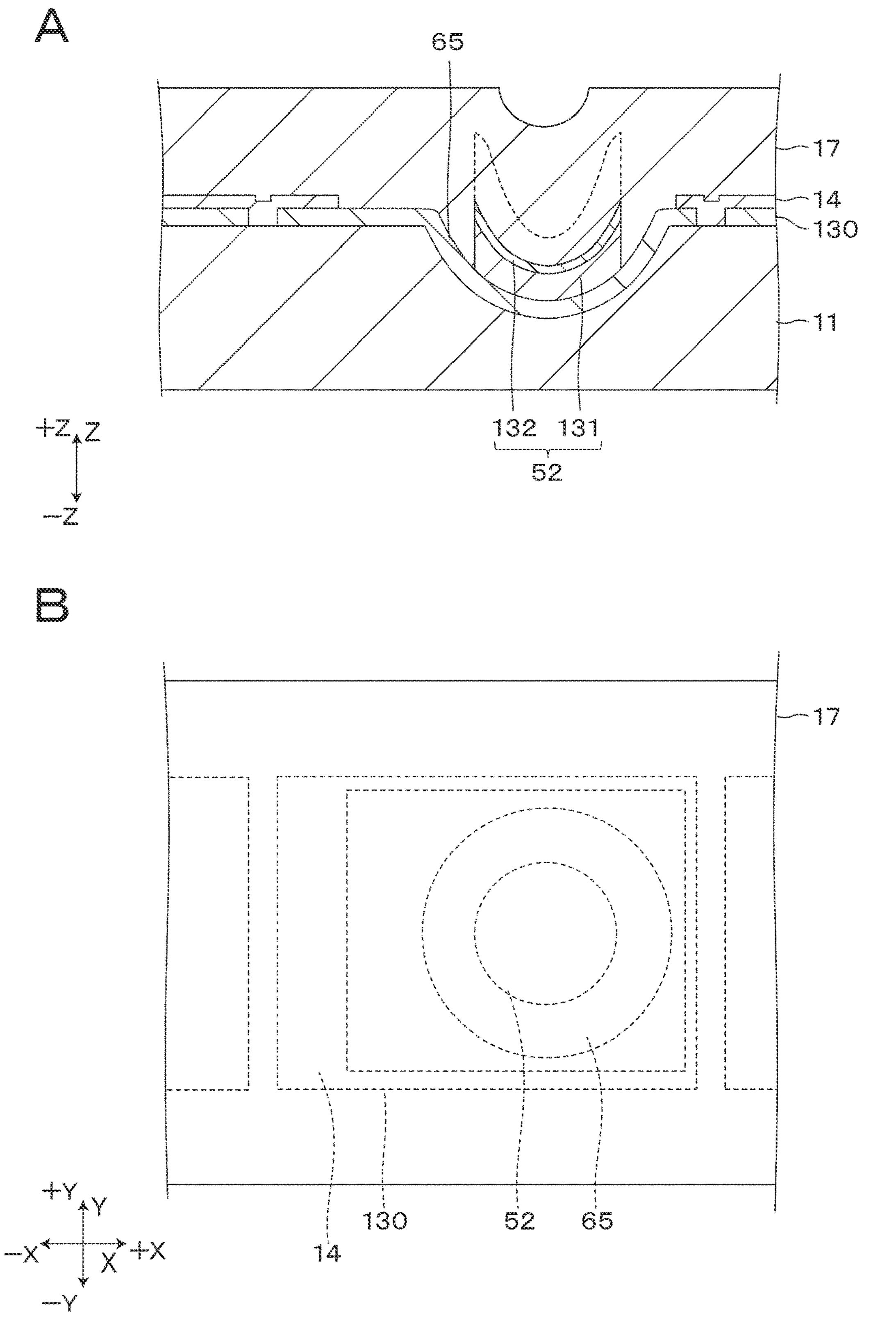
FIGS. 39A and 39B are a cross-sectional view and a plan view for explaining a manufacturing method of a modification example of the display device according to the fifth embodiment.
Figure 40:
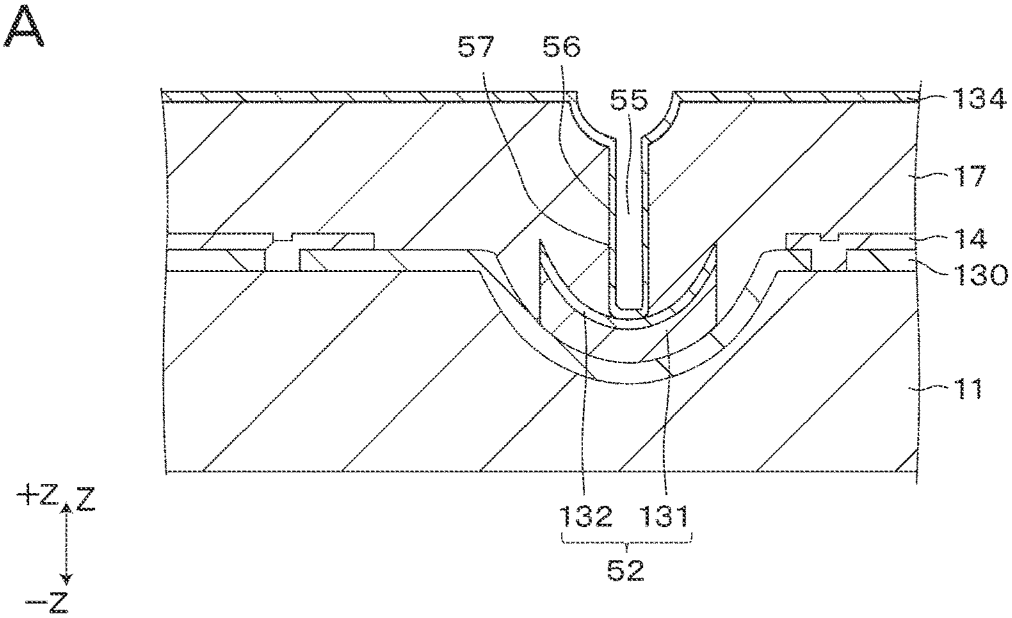
FIGS. 40A and 40B are a cross-sectional view and a plan view for explaining a manufacturing method of a modification example of the display device according to the fifth embodiment.
Figure 40:
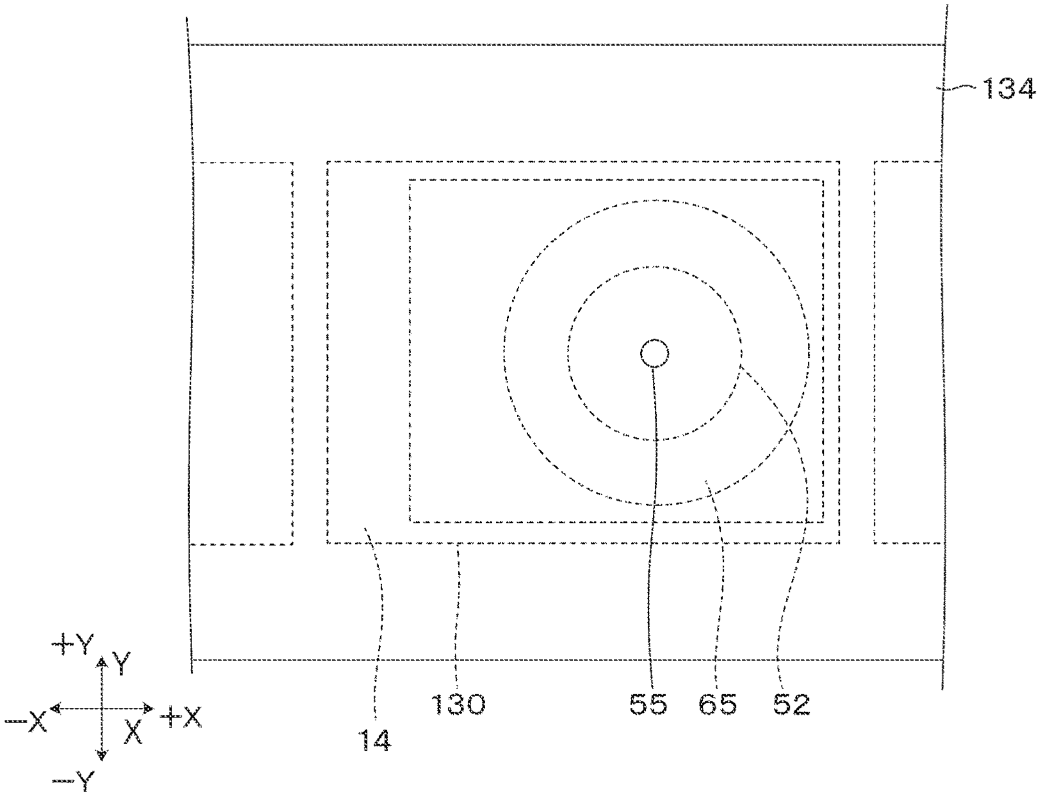
Figure 41:
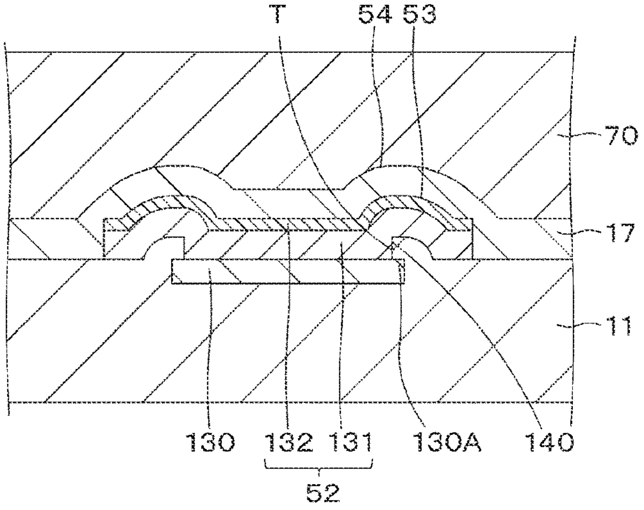
FIGS. 41A to 41D are cross-sectional views for explaining a method of manufacturing a display device according to a sixth embodiment.
Figure 41:
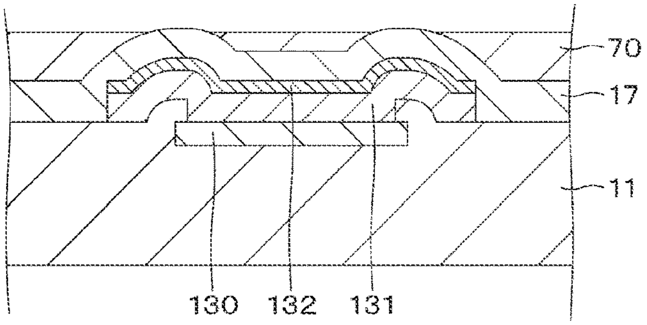
Figure 41:
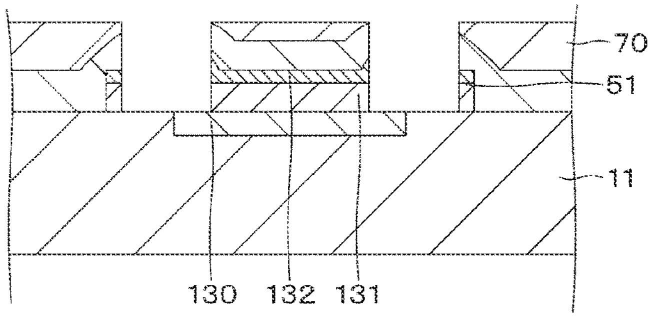
Figure 41:
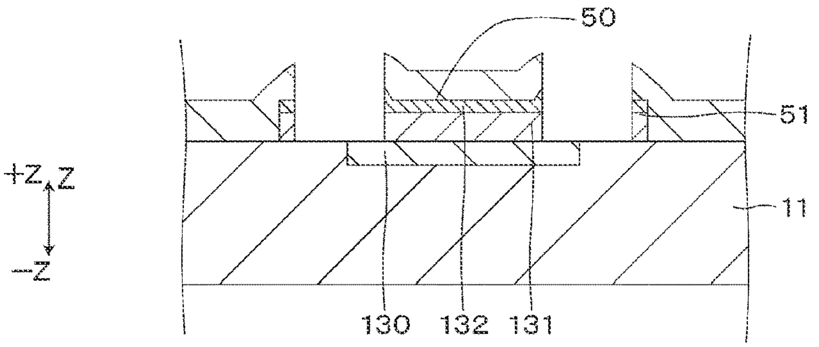
Figure 42:
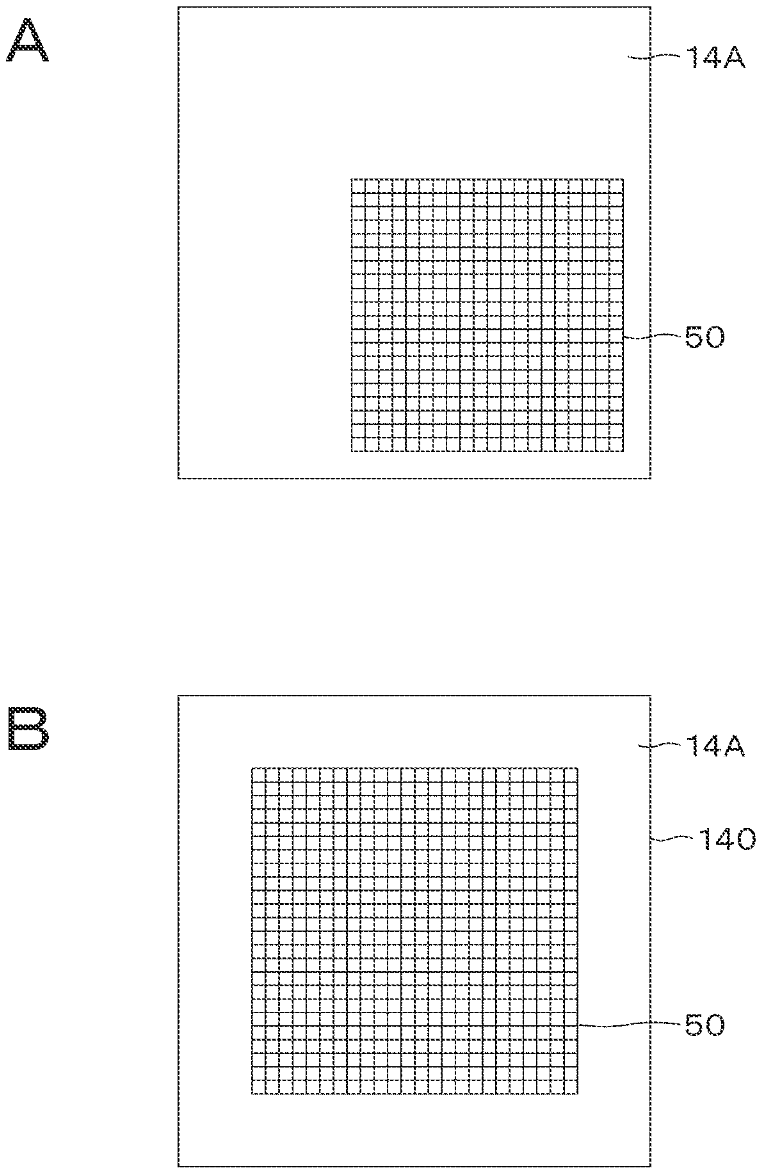
FIGS. 42A and 42B are plan views for explaining the display device according to the sixth embodiment.
Figure 43:
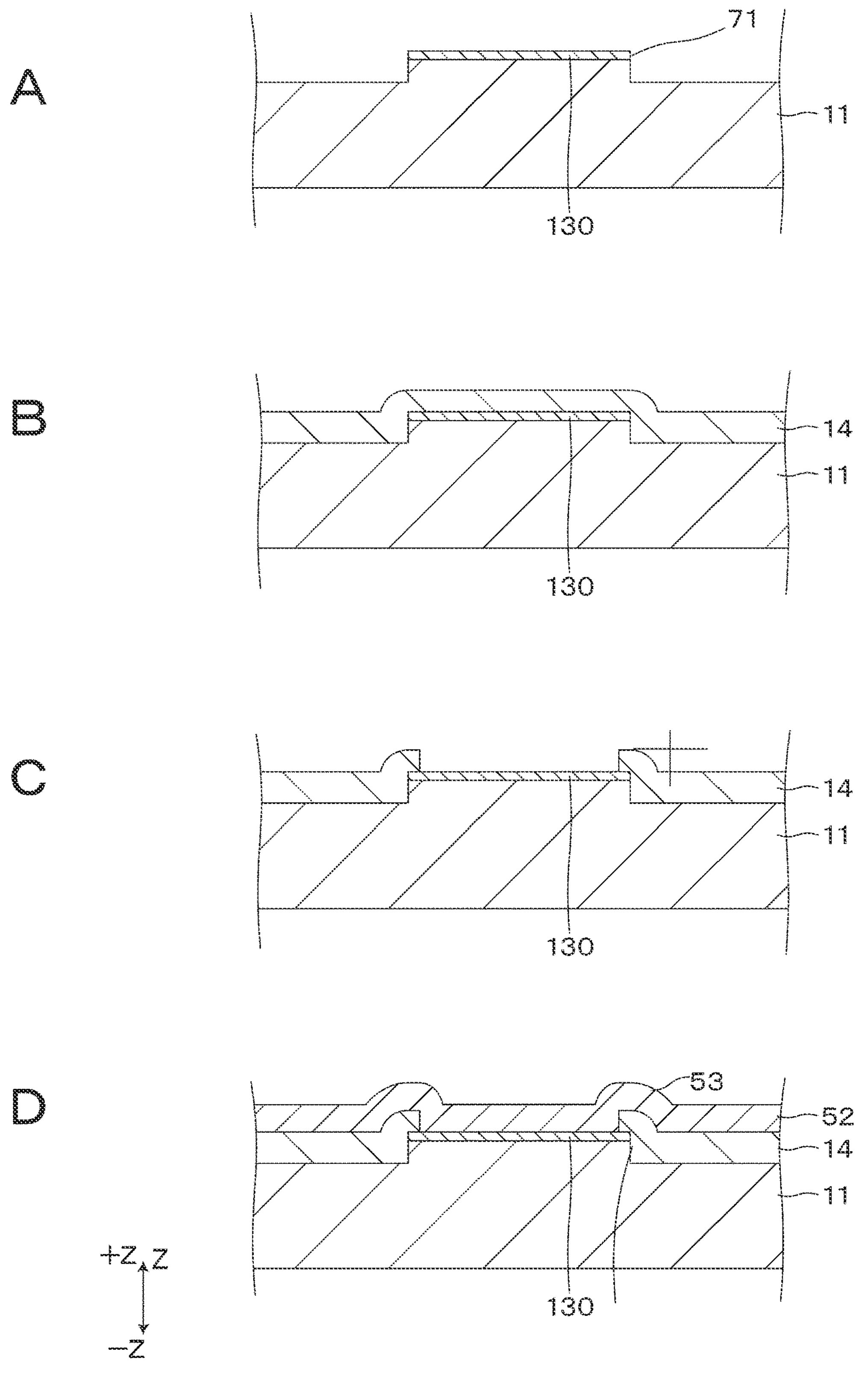
FIGS. 43A to 43D are cross-sectional views for explaining a modification example of the display device according to the sixth embodiment.

The peripheral edge inner portion 50 is a portion formed inside the peripheral edge portion 130A of the anode electrode 130 in the laminated structure 52 of the organic layer 131 and the first cathode electrode 132, and is formed in a portion inside (center side) the opening end edge 140 of the opening 14A. In the example illustrated in FIG. 27A, the peripheral edge inner portion 50 is a portion avoiding the raised portion 53 in the laminated structure 52 of the organic layer 131 and the first cathode electrode 132. In the example of FIG. 27, the anode electrode 130 is formed in a planar shape, and the peripheral edge inner portion 50 is easily formed in a planar shape. With respect to the peripheral edge inner portion 50, a second cathode electrode 134 is connected to the first cathode electrode in the peripheral edge inner portion 50.

(Outer Edge Portion)

The outer edge portion 51 is a portion of the laminated structure 52 outside the peripheral edge inner portion 50. In the laminated structure 52, a predetermined portion including the raised portion 53 is the outer edge portion 51. Since the outer edge portion 51 is avoided from being connected to the second cathode electrode 134, it is possible to avoid the organic layer 131 formed on the raised portion 53 from contributing to light emission in the sub-pixel 101.

(Lower Protective Layer)

In the display device 10E according to the fifth embodiment, the lower protective layer 17 is formed so as to cover the first cathode electrode 132. In the lower protective layer 17 illustrated in the example of FIG. 27B, both the portion on the first surface of the first cathode electrode 132 and the portion deviated from the first surface of the first cathode electrode 132 are integrally formed, and the element protective layer 15 and the side wall protective layer 16 according to the first embodiment are integrated. However, this does not prohibit that the lower protective layer 17 is separately formed in the element protective layer 15 and the side wall protective layer 16 as shown in the first embodiment. The lower protective layer 17 may include the similar material to the element protective layer 15 in the display device 10A according to the first embodiment.

(Second Cathode Electrode)

In the display device 10E according to the fifth embodiment illustrated in the example of FIG. 27A, a second cathode electrode 134 to be a common electrode common to the sub-pixel 101 is formed on the lower protective layer 17. A contact hole (contact hole 55) connected to the first cathode electrode 132 of the peripheral edge inner portion 50 is formed at a predetermined position of the lower protective layer 17, and the second cathode electrode 134 has an extension portion 56 extending from the upper surface (first surface) of the lower protective layer 17 to the first surface of the first cathode electrode 132 along the inner peripheral surface of the contact hole 55. The extension portion 56 of the second cathode electrode 134 serves as a connection portion 57. The connection between the second cathode electrode 134 and the first cathode electrode 132 is realized by connecting the extension end of the extension portion 56 to the first cathode electrode 132.

5-2 Method of Manufacturing Display Device

A method of manufacturing the display device 10E according to the fifth embodiment will be described. Here, a method of manufacturing the display device 10E illustrated in FIGS. 27A and 27B will be described.

The anode electrode 130 and the insulating layer 14 are formed on the drive substrate 11, and the organic layer 131B, the first cathode electrode 132, and the lower protective layer 17 are formed (FIG. 28A, FIG. 28B). Next, the lower protective layer 17, the first cathode electrode 132, and the organic layer 131 are patterned in accordance with the pattern of the sub-pixel 101B. At this time, the peripheral edge inner portion 50 and the outer edge portion 51 separated from each other are also formed in the sub-pixel 101B. This can be achieved by using lithography and etching. That is, patterning and dry etching are performed at predetermined positions in the anode electrode 130 to form the groove 58 that separates the peripheral edge inner portion 50 and the outer edge portion 51 in the first cathode electrode 132 and the organic layer 131 (FIG. 29A, FIG. 29B). As a result, the laminated structure 52 of the first cathode electrode 132 and the organic layer 131 is separated into the peripheral edge inner portion 50 and the outer edge portion 51. A separation distance between the peripheral edge inner portion 50 and the outer edge portion 51 can be appropriately determined according to a width of the groove 58. This is also performed for the sub-pixels 101G and 101R, and the peripheral edge inner portion 50 and the outer edge portion 51 are formed for each sub-pixel 101. Hereinafter, the step of separating the laminated structure 52 into the peripheral edge inner portion 50 and the outer edge portion 51 is referred to as a peripheral edge inner portion forming step.

After the peripheral edge inner portion formation step, a lower protective layer 17 is further formed on the first surface side (FIG. 30A, FIG. 30B), and a contact hole 55 is formed at a predetermined position determined for each sub-pixel 101 with respect to the lower protective layer 17. The contact hole 55 can be formed using lithography and dry etching.

The second cathode electrode 134 is formed on one surface (over the entire surface) on the first surface of the lower protective layer 17. As a method of forming the second cathode electrode 134, for example, sputtering or the like is preferably used. The contact hole 55 has a shape and a diameter such that a film of a material (for example, IZO or the like) for forming the second cathode electrode 134 can be formed, and the second cathode electrode 134 is extended from the first surface side of the lower protective layer 17 to the first surface of the first cathode electrode 132 along the inner peripheral surface of the contact hole 55. At this time, the extension portion 56 as the connection portion 57 is formed. Furthermore, the first cathode electrode 132 and the second cathode electrode 134 are connected by the connection portion 57 (FIG. 27A, FIG. 27B).

Then, similarly to the first embodiment and the like, the upper protective layer 19 is formed on the second cathode electrode 134, and the counter substrate 21 is disposed with the filling resin layer 20 interposed therebetween, thereby obtaining the display device 10E (not illustrated).

5-3 Operation and Effect

In a display device using an organic EL element, an insulating layer may cover an end portion of an anode electrode, and the anode electrode may be exposed from an opening formed in the insulating layer. In this case, the laminated structure of the first cathode electrode and the organic layer rises at the position of the opening end edge of the opening. When such a bulge occurs in the sub-pixel, light emission different from the central portion of the sub-pixel may occur at the peripheral edge of the sub-pixel (edge light emission), or light emission of adjacent sub-pixels may occur (adjacent pixel light emission). Therefore, it is required to improve the reliability of the light emission state of the display device.

In the display device 10E according to the fifth embodiment, the laminated structure 52 of the organic layer 131 and the first cathode electrode 132 is separated into the peripheral edge inner portion 50 and the outer edge portion 51, and the second cathode electrode 134 is connected to the first cathode electrode 132 in the peripheral edge inner portion 50. The raised portion 53 of the laminated structure 52 of the first cathode electrode 132 and the organic layer 131 is hardly included in the peripheral edge inner portion 50, and edge light emission and adjacent pixel light emission can be suppressed. Therefore, according to the display device 10E according to the fifth embodiment, the reliability of the light emission state can be improved. In addition, since edge light emission and adjacent pixel light emission can be suppressed, it is easy to increase the luminance and definition of the display device 10E.

5-4 Modification Example

First Modification Example

Next, a modification example of the display device 10E according to the fifth embodiment will be described.

(Configuration of First Modification Example)

In the display device 10E according to the fifth embodiment, as illustrated in FIG. 31A, the covering structure of the peripheral edge portion 130A of the anode electrode 130 by the insulating layer 14 may be omitted. In the examples of FIGS. 31A and 31B, the insulating layer 14 is omitted, and the arrangement of the outer edge portion 51 is omitted. FIGS. 31A and 31B are a cross-sectional view and a plan view illustrating an example of a display device according to the first modification example of the fifth embodiment.

In the example illustrated in FIG. 31A, the anode electrode 130 is formed in a flat surface shape, and the laminated structure 52 of the organic layer 131 and the first cathode electrode 132 is formed on such the anode electrode 130.

Furthermore, in the display device 10E according to the first modification example of the fifth embodiment, a sidewall portion 60 rising in a direction away from the drive substrate 11 (+Z direction) is formed on the first surface side. The sidewall portion 60 may be a single layer or a plurality of layers may be laminated. In the example of FIGS. 31A and 31B, in the sub-pixel 101R, the sidewall portion 60 is formed in a single layer, and in the sub-pixels 101G and 101B, the sidewall portion 60 is formed in a plurality of layers with the direction from the center of the light emitting element 13 toward the outside as the layering direction with the thickness direction of the light emitting element 13 as the line-of-sight direction.

(Method of Manufacturing Display Device of First Modification Example)

Next, a method of manufacturing a display device 10E according to the first modification example of the fifth embodiment will be described.

First, the anode electrode 130 is formed on the drive substrate 11, the organic layer 131B and the first cathode electrode 132 are formed, and a layer 62 of a material for forming the lower protective layer 17 is further formed (FIG. 32A, FIG. 32B). Next, the layer 62, the first cathode electrode 132, and the organic layer 131 are patterned in accordance with the pattern of the sub-pixel 101B. This can be achieved by using lithography and etching. Moreover, the layer 61 of the material forming the lower protective layer 17 is entirely formed on the first surface side. At this time, the layer 61 is also formed on the side wall 52A of the laminated structure 52 of the organic layer 131 and the first cathode electrode 132 and the side wall 62A of the layer 62. A portion other than the side wall 52A of the laminated structure 52 and the layer 61 covering the side wall 62A is removed by a dry etching method or the like. At this time, in the sub-pixel 101B, the sidewall portion 60 covering the side wall 52A of the laminated structure 52 is formed (FIG. 33A, FIG. 33B).

Similarly to the case of the sub-pixel 101B, the sidewall portion 60 is formed for the sub-pixel 101G. At this time, the sidewall portion 60 is laminated on the sub-pixel 101B. Moreover, the sidewall portion 60 is also formed in the sub-pixel 101R. At this time, the sidewall portions 60 are laminated on the sub-pixels 101G and 101B (FIG. 34A, FIG. 34B).

Moreover, a layer 63 of a material for forming the lower protective layer 17 is formed on the entire surface on the first surface side (FIG. 35A, FIG. 35B). At this time, a chemical mechanical polishing (CMP) treatment may be performed as necessary. At this time, the sidewall portion 60, the layer 62, and the layer 63 form the lower protective layer 17.

As described in the above manufacturing method of the display device 10E according to the fifth embodiment, the contact hole 55 is formed at the predetermined position determined for each sub-pixel 101 with respect to the lower protective layer 17, and the second cathode electrode 134 is formed, whereby the first cathode electrode 132 and the second cathode electrode 134 are connected at the extension portion 56 forming the connection portion 57. Then, as described in the above-described manufacturing method of the display device 10E according to the fifth embodiment, the upper protective layer 19, the filling resin layer 20, and the counter substrate 21 are provided, and the display device 10E according to the first modification example of the fifth embodiment can be obtained.

Operation and Effect of Display Device of First Modification Example

Also in the display device 10E according to the first modification example of the fifth embodiment, it is possible to obtain the similar effects to those described in the operational effects of the display device 10E according to the fifth embodiment.

Second Modification Example

In the display device 10E according to the fifth embodiment, the anode electrode 130 is formed in a planar shape, but the shape of the anode electrode 130 is not limited thereto, and may be formed in a curved shape as illustrated in FIG. 36A (second modification example). FIG. 36A is a cross-sectional view illustrating a main part of an example of a display device 10E according to the second modification example of the fifth embodiment. In FIG. 36A, for convenience of explanation, description of the lower protective layer 17, the second cathode electrode 134, the upper protective layer 19, the filling resin layer 20, the counter substrate 21, and the like is omitted. This similarly applies to FIGS. 36B and 36C.

A curved portion 65 curved in a concave shape is formed in a predetermined region inside the anode electrode 130. The laminated structure 52 of the organic layer 131 and the first cathode electrode 132 is formed on the first surface of the anode electrode 130 and in the formation region of the curved portion 65, and in the example of FIG. 36A, the insulating layer 14 covers the peripheral edge portion 130A of the anode electrode 130. A step formed by the opening end edge 140 of the opening 14A is formed at the position of the peripheral edge portion 130A. The laminated structure 52 is formed at a position avoiding the step forming portion. The second cathode electrode 134 is connected to the first cathode electrode 132 in the laminated structure 52.

Method of Manufacturing Display Device of Second Modification Example

A display device 10E according to the second modification example of the fifth embodiment can be manufactured, for example, as follows.

A recessed portion 111 is formed at a predetermined position on the drive substrate 11, the anode electrode 130 and the insulating layer 14 are formed, and the organic layer 131, the first cathode electrode 132, and the lower protective layer 17 are formed (FIG. 37A, FIG. 37B). A portion of the anode electrode 130 formed on the recessed portion 111 is a curved portion 65. The curved portion 65 is formed at a position avoiding peripheral edge portion 130A of anode electrode 130 (a predetermined position inside peripheral edge portion 130A of anode electrode 130).

Next, the lower protective layer 17, the first cathode electrode 132, and the organic layer 131 are patterned in accordance with the pattern of the sub-pixel 101 (FIG. 38A, FIG. 38B). At this time, in the sub-pixel 101, the laminated structure 52 of the first cathode electrode 132 and the organic layer 131 is left for the portion formed inside the curved portion 65. This can be achieved by using lithography and etching.

Next, the lower protective layer 17 is additionally formed on the entire surface on the first surface side (FIG. 39A, FIG. 39B).

Moreover, as described in the above-described manufacturing method of the display device 10E according to the fifth embodiment, the contact hole 55 is formed at a predetermined position determined for each sub-pixel 101 with respect to the lower protective layer 17, and the second cathode electrode 134 is formed, whereby the first cathode electrode 132 and the second cathode electrode 134 are connected at the extension portion 56 forming the connection portion 57 (FIG. 40A, FIG. 40B). Then, as described in the above-described manufacturing method of the display device 10E according to the fifth embodiment, the upper protective layer 19, the filling resin layer 20, and the counter substrate 21 are provided, and the display device 10E according to the second modification example of the fifth embodiment can be obtained.

Operation and Effect of Display Device of Second Modification Example

In a case where the display device has a curved anode electrode, since the curved inclined surface is formed from the curvature start position toward the curved bottom portion in the curved portion, the thickness of the organic layer tends to be thinner than that in the vicinity of the curved bottom portion, and uniformity of the light emission state is more required at the curved bottom portion and the curvature start position. Furthermore, it is required to suppress the influence of the step on the light emitting state at the opening edge portion formed at the peripheral edge portion of the anode electrode.

According to the display device 10E according to the second modification example of the fifth embodiment, since the laminated structure 52 of the organic layer 131 and the first cathode electrode 132 is formed in the region of the curved portion 65, it is possible to eliminate the request itself of the necessity of achieving uniformity of the light emission state between the bottom portion of the curved portion 65 and the end edge position of the curved portion 65. Furthermore, the laminated structure 52 can be formed at a position avoiding the step at the opening end edge 140. Therefore, in the display device 10E according to the second modification example of the fifth embodiment, the reliability of the light emission state of the display device 10E can be improved.

Third Modification Example

In the second modification example of the fifth embodiment, the laminated structure 52 of the first cathode electrode 132 and the organic layer 131 is removed in the portion outside the curved portion 65, but as illustrated in FIG. 36B, the organic layer 131 and the first cathode electrode 132 formed outside the region of the curved portion 65 may remain without being removed (Third modification example). In the display device 10E according to the third modification example of the fifth embodiment, the portion 66 of the laminated structure 52 of the organic layer 131 and the first cathode electrode 132 formed outside the region of the curved portion 65 and the portion 67 of the laminated structure 52 of the organic layer 131 and the first cathode electrode 132 formed inside the region of the curved portion 65 are divided by the division portion 68. The second cathode electrode 134 is connected to the first cathode electrode 132 of the portion 67.

In the display device 10E according to the third modification example of the fifth embodiment, since the portion 66 of the laminated structure 52 can be prevented from contributing to light emission, it is possible to obtain an effect similar to that of the display device 10E according to the second modification example of the fifth embodiment.

Fourth Modification Example

In the fifth embodiment and the second to third modification examples thereof, the shape of the curved portion 65 is a hemispherical curved shape, but the shape of the curved portion 65 is not limited thereto. As illustrated in FIG. 36C, the curved portion 65 may have a curved surface having a plurality of irregularities.

6 Sixth Embodiment

6-1 Configuration of Display Device

As illustrated in FIG. 41D, the display device according to the sixth embodiment defines the position and the region of the peripheral edge inner portion 50 as specific positions and regions in the display device 10E according to the fifth embodiment.

In the display device 10E according to the fifth embodiment, as described in the manufacturing method, the groove 58 for separating and forming the peripheral edge inner portion 50 and the outer edge portion 51 is formed using lithography, etching, or the like. Therefore, it is required to suppress the shift of the formation position of the groove 58 at the time of performing the lithography method. Furthermore, in a case where the position to be etched is determined in consideration of the deviation of the formation position of the groove 58 in advance, the laminated structure 52 of the organic layer 131 and the first cathode electrode 132 is required to be designed so that the groove 58 is not formed at an inner position more than necessary on the first surface of the anode electrode 130. In a state in which the region of the peripheral edge inner portion 50 becomes smaller than necessary at a position shifted from the opening end edge 140 of the opening 14A, for example, a state as illustrated in FIG. 42A occurs. In the display device according to the sixth embodiment, as illustrated in FIG. 42B, the position of the peripheral edge inner portion 50 is less likely to deviate from the center position of the opening 14A, and the region of the peripheral edge inner portion 50 is less likely to become smaller than necessary.

6-2 Method of Manufacturing Display Device

A method of manufacturing a display device according to a sixth embodiment will be described. The peripheral edge inner portion forming step is performed as follows. Similarly to the fifth embodiment, the anode electrode 130 and the insulating layer 14 are formed on the drive substrate 11, and the organic layer 131, the first cathode electrode 132, and the lower protective layer 17 are formed. At this time, as described in the fifth embodiment, the laminated structure 52 of the first cathode electrode 132 and the organic layer 131 is raised to form the raised portion 53 so as to cover the step T by the opening end edge 140 at the position of the peripheral edge portion 130A of the anode electrode 130. At this time, a raised portion 54 is also formed on the upper surface of the lower protective layer 17 formed on the laminated structure 52 at a position corresponding to the raised portion 53. Then, a resist 70 is entirely applied to the first surface side of the lower protective layer 17 (FIG. 41A).

The thickness of the lower protective layer 17 laminated on the first cathode electrode 132 is such that the raised portion 54 can also be formed on the lower protective layer 17 at the position of the opening end edge 140 of the opening 14A. Furthermore, although depending on the materials of the lower protective layer 17 and the resist 70, in consideration of a processing selection ratio at the time of etching of the lower protective layer 17 to be described later, the thickness of the lower protective layer 17 is preferably about 3 times the height of a step (a step formed by the insulating layer 14 riding on the anode electrode 130) at the position of the opening end edge 140 of the opening 14A. For example, in a case where the height of the step at the position of the opening end edge 140 of the opening 14A is 100 nm, the thickness of the lower protective layer 17 is preferably about 300 nm.

Next, dry etching is performed to gradually delete the resist 70. Dry etching is performed until the raised end of the raised portion 54 in the lower protective layer 17 starts to be exposed (FIG. 41B). The method of identifying the presence or absence of exposure of the raised portion 54 can be realized, for example, by monitoring the end point. In addition, for example, it can be realized by performing time management of dry etching.

Using the remaining part of the resist 70 left without being etched as a mask, the lower protective layer 17, the first cathode electrode 132, and the organic layer 131 are removed by dry etching (FIG. 41C).

Then, the resist 70 left on the lower protective layer 17 and used as a mask is removed by ashing or the like (FIG. 41D). As a result, the laminated structure 52 of the organic layer 131 and the first cathode electrode 132 is separated into the peripheral edge inner portion 50 and the outer edge portion 51. After the peripheral edge inner portion formation step, a method similar to the method of manufacturing the display device 10E according to the fifth embodiment is performed. As a result, the display device according to the sixth embodiment is obtained.

6-3 Operation and Effect

In the display device according to the sixth embodiment, the peripheral edge inner portion 50 is suppressed from becoming smaller than necessary while being maintained in a range inside the opening end edge 140. Therefore, in the display device, the light emitting region of the pixel is not excessively small, and the area of the light emitting region can be secured, so that high luminance can be easily realized.

Furthermore, according to the method of manufacturing the display device according to the sixth embodiment described above, since the etching position of the lower protective layer 17 for determining the outer edge position of the peripheral edge inner portion 50 is determined slightly inside the raised end or the raised end of the raised portion 54 by etching of the resist 70, the peripheral edge inner portion 50 is formed in the approximate center of the anode electrode 130 in a self-aligned manner as illustrated in FIG. 42B.

Moreover, according to the method of manufacturing a display device according to the sixth embodiment described above, the total thickness of the organic layer 131, the first cathode electrode 132, and the lower protective layer 17 can be made uniform at the position of the outer peripheral edge of the peripheral edge inner portion 50.

6-4 Modification Example

In the display device according to the sixth embodiment, as illustrated in FIG. 43D, a stepped portion 71 may be formed on the first surface of the drive substrate 11 at the position of the side wall 130B of the anode electrode 130 (Modification example). The stepped portion 71 can be formed by etching not only the anode electrode 130 but also the drive substrate 11 side when patterning the anode electrode 130 for each sub-pixel 101.

According to the display device according to the modification example of the sixth embodiment, as illustrated in FIGS. 43A, 43B, and 43C, when the insulating layer 14 is formed between the adjacent anode electrodes 130 in the implementation of the method of manufacturing the display device according to the sixth embodiment, the difference H (vertical difference) between the position of the first surface of the formed insulating layer 14 and the position of the first surface of the insulating layer 14 riding on the peripheral edge portion 130A of the anode electrode 130 can be increased. Furthermore, in this case, as illustrated in FIG. 43D, the portion covering the opening end edge 140 in a state where the laminated structure 52 of the organic layer 131 and the first cathode electrode 132 is formed in the peripheral edge inner portion formation step can be made more conspicuous. Therefore, the raised portion 54 can be more conspicuous even in a state where the lower protective layer 17 is further formed.

Then, since the raised portion 54 is particularly erected, it is easy to recognize the raised end of the raised portion 54 in the lower protective layer 17 at the time of dry etching of the resist.

8 Seventh Embodiment

The display device 10A according to the first embodiment and the modification examples thereof may combine the second embodiment to the sixth embodiment (Seventh embodiment). The seventh embodiment is a combination of the first embodiment and the second to sixth embodiments, but this does not limit the combination of the embodiments in the present specification.

Combination of First Embodiment and Second Embodiment

In a case where the display device 10B according to the second embodiment is combined with the display device 10A according to the first embodiment, in the display device 10A according to the first embodiment, the connection portion 18 is provided so as to surround the light emitting region P of the light emitting element 13, the side wall protective layer 16 is provided between the adjacent light emitting elements 13, and the inner portion of the connection portion 18 is configured so as to have a refractive index different from the refractive index of the side wall protective layer 16. Furthermore, the first to third modification examples of the display device 10B according to the second embodiment may be combined with the display device 10A according to the first embodiment. That is, for example, the connection portion 18 may be configured by the via 31 similarly to the connection portion 30.

Combination of First Embodiment and Third Embodiment

The display device 10C according to the third embodiment and the first modification example thereof may be combined with the display device 10A according to the first embodiment. That is, in the display device 10A according to the first embodiment, in the side wall protective layer 16, the first refractive index portion 33 may be formed from the side closer to the light emitting element 13 at the position of the side region M of the light emitting element 13, and the second refractive index portion 34 having a lower refractive index may be formed outside the first refractive index portion 33. Also in the display device 10A according to the first embodiment in which the display device 10C according to the third embodiment is combined, similarly to the third embodiment, the first refractive index portion 33 and the second refractive index portion 34 are formed on the side portion of the light emitting element 13, so that light use efficiency can be improved.

Combination of First Embodiment and Fourth Embodiment

Furthermore, the display device 10D according to the fourth embodiment may be combined with the display device 10A according to the first embodiment. Also in this case, as long as the metal layer 46 is formed between the adjacent connection portions 18, the metal layer 46 may be buried in the side wall protective layer 16.

Also in the display device 10A according to the first embodiment in which the display device 10D according to the fourth embodiment is combined, similarly to the fourth embodiment, it is possible to suppress the defect of the conductive state due to the disconnection defect of the connection portion.

Combination of First Embodiment and Fifth Embodiment

The display device 10E according to the fifth embodiment may be combined with the display device 10A according to the first embodiment. As an example of this case, it is only required that the element protective layer 15 be formed on the first surface of the peripheral edge inner portion 50 formed inside the anode electrode, and the connection portion 18 be formed along the side wall 15A of the element protective layer 15.

The display device 10A according to the first embodiment in which the fifth embodiment is combined can also obtain the similar effects to those of the fifth embodiment.

Combination of First Embodiment and Sixth Embodiment

When the method of manufacturing the display device 10A according to the first embodiment in combination with the fifth embodiment is performed, the method of manufacturing the display device according to the sixth embodiment may be performed.

7 Application Example (Electronic Apparatus)

A display device 10 according to one of the above-described embodiments may be provided in various electronic apparatuses. Especially, this is preferably provided in an electronic viewfinder of a video camera or a single-lens reflex camera, a head mounted display, or the like in which high resolution is required, used for enlarging near the eyes. Note that, in the description of the present application example, the display devices (the display device 10A and the like) according to the first to seventh embodiments are collectively referred to as a display device 10.

First Specific Example

Figure 44:
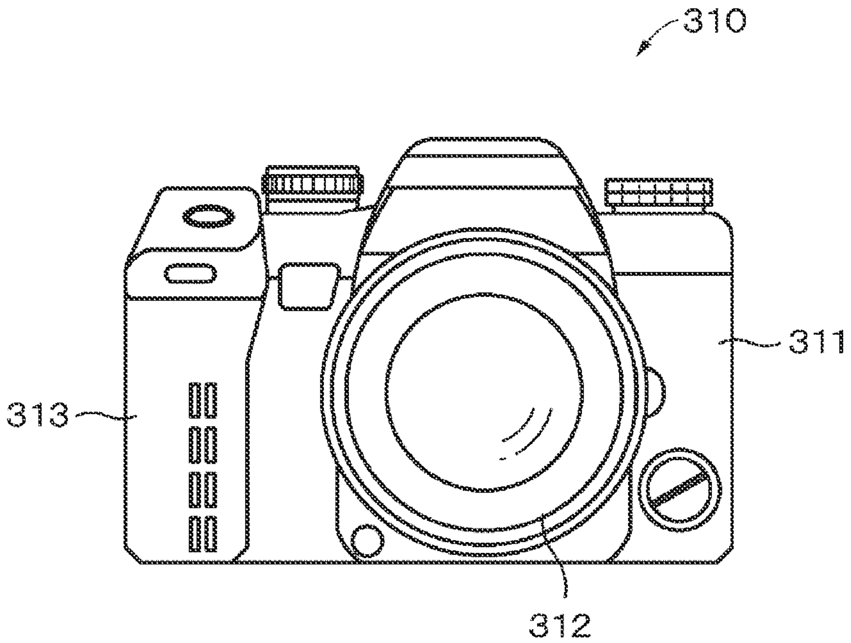
FIG. 44 is a diagram for explaining an example of an electronic apparatus using the display device.
Figure 44:
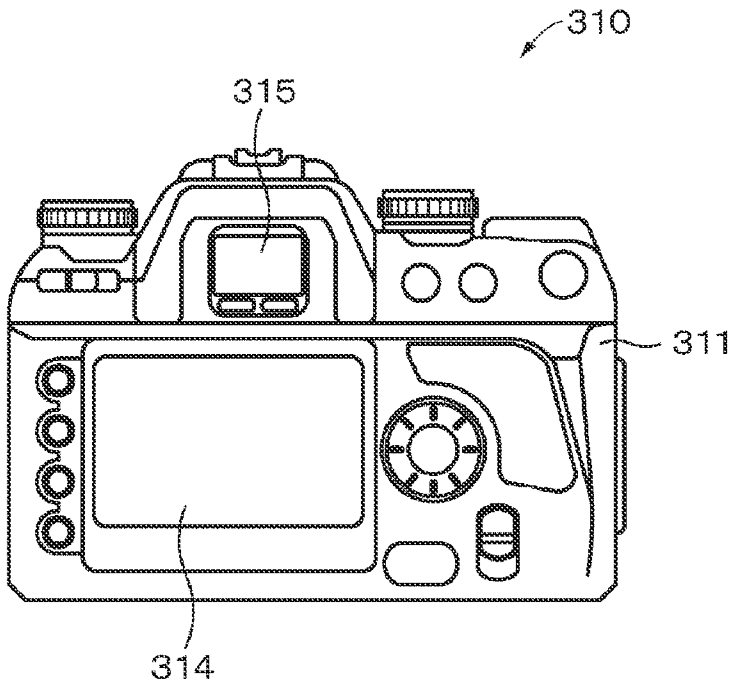

FIG. 44A is a front view illustrating an example of an external appearance of a digital still camera 310. FIG. 44B is a rear view illustrating an example of an external appearance of the digital still camera 310. The digital still camera 310 is of a lens interchangeable single-lens reflex type, and includes an interchangeable imaging lens unit (interchangeable lens) 312 substantially at the center in front of a camera main body (camera body) 311, and a grip 313 to be held by an imager on a front left side.

A monitor 314 is provided at a position shifted to the left from the center of a rear surface of the camera main body 311. An electronic viewfinder (eyepiece window) 315 is provided above the monitor 314. By looking through the electronic viewfinder 315, the photographer can visually confirm a light image of a subject guided from the imaging lens unit 312 and determine a picture composition. As the electronic viewfinder 315, any display device 10 according to one of the above-described embodiments and modification examples thereof may be used.

Second Specific Example

Figure 45:
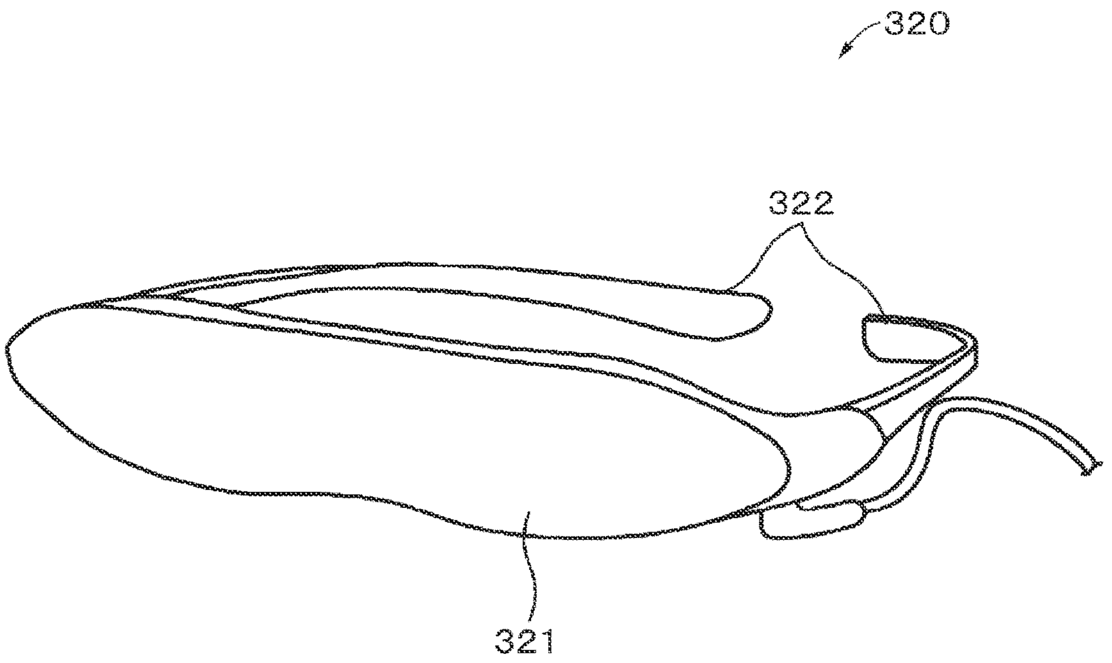
FIG. 45 is a diagram for explaining an example of an electronic apparatus using the display device.

FIG. 45 is a perspective view illustrating an example of an external appearance of a head mounted display 320. The head mounted display 320 includes, for example, ear hooking portions 322 to be worn on the head of the user on both sides of a glass-shaped display unit 321. As the display unit 321, any display device 10 according to one of the above-described embodiments and modification examples thereof may be used.

Third Specific Example

Figure 46:
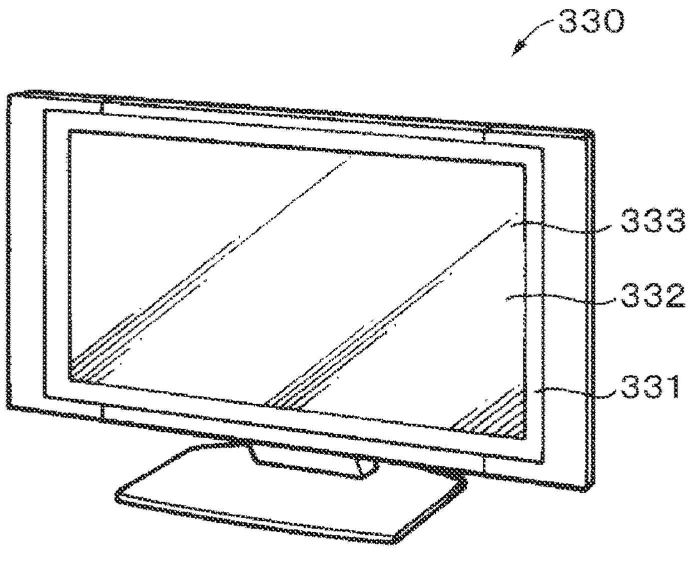
FIG. 46 is a diagram for explaining an example of an electronic apparatus using the display device.

FIG. 46 is a perspective view illustrating an example of an external appearance of the television device 330. The television device 330 includes, for example, a video display screen unit 331 including a front panel 332 and a filter glass 333, and the video display screen unit 331 includes any display device 10 according to one of the above-described embodiments and modifications thereof.

Although the display device, the manufacturing method, and the application example according to the first to seventh embodiments and the modification examples of the present disclosure have been specifically described above, the present disclosure is not limited to the display device and the application example according to the first to seventh embodiments and the modification examples described above, and various modifications based on the technical idea of the present disclosure are possible.

For example, the configurations, methods, steps, shapes, materials, numerical values, and the like described in the display device, the manufacturing method, and the application example according to the first to seventh embodiments and the modification examples described above are merely examples, and configurations, methods, steps, shapes, materials, numerical values, and the like different from those described above may be used as necessary.

The configurations, methods, steps, shapes, materials, numerical values, and the like of the display device, the manufacturing method, and the application example according to the first embodiment to the seventh embodiment and the modification examples described above can be combined with each other without departing from the gist of the present disclosure.

The materials exemplified in the display device, the manufacturing method, and the application example according to the first to seventh embodiments and the modification examples described above can be used alone or in combination of two or more unless otherwise specified.

Furthermore, the present disclosure can also adopt the following configurations.

(1) A display device including:

a plurality of sub-pixels;

a plurality of light emitting elements including an anode electrode, an organic layer, and a first cathode electrode, the anode electrode, the organic layer, and the first cathode electrode being separated into each of the plurality of sub-pixels;

an element protective layer covering the first cathode electrode;

a second cathode electrode provided on the element protective layer; and a connection portion that electrically connects the second cathode electrode and the first cathode electrode, in which the connection portion is formed along a side wall of the element protective layer.

(2) The display device according to (1) described above, in which the connection portion includes an element forming the first cathode electrode.

(3) The display device according to (1) or (2) described above, in which the side wall of the element protective layer is non-tapered.

(4) The display device according to any one of (1) to (3) described above, in which a side surface of the connection portion is connected to the second cathode electrode.

(5) The display device according to any one of (1) to (4) described above, in which a light emission color of each of a plurality of the light emitting elements corresponds to a color type corresponding to each of light emission colors of the plurality of sub-pixels, and in each of the sub-pixels, a light emission color of the light emitting element is a color type corresponding to a light emission color of the sub-pixel.

(6) The display device according to any one of (1) to (4) described above, in which a light emission color of the plurality of light emitting elements is white.

(7) The display device according to any one of (1) to (6) described above, further including a color filter layer.

(8) The display device according to any one of (1) to (7) described above, in which each of the plurality of light emitting elements and the second cathode electrode form a resonator structure.

(9) The display device according to (8) described above, in which the second cathode electrode includes a semi-transmission reflection layer.

(10) The display device according to any one of (1) to (9) described above, in which the connection portion is provided so as to surround a periphery of each of light emitting regions of the plurality of light emitting elements, and an inner portion of the connection portion has a refractive index different from a refractive index of the element protective layer.

(11) The display device according to (10) described above, in which the inner portion of the connection portion is a space portion.

(12) The display device according to (10) or (11) described above, in which the connection portion includes a via, and a via column in which a plurality of the vias is arranged is formed.

(13) The display device according to (12) described above, in which for each light emitting element constituting the plurality of light emitting elements, a pitch of the plurality of vias surrounding a light emitting region of the each light emitting element is smaller than a peak wavelength corresponding to emission light from the each light emitting element.

(14) The display device according to (13) described above described above, further including a side wall protective layer continuous with the element protective layer, in which the via columns are arranged in a plurality of columns, and a portion forming the side wall protective layer and the vias are periodically and repeatedly arranged with a period smaller than the peak wavelength of the emission light from the light emitting element.

(15) The display device according to any one of (1) to (14) described above, further including a side wall protective layer provided between the light emitting elements adjacent to each other, in which, in the side wall protective layer, a first refractive index portion from a side closer to the light emitting elements and a second refractive index portion having a lower refractive index outside the first refractive index portion are formed in a side region of the light emitting elements.

(16) The display device according to (15) described above, in which the second refractive index portion is a space portion.

(17) The display device according to any one of (1) to (16) described above, in which a metal layer is charged between the connection portions adjacent to each other connected to the first cathode electrode of the light emitting elements adjacent to each other.

(18) The display device according to any one of (1) to (17) described above, further including an insulating layer that includes an opening, is disposed on the anode electrodes adjacent to each other, and covers a peripheral edge portion of each of the anode electrodes, in which an opening end edge of the opening is disposed on the anode electrode, a laminated structure of the organic layer and the first cathode electrode is separated into a peripheral edge inner portion and an outer edge portion at a predetermined position inside the opening end edge, and the connection portion is connected to the first cathode electrode of the peripheral edge inner portion.

(19) The display device according to any one of (1) to (17) described above, in which a laminated structure of the organic layer and the first cathode electrode is formed in a predetermined region inside an end portion of the anode electrode, and a sidewall portion is formed on a side of a side wall surface of the laminated structure.

(20)

An electronic apparatus including a display device according to any one of (1) to (19) described above.

Furthermore, according to the second embodiment of the present disclosure, the following configuration can also be adopted.

(21) A display device including:

a plurality of light emitting elements including an anode electrode, an organic layer, and a first cathode electrode, the anode electrode, the organic layer, and the first cathode electrode being separated for each sub-pixel;

a protective layer covering the light emitting elements; and a second cathode electrode provided on the protective layer, in which a connection portion electrically connecting the second cathode electrode and the first cathode electrode is provided so as to surround a periphery of a light emitting region of the light emitting elements.

(22) The display device according to (21) described above, in which an inner portion of the connection portion has a refractive index different from a refractive index of the protective layer.

(23) The display device according to (21) described above, in which an inner portion of the connection portion is a space portion.

(24) The display device according to any one of (21) to (23) described above, in which the connection portion includes a via, and a via column in which a plurality of the vias is arranged is formed.

(25) The display device according to (24) described above, further including a plurality of sub-pixels respectively corresponding to a plurality of color types, in which the connection portion is provided for each of the sub-pixels, and a pitch of the vias adjacent to each other forming the via column varies according to the color types of the sub-pixels.

(26) The display device according to (25) described above, in which for each light emitting element constituting the plurality of light emitting elements, a pitch of the plurality of vias surrounding a light emitting region of the each light emitting element is smaller than a peak wavelength corresponding to emission light from the each light emitting element.

(27) The display device according to any one of (24) to (26) described above, in which the via columns are arranged in a plurality of columns.

(28) The display device according to (27) described above, in which a portion forming the protective layer and the vias are periodically and repeatedly arranged with a period smaller than the peak wavelength of the emission light from the light emitting element.

(29) The display device according to any one of (21) to (28) described above, further including an insulating layer including an opening and disposed on electrodes of the anode adjacent to each other, in which the opening is formed on a surface of each of the anode electrodes, and the connection portion is formed on a position of an opening end edge of the opening.

Furthermore, according to the third embodiment of the present disclosure, the following configuration can also be adopted.

(30) A display device including:

a plurality of light emitting elements including an anode electrode, an organic layer, and a first cathode electrode, the anode electrode, the organic layer, and the first cathode electrode being separated for each sub-pixel;

a protective layer that fills a space between the adjacent light emitting elements; and a second cathode electrode provided on the protective layer, in which the second cathode electrode and the first cathode electrode are electrically connected, and a first refractive index portion from a side closer to the light emitting elements and a second refractive index portion having a lower refractive index outside the first refractive index portion are formed in the protective layer at positions of side portions of the light emitting elements.

(31) The display device according to (30) described above, in which the second refractive index portion is a space portion.

(32) The display device according to (30) or (31) described above, in which a direction of a light emitting surface of each of the light emitting elements is a direction from the anode electrode toward the first cathode electrode.

(33) The display device according to any one of (30) to (32) described above, in which a third refractive index portion is formed around the anode electrode in the protective layer.

According to the fourth embodiment of the present disclosure, the following configuration can also be adopted.

(34) A display device including:

a plurality of light emitting elements including an anode electrode, an organic layer, and a first cathode electrode, the anode electrode, the organic layer, and the first cathode electrode being separated for each sub-pixel;

a protective layer covering the light emitting elements;

a second cathode electrode provided on the protective layer; and a connection portion that electrically connects the second cathode electrode and the first cathode electrode, in which a metal layer is charged between the connection portions adjacent to each other connected to the first cathode electrode of the light emitting elements adjacent to each other.

(35) The display device according to (34) described above, in which a metal halogen compound that forms the metal layer has a boiling point of 100° ° C. or lower under vacuum conditions.

According to the fifth embodiment and the sixth embodiment of the present disclosure, the following configuration can also be adopted.

(36) A display device including:

a plurality of light emitting elements including an anode electrode, an organic layer, and a first cathode electrode, the anode electrode, the organic layer, and the first cathode electrode being separated for each sub-pixel;

an insulating layer that includes an opening, is disposed on the anode electrodes adjacent to each other, and covers a peripheral edge portion of each of the anode electrodes;

a protective layer covering the light emitting elements;

a second cathode electrode provided on the protective layer; and a connection portion that electrically connects the second cathode electrode and the first cathode electrode, in which an opening end edge of the opening is disposed on the anode electrode, a laminated structure of the organic layer and the first cathode electrode is separated into a peripheral edge inner portion and an outer edge portion at a predetermined position inside the opening end edge, and the connection portion is connected to the first cathode electrode of the peripheral edge inner portion.

(37) A plurality of light emitting elements including an anode electrode, an organic layer, and a first cathode electrode, the anode electrode, the organic layer, and the first cathode electrode being separated for each sub-pixel;

a protective layer covering the light emitting element;

a second cathode electrode provided on the protective layer; and a connection portion that electrically connects the second cathode electrode and the first cathode electrode are provided, a laminated structure of the organic layer and the first cathode electrode is formed in a predetermined region inside an end portion of the anode electrode, and a sidewall portion is formed on a side of a side wall surface of the laminated structure.

(38) The display device according to (36) described above, in which a total thickness of the anode electrode, the organic layer, and the protective layer at a position of an outer peripheral end portion of the peripheral edge inner portion is constant.

(39) The display device according to (36) to (38) described above, in which in the anode electrode, a contact surface between the anode electrode and the organic layer is planar.

(40) The display device according to (36) or (37) described above, in which in the anode electrode, a contact surface between the anode electrode and the organic layer is a curved surface.

(41) A method of manufacturing a display device, the method including the steps of:

sequentially forming an anode electrode, an organic layer, a first cathode electrode, and a protective layer;

applying a resist on the protective layer;

etching the resist;

stopping etching the resist when the protective layer is exposed; and etching the organic layer, the first cathode electrode, and the protective layer using the resist as a mask.

According to the second to sixth embodiments of the present disclosure, the following configuration can also be adopted.

(42) An electronic apparatus including the display device according to any one of (21) to (41) described above.

REFERENCE SIGNS LIST

10A Display device
10B Display device
10C Display device
10D Display device
10E Display device
11 Drive substrate
13 Light emitting element
14 Insulating layer
14A Opening
15 Element protective layer
15A Side wall
16 Side wall protective layer
17 Lower protective layer
18 Connection portion
19 Upper protective layer
20 Filling resin layer
21 Counter substrate
31 Via
32 Via column
33 First refractive index portion
34 Second refractive index portion
46 Metal layer
50 Peripheral edge inner portion
51 Outer edge portion
52 Laminated structure
52A Side wall
53 Raised portion
54 Raised portion
60 Sidewall portion

101 Sub-pixel
131 Organic layer
132 First cathode electrode
132A Outer peripheral end portion
132B Side wall
134 Second cathode electrode
140 Opening end edge
141 Outer periphery

The invention claimed is:

1. A display device comprising:
a plurality of sub-pixels;
a plurality of light emitting elements including an anode electrode, an organic layer, and a first cathode electrode, the anode electrode, the organic layer, and the first cathode electrode being separated into each of the plurality of sub-pixels;
an element protective layer covering the first cathode electrode;
a second cathode electrode provided on the element protective layer; and
a connection portion that electrically connects the second cathode electrode and the first cathode electrode, wherein
the connection portion is formed along a side wall of the element protective layer,
the connection portion is provided so as to individually surround a periphery of each of light emitting regions of the plurality of light emitting elements,
an inner portion of the connection portion has a refractive index different from a refractive index of the element protective layer,
the connection portion includes a via, and
the via is one of a plurality of vias arranged in a via column.

2. The display device according to claim 1, wherein the connection portion includes an element forming the first cathode electrode.

3. The display device according to claim 1, wherein the side wall of the element protective layer is non-tapered.

4. The display device according to claim 1, wherein a side surface of the connection portion is connected to the second cathode electrode.

5. The display device according to claim 1, wherein a light emission color of each of a plurality of the light emitting elements corresponds to a color type corresponding to each of light emission colors of the plurality of sub-pixels.

6. The display device according to claim 1, wherein a light emission color of the plurality of light emitting elements is white.

7. The display device according to claim 1, further comprising
a color filter layer.

8. The display device according to claim 1, wherein each of the plurality of light emitting elements and the second cathode electrode form a resonator structure.

9. The display device according to claim 8, wherein the second cathode electrode includes a semi-transmission reflection layer.

10. The display device according to claim 1, wherein the inner portion of the connection portion is a space portion.

11. The display device according to claim 1, wherein
for a respective light emitting element constituting the plurality of light emitting elements, a pitch of the plurality of vias surrounding a light emitting region of the respective light emitting element is smaller than a peak wavelength corresponding to emission light from the respective light emitting element.

12. The display device according to claim 11, further comprising
a side wall protective layer continuous with the element protective layer,
wherein the via column is one of a plurality of via columns arranged in a plurality of columns, and
a portion forming the side wall protective layer and the vias are periodically and repeatedly arranged with a period smaller than the peak wavelength of the emission light from the light emitting elements.

13. The display device according to claim 1, further comprising
a side wall protective layer provided between the light emitting elements adjacent to each other,
wherein, in the side wall protective layer, a first refractive index portion from a side closer to the light emitting elements and a second refractive index portion having a lower refractive index outside the first refractive index portion are formed in a side region of the light emitting elements.

14. The display device according to claim 13, wherein the second refractive index portion is a space portion.

15. The display device according to claim 1, wherein a metal layer is charged between respective connection portions adjacent to each other connected to the first cathode electrode of the light emitting elements adjacent to each other.

16. The display device according to claim 1, further comprising
an insulating layer that includes an opening, is disposed on the anode electrodes adjacent to each other, and covers a peripheral edge portion of each of respective anode electrodes,
wherein an opening end edge of the opening is disposed on the anode electrode,
a laminated structure of the organic layer and the first cathode electrode is separated into a peripheral edge inner portion and an outer edge portion at a predetermined position inside the opening end edge, and
the connection portion is connected to the first cathode electrode of the peripheral edge inner portion.

17. The display device according to claim 1, wherein
a laminated structure of the organic layer and the first cathode electrode is formed in a predetermined region inside an end portion of the anode electrode, and
a sidewall portion is formed on a side of a side wall surface of the laminated structure.

18. An electronic apparatus comprising a display device according to claim 1.

* * * * *